United States Patent
Hisatomi et al.

(10) Patent No.: US 11,750,122 B2
(45) Date of Patent: Sep. 5, 2023

(54) MOTOR DRIVE CONTROL DEVICE, FAN, AND MOTOR DRIVE CONTROL METHOD

(71) Applicant: MINEBEA MITSUMI Inc., Nagano (JP)

(72) Inventors: Yuuya Hisatomi, Hamamatsu (JP); Toshihiro Tamitsuji, Iwata (JP); Hidetoshi Hijikata, Hamamatsu (JP)

(73) Assignee: MINEBEA MITSUMI Inc., Nagano (JP)

( * ) Notice: Subject to any disclaimer, the term of this patent is extended or adjusted under 35 U.S.C. 154(b) by 0 days.

(21) Appl. No.: 17/759,445

(22) PCT Filed: Jan. 22, 2021

(86) PCT No.: PCT/JP2021/002259
§ 371 (c)(1),
(2) Date: Jul. 26, 2022

(87) PCT Pub. No.: WO2021/161762
PCT Pub. Date: Aug. 19, 2021

(65) Prior Publication Data
US 2023/0046384 A1    Feb. 16, 2023

(30) Foreign Application Priority Data

Feb. 12, 2020 (JP) .................. 2020-021802
Feb. 12, 2020 (JP) .................. 2020-021803

(51) Int. Cl.
*H02P 6/17* (2016.01)
*H02P 25/04* (2006.01)
(Continued)

(52) U.S. Cl.
CPC .............. *H02P 6/17* (2016.02); *H02P 25/04* (2013.01); *H02P 29/024* (2013.01); *H03K 19/20* (2013.01)

(58) Field of Classification Search
CPC .......... H02P 6/17; H02P 25/04; H02P 29/024; H02P 29/028; H03K 19/20
(Continued)

(56) References Cited

U.S. PATENT DOCUMENTS

| 6,031,966 A | 2/2000 | Nakatani et al. |
| 10,630,213 B2 * | 4/2020 | Maekawa ................ H02P 6/18 |
| 2020/0014315 A1 | 1/2020 | Tamitsuji |

FOREIGN PATENT DOCUMENTS

| JP | 10-174473 A | 6/1998 |
| JP | 2009-077543 A | 4/2009 |

(Continued)

OTHER PUBLICATIONS

International Search Report for corresponding International Application No. PCT/JP2021/002259 dated Apr. 13, 2021.
(Continued)

*Primary Examiner* — David Luo
(74) *Attorney, Agent, or Firm* — Pearne & Gordon LLP

(57) ABSTRACT

A motor drive control device capable of determining a drive state of a motor is provided. The motor drive control device includes a plurality of motor drive circuits performing, based on drive control signals (Sca1 and Sca2) for controlling the number of rotations of a motor, control of energization of the motor and outputting FG signals (fg1 and fg2) having a cycle corresponding to the actual number of rotations of the motor, a composite signal generation circuit receiving an input of each of the FG signals output from the motor drive circuits and generating a composite signal by combining input signals, and a drive control circuit generating, based on a speed command signal indicating a target number of rotations of the motor, the drive control signals and outputting the drive control signals to each of the motor
(Continued)

drive circuits. The FG signals output from the motor drive circuits have a phase difference from each other.

26 Claims, 40 Drawing Sheets

(51) Int. Cl.
    *H02P 29/024*     (2016.01)
    *H03K 19/20*     (2006.01)

(58) Field of Classification Search
    USPC .......................................... 318/400.01, 700
    See application file for complete search history.

(56) References Cited

FOREIGN PATENT DOCUMENTS

| | | |
|---|---|---|
| JP | 2019-047614 A | 3/2019 |
| JP | 2020-010441 A | 1/2020 |

OTHER PUBLICATIONS

Written Opinion for corresponding International Application No. PCT/JP2021/002259 dated Apr. 13, 2021 and English translation.

\* cited by examiner

| fg1<br>(FG1) | fg2<br>(FG2) | Si<br>(NODE N1) | STATE OF FAN |
|---|---|---|---|
| Duty:50% | Duty:50% | Duty:25% | NORMAL |
| Hi-Z | Duty:50% | Duty:50% | ONE MOTOR DRIVE CIRCUIT HAS OPEN-CIRCUIT FAILURE |
| Duty:50% | Hi-Z | | |
| Lo | Duty:50% | Lo | ONE MOTOR DRIVE CIRCUIT HAS SHORT-CIRCUIT FAILURE |
| Duty:50% | Lo | | |
| Hi-Z or Lo | Hi-Z or Lo | Hi or Lo | MOTOR IS IN LOCKED STATE |

FIG. 3

| fg1 (FG1) | fg2 (FG2) | SF12 (NODE N1) | Id1 (LD1) | Id2 (LD2) | SL12 (NODE N2) | Si (NODE N3) | STATE OF FAN |
|---|---|---|---|---|---|---|---|
| Duty:50% | Duty:50% | Duty:25% | Lo | Lo | Lo | Duty:75% | NORMAL |
| Hi-Z | Duty:50% | Duty:50% | Hi-Z or Lo | Lo | Lo | Duty:50% | ONE MOTOR DRIVE CIRCUIT HAS OPEN-CIRCUIT FAILURE |
| Duty:50% | Hi-Z | Duty:50% | Lo | Hi-Z or Lo | Lo | Duty:50% | ONE MOTOR DRIVE CIRCUIT HAS OPEN-CIRCUIT FAILURE |
| Lo | Duty:50% | Lo | Hi-Z or Lo | Lo | Lo | Hi | ONE MOTOR DRIVE CIRCUIT HAS SHORT-CIRCUIT FAILURE |
| Duty:50% | Lo | Lo | Lo | Hi-Z or Lo | Lo | Hi | ONE MOTOR DRIVE CIRCUIT HAS SHORT-CIRCUIT FAILURE |
| Hi-Z or Lo | Hi-Z or Lo | Hi-Z or Lo | Hi-Z | Hi-Z | Hi | Lo | MOTOR IS IN LOCKED STATE |

FIG. 11

| STATE OF FAN \ TERMINAL (SIGNAL) | FG1 (fg1) | FG2 (fg2) | NODE N1 (Si) |
|---|---|---|---|
| NORMAL STATE | Duty:50% | Duty:50% | Duty:25% |
| FG FAILURE STATE — FG OPEN-CIRCUIT FAILURE | Hi-Z (OPEN-CIRCUIT FAILURE) | Duty:50% | Duty:50% |
| FG FAILURE STATE — FG OPEN-CIRCUIT FAILURE | Duty:50% | Hi-Z (OPEN-CIRCUIT FAILURE) | Duty:50% |
| FG FAILURE STATE — FG SHORT-CIRCUIT FAILURE | Lo (SHORT-CIRCUIT FAILURE) | Duty:50% | Lo |
| FG FAILURE STATE — FG SHORT-CIRCUIT FAILURE | Duty:50% | Lo (SHORT-CIRCUIT FAILURE) | Lo |
| LOCKED STATE | Hi-Z or Lo | Hi-Z or Lo | Hi or Lo |

FIG. 21

| STATE OF FAN \ TERMINAL (SIGNAL) | FG1 (fg1) | FG2 (fg2) | NODE N1 (sf12) | LD1 (ld1) | LD2 (ld2) | NODE N2 (sl12) | NODE N3 (Si) |
|---|---|---|---|---|---|---|---|
| NORMAL STATE | Duty:50% | Duty:50% | Duty:25% | Lo | Lo | Lo | Duty:75% |
| FG FAILURE STATE — FG OPEN-CIRCUIT FAILURE | Hi-Z (OPEN-CIRCUIT FAILURE) | Duty:50% | Duty:50% | Hi-Z | Lo | Lo | Duty:50% |
|  | Duty:50% | Hi-Z (OPEN-CIRCUIT FAILURE) | Duty:50% | Lo | Hi-Z | Lo |  |
| FG FAILURE STATE — FG SHORT-CIRCUIT FAILURE | Lo (SHORT-CIRCUIT FAILURE) | Duty:50% | Lo | Hi-Z | Lo | Lo | Hi |
|  | Duty:50% | Lo (SHORT-CIRCUIT FAILURE) | Lo | Lo | Hi-Z | Lo |  |
| LOCKED STATE | Hi-Z or Lo | Hi-Z or Lo | Hi-Z or Lo | Hi-Z | Hi-Z | Hi | Lo |

FIG. 35

MOTOR DRIVE CONTROL DEVICE, FAN, AND MOTOR DRIVE CONTROL METHOD

CROSS-REFERENCE TO RELATED APPLICATIONS

This application is a national stage entry of International Application No. PCT/JP2021/002259 filed on Jan. 22, 2021, which claims the benefit of priority to Japanese Application Nos. JP2020-021802 and JP2020-021803, both filed Feb. 12, 2020, the entire disclosures of which are hereby incorporated herein by reference.

TECHNICAL FIELD

The present invention relates to a motor drive control device, a fan, and a motor drive control method, and for example, relates to a motor drive control device with drive circuits of two systems.

BACKGROUND ART

A motor drive device for driving a single-phase motor is disclosed in the related art (for example, see Patent Literature 1).

CITATION LIST

Patent Literature

Patent Literature 1: JP 2009-77543 A

SUMMARY OF INVENTION

Technical Problem

By the way, a failure may occur in the drive circuit of the motor drive control device and thus the motor may not be able to be driven. For example, in an application to drive the motor in a predetermined rotational direction (forward direction), a problem may arise when the motor cannot be driven as described above and an external force acts to cause the motor to forcibly rotate in the direction opposite to the predetermined rotational direction (reverse rotation).

For example, in a case of a fan (which will also be referred to as a "fan motor" below) to be driven using a motor drive control device, the fan motor stops when the drive circuit of the motor drive control device fails due to blowing of the fuse of the power supply line, or the like. In such a case, for example, when air flows into the fan motor due to an operation of another fan motor being used in conjunction with the aforementioned fan motor, the fan motor may rotate in the reverse direction. For example, when a plurality of fan motors are used for the purpose of cooling of a device surrounded by a housing and one fan motor rotates in the reverse direction as described above, the internal pressure of the device may fall, the cooling function deteriorates, and thus, the deterioration may affect functions of the device. For this reason, forward rotation of the fan motor needs to be continued for as long as possible.

As a method for solving the above problem, if drive circuits of two systems are provided as motor drive control devices, even when one drive circuit fails, the fan motor can be continuously driven by using the other drive circuit.

By the way, when the drive circuits of two systems are provided in the motor drive control device in this way, if it is possible to determine whether the motor is being driven normally, whether the motor is locked, whether either one of the drive circuits has failed, or the like, appropriate control in accordance with the state of the fan motor can be performed, and this control will be convenient.

The present invention aims to provide a motor drive control device capable of determining a drive state of a motor.

Solution to Problem

A motor drive control device according to a representative embodiment of the present invention includes a plurality of motor drive circuits performing, based on a drive control signal for controlling the number of rotations of a motor, control of energization of the motor and outputting FG signals having a cycle corresponding to the actual number of rotations of the motor, a composite signal generation circuit receiving an input of the FG signals output from the plurality of motor drive circuits and generating a composite signal by combining the received FG signals, and a drive control circuit generating, based on a speed command signal indicating a target number of rotations of the motor, the drive control signal and outputting the drive control signal to each of the plurality of motor drive circuits. The FG signals output from the plurality of motor drive circuits have a phase difference from each other.

Advantageous Effects of Invention

The motor drive control device according to the present invention can determine a drive state of a motor.

BRIEF DESCRIPTION OF DRAWINGS

FIG. 3 is a table showing a relationship between states of the fan and aspects of a composite signal Si according to the first embodiment.

FIG. 11 is a table showing a relationship between states of the fan and aspects of a composite signal Si according to the second embodiment.

FIG. 21 is a table showing a relationship between states of the fan and aspects of a composite signal Si according to the third embodiment.

FIG. 35 is a table showing a relationship between states of the fan and aspects of a composite signal Si according to the fourth embodiment.

DESCRIPTION OF EMBODIMENTS

1. Overview of Embodiments

Figure 1:
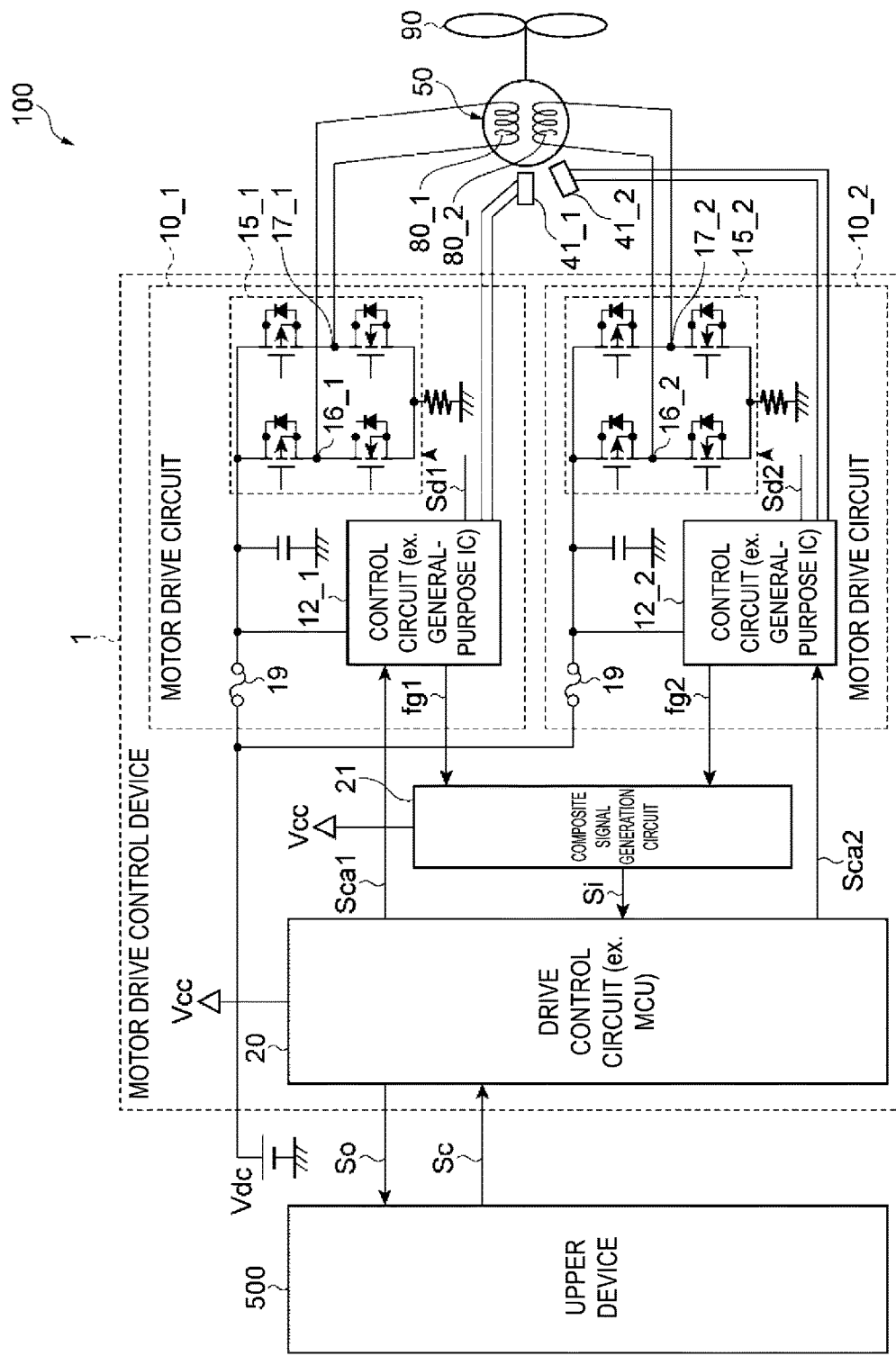
FIG. 1 is a diagram illustrating a configuration of a fan according to a first embodiment.

First, an overview of representative embodiments of the invention disclosed in the present application will be described. In the following description, reference signs in the drawings corresponding to the components of the invention are illustrated in parentheses, as an example.

[1] A motor drive control device (1, 1A, 1D, or 1E) according to a representative embodiment of the present invention includes a plurality of motor drive circuits performing, based on a drive control signal for controlling the number of rotations of a motor, control of energization of the motor and outputting FG signals having a cycle corresponding to an actual number of rotations of the motor, a composite signal generation circuit receiving an input of the FG signals output from the motor drive circuits and generating a composite signal by combining the received FG signals, and a drive control circuit generating, based on a speed command signal indicating a target number of rotations of the motor, the drive control signal and outputting the drive control signal to each of the motor drive circuits. The FG signals output from the motor drive circuits have a phase difference from each other.

[2] In the motor drive control device (1 or 1A) described in [1] above, the plurality of motor drive circuits may include a first motor drive circuit (10_1 or 10A_1) performing, based on the drive control signal, control of energization of the motor and outputting a first FG signal (fg1) having a frequency corresponding to the actual number of rotations of the motor, and a second motor drive circuit (10_2 or 10A_2) performing, based on the drive control signal, control of energization of the motor and outputting a second FG signal (fg2) having the frequency corresponding to the actual number of rotations of the motor and being out of phase with the first FG signal, and the composite signal generation circuit (21 or 21A) may combine the first FG signal and the second FG signal to generate the composite signal (Si).

[3] In the motor drive control device (1 or 1A) described in [2] above, the first FG signal (fg1) and the second FG signal (fg2) may be rectangular-wave shaped signals having a predetermined duty ratio, and the composite signal generation circuit may generate, based on a logical AND of the first FG signal and the second FG signal, the composite signal.

[4] In the motor drive control device (1) described in [3] above, the first motor drive circuit (10_1) may include a first output terminal (FG1) for outputting the first FG signal (fg1) and a first output transistor (Q1) connected between the first output terminal and a first fixed potential (ground voltage GND), the second motor drive circuit (10_2) may include a second output terminal (FG2) for outputting the second FG signal (fg2) and a second output transistor (Q2) connected between the second output terminal and the first fixed potential, and the composite signal generation circuit may include a load (R1) connected between a connection point (N1) where the first output terminal and the second output terminal are commonly connected and a second fixed potential (power supply voltage Vcc) different from the first fixed potential.

[5] In the motor drive control device (1) described in [3] or [4] above, the drive control circuit (20) may receive an input of the composite signal (Si) and determine, when the composite signal is a signal having a duty ratio according to a phase difference (e.g., 90 degrees) between the first FG signal and the second FG signal, that the motor drives normally.

[6] In the motor drive control device (1) described in [5] above, the drive control circuit (20) may receive the input of the composite signal and determine, when the composite signal has the predetermined duty ratio, that either the first motor drive circuit or the second motor drive circuit has an open-circuit failure.

[7] In the motor drive control device (1) described in [5] or [6] above, the drive control circuit may receive the input of the composite signal and determine, when the composite signal has a predetermined logical value, that at least one of the first motor drive circuit or the second motor drive circuit has a short-circuit failure or that the motor is in a locked state.

[8] In the motor drive control device (1A) described in [2] above, the first motor drive circuit (10A_1) may output a first lock detection signal (ld1) being a binary signal and indicating whether the motor is in a locked state, the second motor drive circuit (10A_2) may output a second lock detection signal (ld2) being a binary signal and indicating whether the motor is in the locked state, and the composite signal generation circuit may combine the first FG signal, the second FG signal, the first lock detection signal, and the second lock detection signal to generate the composite signal.

[9] In the motor drive control device (1A) described in [8] above, the first FG signal (fg1) and the second FG signal (fg2) may be rectangular-wave shaped signals having a predetermined duty ratio, and the composite signal generation circuit (21A) may generate, based on a logical AND of a signal based on a logical AND of the first FG signal (fg1) and the second FG signal (fg2) and a signal based on a logical AND of the first lock detection signal (ld1) and the second lock detection signal (ld2), the composite signal (Si).

[10] In the motor drive control device (1A) described in [9] above, the first motor drive circuit (10A_1) may include a first output terminal (FG1) for outputting the first FG signal (fg1), a second output terminal (LD1) for outputting the first lock detection signal (ld1), a first output transistor (Q1) connected between the first output terminal and a first fixed potential (ground voltage GND), and a second output transistor (Q1A) connected between the second output terminal and the first fixed potential, the second motor drive circuit (10A_2) may include a third output terminal (FG2) for outputting the second FG signal (fg2), a fourth output terminal (LD2) for outputting the second lock detection signal (ld2), a third output transistor (Q2) connected between the third output terminal (FG2) and the first fixed potential (GND), and a fourth output transistor (Q2A) connected between the fourth output terminal (LD2) and the first fixed potential (GND), and the composite signal generation circuit (21A) may include a first load (R1) connected between a first connection point (N1) where the first output terminal and the third output terminal are commonly connected and a second fixed potential (Vcc) different from the first fixed potential, a second load (R2) connected between a second connection point (N2) where the second output terminal and the fourth output terminal are commonly connected and the second fixed potential (Vcc), a third load (R3) including one end connected to the second fixed potential, a first switch element (SW1) connected between the first fixed potential (GND) and another end of the third load and controlled, based on a voltage at the first connection point, to on or off, and a second switch element (SW2) connected between the first fixed potential (GND) and the other end of the third load and controlled, based on a voltage at the second connection point, to on or off.

[11] In the motor drive control device (1A) described in [9] or [10] above, the drive control circuit (20) may determine, when the composite signal (Si) has a duty ratio according to the phase difference between the first FG signal and the second FG signal, that the motor is being driven normally.

[12] In the motor drive control device (1A) described in [11] above, the drive control circuit (20) may determine, when the composite signal (Si) has the predetermined duty ratio, that either the first motor drive circuit or the second motor drive circuit has an open-circuit failure.

[13] In the motor drive control device (1A) described in [12] above, the drive control circuit (20) may determine, when the composite signal (Si) is at a first logical level (high level), that either the first motor drive circuit or the second motor drive circuit has a short-circuit failure.

[14] In the motor drive control device (1A) described in [13] above, the drive control circuit (20) may determine, when the composite signal (Si) is at a second logical level (low level) different from the first logical level, that the motor is in the locked state.

[15] A fan (100 or 100A) according to a representative embodiment of the present invention may include the motor drive control device (1 or 1A) described in any one of [2] to [14] above, and the motor (50) including a coil (80_1) of a first system and a coil (80_2) of a second system. The first motor drive circuit (10_1 or 10A_1) may control energization of the coil (80_1) of the first system, and the second motor drive circuit (10_2, 10A_2) may control energization of the coil (80_2) of the second system.

[16] A fan (100B or 100C) according to a representative embodiment of the present invention may include the motor drive control device (1 or 1A) described in any one of [2] to above, and two of the motor (50B_1 and 50B_2) each including at least one coil (80B_1 or 80B_2). The first motor drive circuit (10A_1) may control energization of the coil (80B_1) of one motor (50B_1), and the second motor drive circuit (10A_2) may control energization of the coil (80B_2) of the other motor (50B_2).

[17] In the motor drive control device (1D or 1E) described in [1] above, the drive control circuit (20) may perform, when the composite signal (Si) indicates a predetermined logical value, first determination processing of causing at least one of the plurality of motor drive circuits (10D_1, 10D_2, 10E_1, or 10E_2) to transition to a high-level state where an output of the FG signal (fg1 or fg2) is impossible and distinguishing, based on the composite signal at the time of the high-level state, whether any one of the plurality of motor drive circuits is in an FG failure state where a normal output of the FG signal is impossible or the motor is in the locked state where rotation of the motor is impossible.

[18] In the motor drive control device described in [17] above, each of the motor drive circuits may be able to stop operations of at least some of circuits inside the motor drive circuit and transition to a power-saving state to fix the output of the FG signal to a high level, and the drive control circuit may cause, when the composite signal indicates the predetermined logical value, at least one of the plurality of motor drive circuits to transition to the power-saving state and perform, based on the composite signal at the time of the power-saving state, the first determination processing.

[19] In the motor drive control device described in [17] or [18], each of the motor drive circuits may include an internal power supply circuit (121) generating and outputting an internal power supply voltage (Vdd), an FG signal generation unit (124) being configured to be operable with power supply from the internal power supply voltage and generating and outputting, based on a position detection signal (hp or hn) according to a rotation position of a rotor of the motor, the FG signal, and a control unit (122) controlling supply and cutoff of the internal power supply voltage to the FG signal generation unit and generating, based on the drive control signal, a drive signal (Sd1 or Sd2) for energizing the motor, the drive control circuit may stop, when the composite signal indicates the predetermined logical value, an output of the drive control signal, and the control unit may cut off, when the drive control signal is not input and the FG signal is not shifted for a predetermined period, the supply of the internal power supply voltage to the FG signal generation unit.

[20] In the motor drive control device described in [19] above, in the first determination processing, the drive control circuit may determine, when detecting a predetermined change in the composite signal, that any one of the plurality of motor drive circuits is in the FG failure state and determine, when the composite signal is fixed to the predetermined logical value, that the motor is in the locked state.

[21] In the motor drive control device described in [20] above, the drive control circuit may perform, when determining that any one of the plurality of motor drive circuits is in the FG failure state, second determination processing of sequentially driving the plurality of motor drive circuits one by one and distinguishing, based on the composite signal at the time of the sequentially driving, which one of the motor drive circuits is in the FG failure state.

[22] In the motor drive control device described in [21] above, the drive control circuit may stop the output of the drive control signal to the motor drive circuit determined to be in the FG failure state by the second determination processing and output the drive control signal to the motor drive circuit determined to be in a normal state by the second determination processing.

[23] In the motor drive control device described in any one of [17] to [22] above, the FG signals may be rectangular-wave shaped signals having a predetermined duty ratio in a cycle corresponding to the number of rotations of the motor, and the composite signal generation circuit may generate, based on a logical AND of the FG signals output from the motor drive circuits, the composite signal.

[24] In the motor drive control device (1E) described in any one of [17] to [22] above, the motor drive circuits (10E_1 and 10E_2) may output lock detection signals (ld1 and ld2) being binary signals indicating whether the motor is locked, the FG signals may be rectangular-wave shaped signals having a predetermined duty ratio in a cycle corresponding to the number of rotations of the motor, and the composite signal generation circuit (21A) may generate, based on a logical AND of a signal (sf12) based on a logical AND of the FG signals output from the motor drive circuits and a signal (sl11) based on a logical AND of the lock detection signals output from the motor drive circuits, the composite signal.

[25] A fan (100D or 100E) according to a representative embodiment of the present invention includes the motor drive control device (1D or 1E) described in any one of [17] to [24] above, the motor (50, 50B_1, or 50B_2), and an impeller (90, 90_1, or 90_2) configured to be rotatable by a rotation force of the motor.

[26] A method according to a representative embodiment of the present invention is a motor drive control method performed by a motor drive control device (1D or 1E) including a plurality of motor drive circuits (10D_1, 10D_2, 10E_1, and 10E_2) performing, based on a drive control signal (Sca1 or Sca2) for controlling the number of rotations of a motor (50), control of energization of the motor (50) and outputting FG signals (fg1 and fg2) having a cycle corresponding to an actual number of rotations of the motor, a composite signal generation circuit (21 or 21A) receiving an input of the FG signals output from the motor drive circuits and generating a composite signal (Si) by combining the received FG signals, and a drive control circuit (20) generating, based on a speed command signal (Sc) indicating a target number of rotations of the motor, the drive control signal, outputting the drive control signals to each of the motor drive circuits, and determining, based on the composite signal, a state of the motor and the motor drive circuits. According to the present motor drive control method, the FG signals output from the motor drive circuits have a phase difference from each other. The present motor drive control method includes a first step (S101 to S103) of causing, by the drive control circuit, when the composite signal indicates a predetermined logical value, at least one of the plurality of motor drive circuits to transition to a high-level state where an output of the FG signal is impossible, a second step (S104, S105, and S108) of performing, by the drive control circuit, based on the composite signal in the first step, first determination processing of distinguishing whether any one of the plurality of motor drive circuits is in an FG failure state where a normal output of the FG signal is impossible or the motor is in a locked state where rotation of the motor is impossible.

2. Specific Examples of Embodiments

Specific examples of the embodiments according to the present invention will be described below with reference to the drawings. In the following description, components common to the respective embodiments are denoted by the same reference signs, and repeated descriptions are omitted.

FIG. 1 is a block diagram illustrating a configuration of a fan according to a first embodiment.

A fan (fan motor) 100 according to the first embodiment is a device generating an airflow by rotating an impeller (bladed wheel). The fan 100 can be used as one of cooling devices discharging heat generated inside the device to the outside to cool the inside of the device and can be mounted on, for example, a machine tool or the like used in an environment with generation of oil mist, cutting chips, smoke, dust, and the like, in addition to an information processing device such as a server. The fan 100 is, for example, an axial fan.

The fan 100 includes a motor 50, an impeller 90, position detectors 41_1 and 41_2, and a motor drive control device 1 as illustrated in FIG. 1.

In the present embodiment, the motor 50 is, for example, a single-phase brushless motor provided with coils 80_1 and 80_2 of two systems wound around teeth (not illustrated). The impeller 90 is configured to be rotatable by a rotation force of the motor 50. For example, the impeller 90 is connected to an output shaft (not illustrated) of the motor 50.

The motor drive control device 1 is a device used for controlling the rotation of the motor 50. The motor drive control device 1 rotates the motor 50 by periodically flowing a drive current into each of the single-phase coils 80_1 and 80_2 constituting the motor 50.

The position detectors 41_1 and 41_2 output a position detection signal in accordance with the position of a rotor of the motor 50. The position detectors 41_1 and 41_2 are Hall elements, for example. The Hall elements output Hall signals having positive polarity as a position detection signal.

The position detector 41_1 is disposed at a position corresponding to the coil 80_1 of the first system, and outputs a position detection signal to a control circuit 12_1 of a motor drive circuit 10_1 to be described below. The position detector 41_2 is disposed at a position corresponding to the coil 80_2 of the second system, and outputs a position detection signal to a control circuit 12_2 of a motor drive circuit 10_2 to be described below. The position detector 41_1 and the position detector 41_2 are disposed at relative positions having an electrical angle of $\pi/2$ (90 degrees), for example.

The motor drive control device 1 is supplied with a DC power supply voltage Vdc from the outside.

The motor drive control device 1 is connected to an upper device 500. The motor drive control device 1 receives an input of a speed command signal Sc output from the upper device 500. The motor drive control device 1 drives the motor 50 in accordance with the input speed command signal Sc. The motor drive control device 1 also outputs information regarding a state of the motor 50 to the upper device 500. For example, the motor drive control device 1 outputs a signal according to the actual number of rotations of the motor 50 and a signal indicating an abnormal state of the motor described below to the upper device 500 as a state signal So, as will be described below. As a result, the upper device 500 can ascertain the rotational state of the motor 50 and the presence or absence of an abnormality of the motor 50.

Specifically, the motor drive control device 1 includes a plurality of motor drive circuits 10, a drive control circuit 20 controlling operations of the plurality of motor drive circuits 10, and a composite signal generation circuit 21.

The motor drive control device 1 according to the present embodiment includes, for example, motor drive circuits 10_1 and 10_2 of two systems as the plurality of motor drive circuits 10.

The drive control circuit 20 is a circuit for controlling drive of the motor 50 via each of the motor drive circuits 10_1 and 10_2. For example, the drive control circuit 20 includes hardware elements such as a processor such as a CPU, various types of memories such as a ROM and a RAM, a timer (a counter), an A/D conversion circuit, an input and output I/F circuit, and a clock generation circuit and is constituted by a program processing device (for example, a micro controller (MCU)) including each of the constituent elements connected to each other via a bus or a dedicated line.

In the present embodiment, the drive control circuit 20 is packaged as one semiconductor device (an Integrated Circuit (IC)) but is not limited to this form.

The drive control circuit 20 generates a drive control signal Sca for controlling a rotational speed of the motor 50 based on the speed command signal Sc and outputs the drive control signal Sca to each of the motor drive circuits 10. Specifically, the drive control circuit 20 generates drive control signals Sca1 and Sca2 based on the speed command signal Sc input from the upper device 500 and supplies the drive control signals to each of the motor drive circuits 10_1 and 10_2. Further, the drive control circuit 20 may output one drive control signal and split the drive control signal into two lines to supply the drive control signal to the motor drive circuits 10_1 and 10_2. In this case, a switch configured to make the drive control signals invalid by grounding each of the drive control signals to be supplied to the motor drive circuits 10_1 and 10_2 may be provided.

Here, the speed command signal Sc is a signal indicating a target rotational speed (a target number of rotations) of the motor 50 and is, for example, a pulse width modulation (PWM) signal having a duty ratio corresponding to the target rotational speed of the motor. Further, the speed command signal Sc may be, for example, a signal in another format, such as a PFM signal with a frequency corresponding to the target rotational speed.

The drive control signals Sca1 and Sca2 are signals indicating a target rotational speed (a target number of rotations) of the motor 50, similar to the speed command signal Sc and are, for example, PWM signals having a duty ratio corresponding to the target rotational speed of the motor.

In addition, the drive control circuit 20 has a function of determining whether there is an abnormality in the fan 100 (the motor 50 and the motor drive circuits 10_1 and 10_2) and outputting the determination result, in addition to a function of controlling drive of the motor 50 according to the speed command signal Sc from the upper device 500. The drive control circuit 20 determines the presence or absence of an abnormality of the fan 100 based on the composite signal Si generated by the composite signal generation circuit 21 and outputs a state signal So indicating the state of the fan 100 to the upper device 500 based on the determination result.

The plurality of motor drive circuits 10 are circuits performing control of energizing the motor 50 based on the drive control signal Sca and outputting FG signals having a cycle corresponding to the actual number of rotations of the motor 50. The FG signals output from the motor drive circuits 10 have a phase difference from each other. In the present embodiment, the motor drive circuit 10_1 and the motor drive circuit 10_2 as the plurality of motor drive circuits 10 have the same circuit configuration as each other, for example.

The motor drive circuit 10_1 includes a control circuit 12_1 and an inverter circuit (energization circuit) 15_1 energizing the coil 80_1 according to control by the control circuit 12_1. The motor drive circuit 10_2 includes a control circuit 12_2 and an inverter circuit (energization circuit) 15_2 energizing the coil 80_2 according to control by the control circuit 12_2. In this case, the control circuits 12_1 and 12_2 may include the inverter circuits 15_1 and 15_2, respectively.

Each of the motor drive circuits 10_1 and 10_2 includes a fuse 19 including one end connected to the power supply voltage Vdc. In the motor drive circuits 10_1 and 10_2, the power supply voltage Vdc is supplied to the inverter circuits 15_1 and 15_2 and the control circuits 12_1 and 12_2 of the motor drive circuits 10_1 and 10_2, respectively, via the fuses 19.

The inverter circuit 15_1 energizes the coil 80_1 of the motor 50 connected to output terminals 16_1 and 17_1 based on a drive signal Sd1 output from the control circuit 12_1. The inverter circuit 15_2 energizes the coil 80_2 of the motor 50 connected to output terminals 16_2 and 17_2 based on a drive signal Sd2 output from the control circuit 12_2, similarly to the inverter circuit 15_1. The drive signals Sd1 and Sd2 are, for example, pulse width modulation (PWM) signals.

The inverter circuits 15_1 and 15_2 are, for example, H-bridge circuits and include two pairs of serial circuits of two switch elements (e.g., transistors) provided at both ends of the power supply voltage Vdc, as illustrated in FIG. 1. The connection points between the two switch elements in each serial circuit are the output terminals 16_1, 17_1, 16_2, and 17_2 for energizing the coils 80_1 and 80_2. Each switch element constituting the inverter circuits 15_1 and 15_2 is controlled to on or off with the drive signals (PWM signals) Sd1 and Sd2 each output from the control circuits 12_1 and 12_2. Thus, the energization of the coil 80_1 connected to the output terminals 16_1 and 17_1 of the inverter circuit 15_1 and the energization of the coil 80_2 connected to the output terminals 16_2 and 17_2 of the inverter circuit 15_2 are controlled individually.

The control circuit 12_1 generates the drive signal Sd1 based on the drive control signal Sca1 supplied from the drive control circuit 20 and a position detection signal output from the position detector 41_1 to control the inverter circuit 15_1. The control circuit 12_2 generates the drive signal Sd2 based on the drive control signal Sca2 supplied from the drive control circuit 20 and a position detection signal output from the position detector 41_2 to control the inverter circuit 15_2.

For example, the control circuit 12_1 controls the on and off operation of each switch element of the inverter circuit 15_1 by detecting the actual number of rotations of the motor 50 based on the position detection signal, generating a PWM signal having an adjusted duty ratio to make the actual number of rotations of the motor 50 match the number of rotations specified by the drive control signal Sca1, and supplying the PWM signal to the inverter circuit 15_1 as the drive signal Sd1. In addition, similarly, the control circuit 12_2 generates a PWM signal to make the actual number of rotations of the motor 50 based on the position detection signal match the number of rotations specified by the drive control signal Sca2 and supplies the PWM signal to the inverter circuit 15_2 as the drive signal Sd2. Further, the control circuits 12_1 and 12_2 may generate PWM signals having duty ratios corresponding to the number of rotations specified by the drive control signals Sca1 and Sca2, regardless of the actual number of rotations, and may supply the PWM signal to the inverter circuits 15_1 and 15_2 as drive signals Sd1 and Sd2, respectively.

Furthermore, the control circuit 12_1 generates a first FG signal (hereinafter referred to as a "signal fg1") corresponding to the actual number of rotations of the motor 50 based on the position detection signal from the position detector 41_1 and outputs the first FG signal. The control circuit 12_2 generates a second FG signal (hereinafter referred to as a "signal fg2") corresponding to the actual number of rotations of the motor 50 based on the position detection signal from the position detector 41_2 and outputs the second FG signal.

The signals fg1 and fg2 are, for example, rectangular-wave shaped signals having a predetermined duty ratio and have different phases from each other. For example, the signals fg1 and fg2 have frequencies corresponding to the actual rotational speed of the motor 50 and are binary signals (digital signals) generated to have a duty ratio of 50% when the number of rotations is constant.

The phase difference between the signal fg1 and the signal fg2 is, for example, $\pi/2$ (90 degrees). In this case, the phase difference between the position detection signal from the position detector 41_1 and the position detection signal from the position detector 41_2 is $\pi/2$ (90 degrees). Further, the phase difference between the signal fg1 and the signal fg2 is not limited to $\pi/2$ (90 degrees) and may be a value close to $\pi/2$ (90 degrees) (e.g., $\pi/2\pm10\%$).

The composite signal generation circuit 21 receives inputs of the FG signals output from the plurality of motor drive circuits 10 and generates a composite signal Si by combining the input signals. Specifically, the composite signal generation circuit 21 receives inputs of the signals fg1 and fg2 generated by the control circuits 12_1 and 12_2, respectively, and generates a composite signal Si by combining the input signals fg1 and fg2. For example, the composite signal generation circuit 21 generates the composite signal Si based on the logical AND of the signal fg1 and the signal fg2. The composite signal generation circuit 21 and the peripheral circuits of the composite signal generation circuit 21 will be described below in detail.

Figure 2:
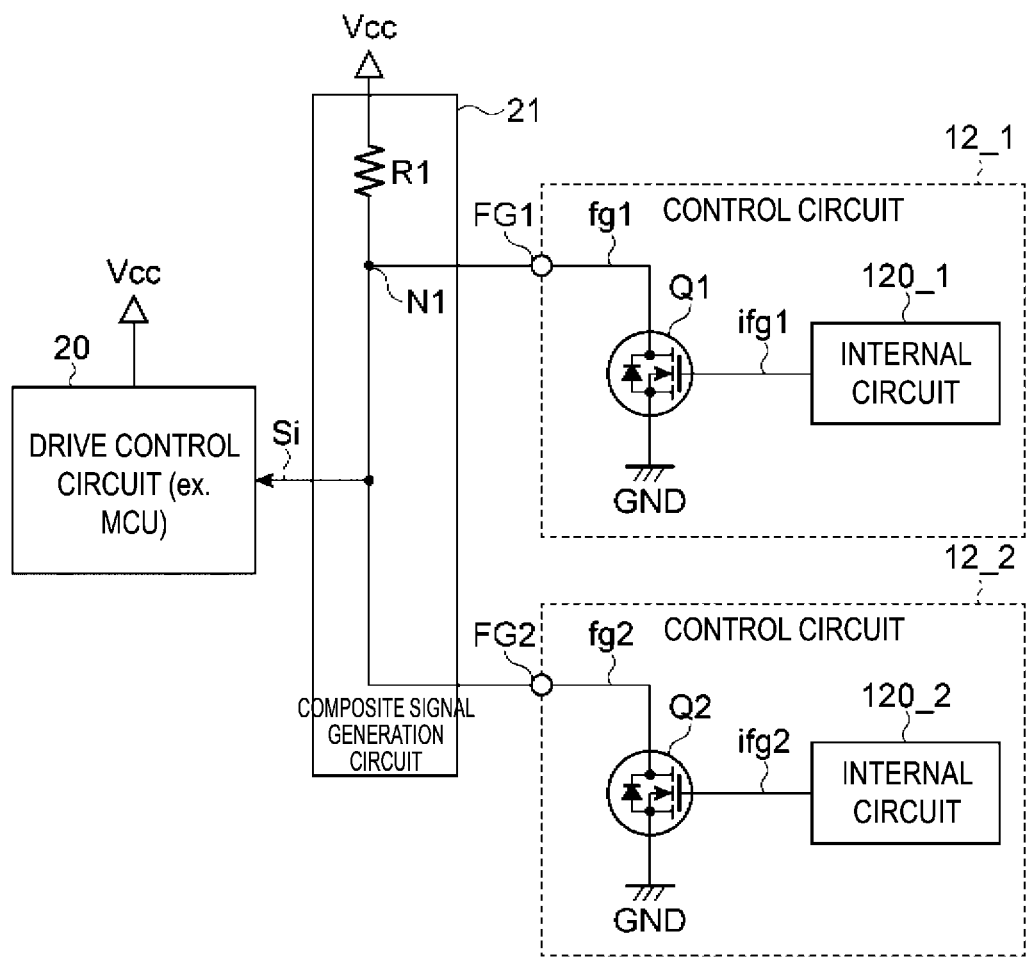
FIG. 2 is a diagram illustrating a configuration of a composite signal generation circuit and peripheral circuits of the composite signal generation circuit according to the first embodiment.

FIG. 2 is a diagram illustrating a configuration of the composite signal generation circuit 21 and the peripheral circuits of the composite signal generation circuit 21 according to the first embodiment. Further, in FIG. 2, only the configuration of the surroundings of the composite signal generation circuit 21 is illustrated.

The control circuit 12_1 and the control circuit 12_2 are each implemented by one integrated circuit (IC). In the present embodiment, both the control circuit 12_1 and the control circuit 12_2 are configured by using general-purpose ICs having the same circuit configuration as hardware. Further, the control circuit 12_1 and the control circuit 12_2 are not limited to have the configuration by the general-purpose ICs. For example, the control circuits may be configured by the microcontrollers (MCUs).

The control circuit 12_1 and the control circuit 12_2 include internal circuits 120_1 and 120_2 to achieve functions as the control circuits 12_1 and 12_2, and a plurality of external terminals for performing input and output of signals between the internal circuits 120_1 and 120_2 and the outside (the drive control circuit 20 in the present embodiment), respectively.

The control circuits 12_1 and 12_2 include, as the external terminals, for example, ground terminals for inputting a ground voltage GND as a first fixed potential, power supply terminals for inputting a power supply voltage Vdc (higher than GND), control signal input terminals for inputting the drive control signals Sca1 and Sca2, FG signal output terminals for outputting the signals fg1 and fg2 as FG signals, position detection signal input terminals for inputting the position detection signals from the position detectors 41_1 and 41_2, and drive signal output terminals for outputting the drive signals Sd1 and Sd2.

Further, in the following description, the FG signal output terminals for outputting the signals fg1 and fg2 will be referred to as a terminal (an example of a first output terminal) FG1 and a terminal (an example of a second output terminal) FG2. In addition, for convenience in explanation, only the terminals FG1 and FG2 are illustrated in FIG. 2 as external terminals of the control circuits 12A_1 and 12A_2.

The control circuit 12_1 includes an output transistor Q1 for outputting, from the terminal FG1, the first FG signal fg1 generated by the internal circuit 120_1 based on the position detection signal from the position detector 41_1, as illustrated in FIG. 2. The output transistor Q1 is connected between the terminal FG1 and the ground voltage GND as the first fixed potential.

The control circuit 12_2 includes an output transistor Q2 for outputting, from the terminal FG2, the second FG signal fg2 generated by the internal circuit 120_2 based on the position detection signal from the position detector 41_2, as control circuit 12_1. The output transistor Q2 is connected between the terminal FG2 and the ground voltage GND. The output transistors Q1 and Q2 are, for example, Field Effect Transistors (FETs).

A power supply voltage Vcc (equal to or lower than the power supply voltage Vdc; an example of a second fixed potential) for driving the circuit is applied to the composite signal generation circuit 21. The composite signal generation circuit 21 is a circuit to generate the composite signal Si based on the logical AND of the first FG signal fg1 and the second FG signal fg2. In the present embodiment, the composite signal generation circuit 21 is formed on the same circuit board as the general-purpose ICs as the control circuits 12_1 and 12_2 and an MCU as the drive control circuit 20 mounted.

The composite signal generation circuit 21 includes, for example, a load R1. The load R1 is, for example, a resistor. The load R1 is connected between a node (a connection point) N1 and the power supply voltage Vcc. To the node N1, the terminal FG1 of the control circuit 12_1 and the terminal FG2 of the control circuit 12_2 are commonly connected. The voltage of the node N1 of the composite signal generation circuit 21 is input to the drive control circuit 20 as the composite signal Si.

The waveform of the composite signal Si changes in accordance with the state of the fan 100 (the motor 50 and the motor drive circuits 10_1 and 10_2). The composite signal Si will be described below in detail.

FIG. 3 is a table showing a relationship between states of the fan 100 and aspects of the composite signal Si according to the first embodiment.

Figure 4:
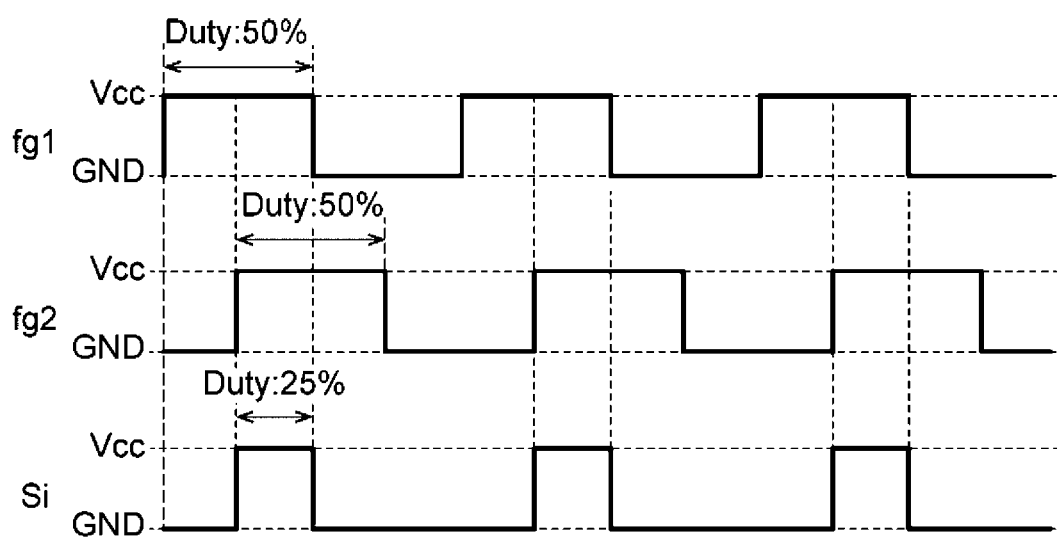
FIG. 4 is a timing chart showing signals fg1 and fg2, and the composite signal Si when the motor is rotating normally in the fan according to the first embodiment.

FIG. 4 is a timing chart showing the signals fg1 and fg2, and the composite signal Si, when the motor 50 is rotating normally in the fan 100 according to the first embodiment.

First, a case of the fan 100 being driven normally, that is, a case of the motor 50 in normal rotation will be considered. In this case, the signals fg1 and fg2 (binary signals) having a duty ratio of 50% are output from the terminals FG1 and FG2 of the control circuits 12_1 and 12_2, respectively, as illustrated in FIG. 4. In addition, the signal fg1 and the signal fg2 have a phase difference of 90 degrees as described above. Thus, the composite signal Si output from the composite signal generation circuit 21 is a binary signal having a duty ratio of 25% in the same cycle as the signals fg1 and fg2 as illustrated in FIG. 4.

Next, a case of occurrence of a failure in any one of the terminals FG1 and FG2 of the motor drive circuits 10_1 and 10_2 being in an open state will be considered. For example, the terminal FG1 has an open-circuit failure when the output transistor Q1 connected to the terminal FG1 of the control circuit 12_1 fails and thus the output transistor Q1 does not turn on, when the wiring connecting the terminal FG1 and the output transistor Q1 is broken, or the like. In addition, the terminal FG1 has an open-circuit failure because the output transistor Q1 does not turn on also when the position detector 41_1 connected to the control circuit 12_1 fails and a signal ifg1 output from the internal circuit 120_1 is fixed to a low level. Hereinafter, a failure of the terminals FG1 and FG2 of the motor drive circuits 10_1 and 10_2 being in an open state will also be referred to as an open-circuit failure of the motor drive circuits 10_1 and 10_2.

Figure 5:
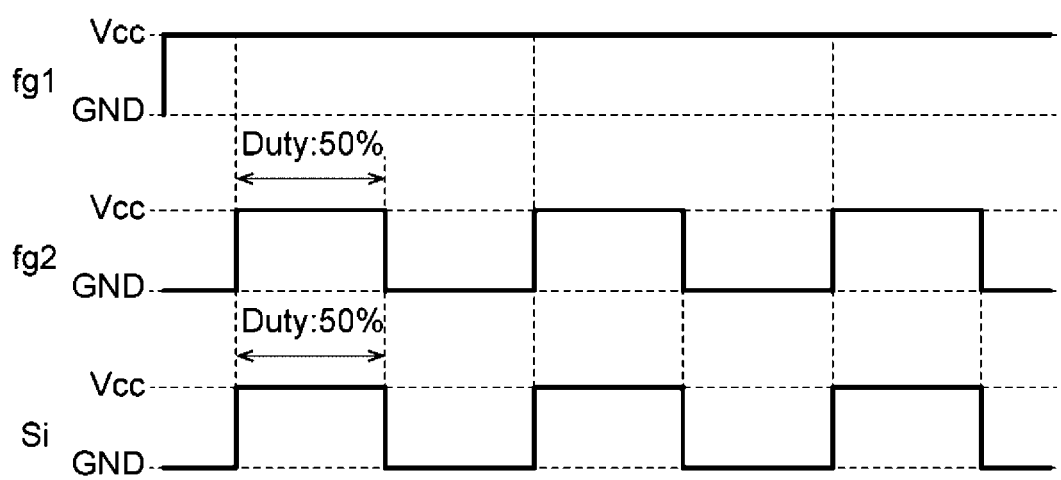
FIG. 5 is a timing chart showing the signals fg1 and fg2, and the composite signal Si when an open-circuit failure occurs in a terminal FG1 of a motor drive circuit of the fan according to the first embodiment.

FIG. 5 is a timing chart showing the signals fg1 and fg2, and the composite signal Si when an open-circuit failure occurs in the terminal FG1 of the motor drive circuit 10_1 of the fan 100 according to the first embodiment.

When the terminal FG1 is in the open state, the terminal FG1 is in a high impedance state (Hi-Z) as illustrated in FIG. 5. On the other hand, because the motor drive circuit 10_1 is operating normally, the signal fg2 output from the terminal FG2 is a binary signal having a duty ratio of 50%. Thus, the composite signal Si output from the composite signal generation circuit 21 is a binary signal having a duty ratio of 50% as illustrated in FIG. 5.

Similarly, also when the terminal FG2 of the motor drive circuit 10_2 has an open-circuit failure, the composite signal Si having a duty ratio of 50% is output from the composite signal generation circuit 21.

Next, a case of occurrence of a failure in either the terminals FG1 or FG2 of the motor drive circuits 10_1 and 10_2 being in a short-circuit state will be considered. For example, when the output transistor Q1 connected to the terminal FG1 of the control circuit 12_1 fails and an emitter electrode and a collector electrode of the output transistor Q1 are short-circuited, the terminal FG1 has a short-circuit failure. In addition, the terminal FG1 has a short-circuit failure because the output transistor Q1 does not turn off even when the position detector 41_1 connected to the control circuit 12_1 fails and a signal ifg1 output from the internal circuit 120_1 is fixed to a high level. Hereinafter, a failure of the terminals FG1 and FG2 of the motor drive circuits 10_1 and 10_2 being in a short-circuit state will also be referred to as a short-circuit failure of the motor drive circuits 10_1 and 10_2.

Figure 6:
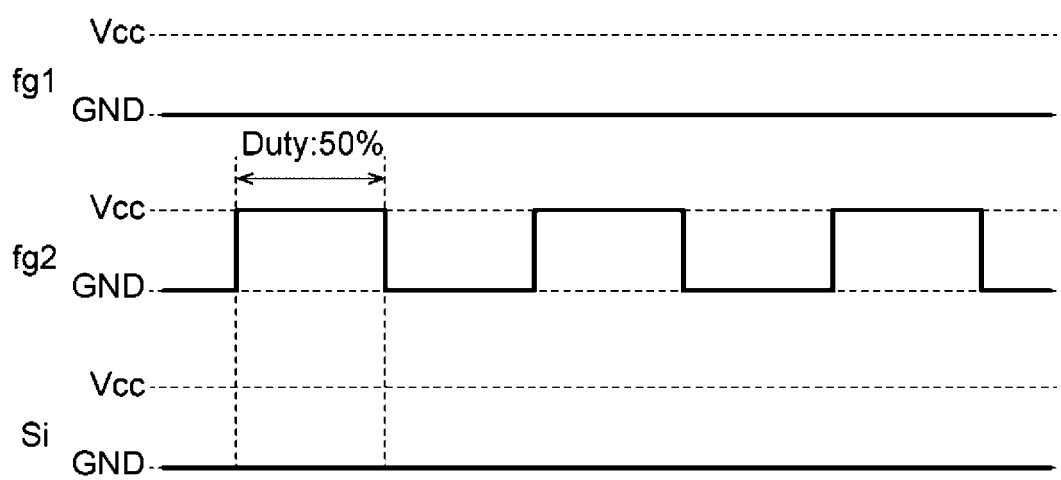
FIG. 6 is a timing chart showing the signals fg1 and fg2, and the composite signal Si when a short-circuit failure occurs in the terminal FG1 of the motor drive circuit of the fan according to the first embodiment.

FIG. 6 is a timing chart showing the signals fg1 and fg2, and the composite signal Si when a short-circuit failure occurs in the terminal FG1 of the motor drive circuit 10_1 of the fan 100 according to the first embodiment.

When the terminal FG1 is in the short-circuit state, the voltage (the signal fg1) of the terminal FG1 becomes a ground voltage GND (low (Lo) level) as illustrated in FIG. 6. Meanwhile, although the motor drive circuit 10_2 attempts to output the signal fg2 having a duty ratio of 50% from the terminal FG2 because the motor drive circuit 10_2 is operating normally, the composite signal Si output from the composite signal generation circuit 21 is at a low level (an example of a second logical level) due to the node N1 being short-circuited via the terminal FG1.

Next, a case of the motor 50 being in a locked state will be considered.

Figure 7A:
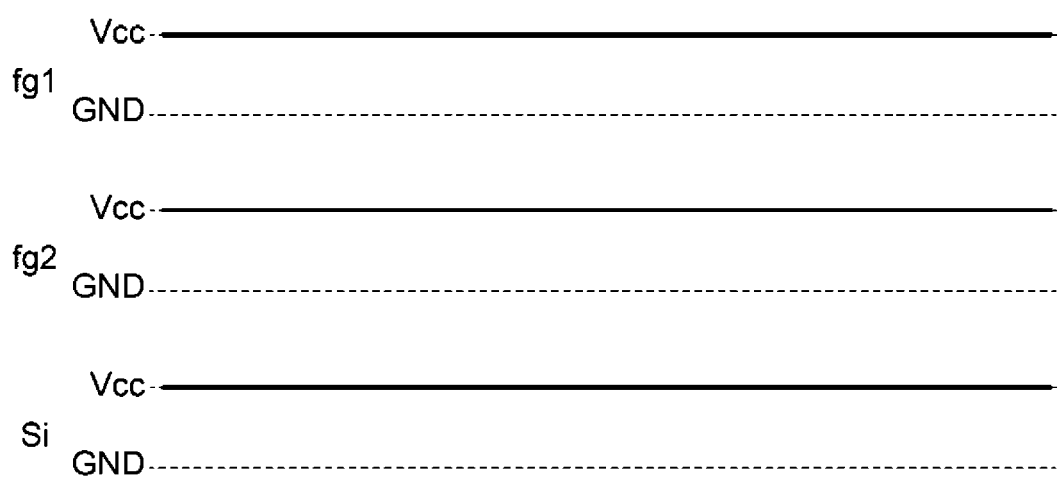
FIG. 7A is a timing chart showing the signals fg1 and fg2, and the composite signal Si when the motor is in a locked state in the fan according to the first embodiment.
Figure 7B:
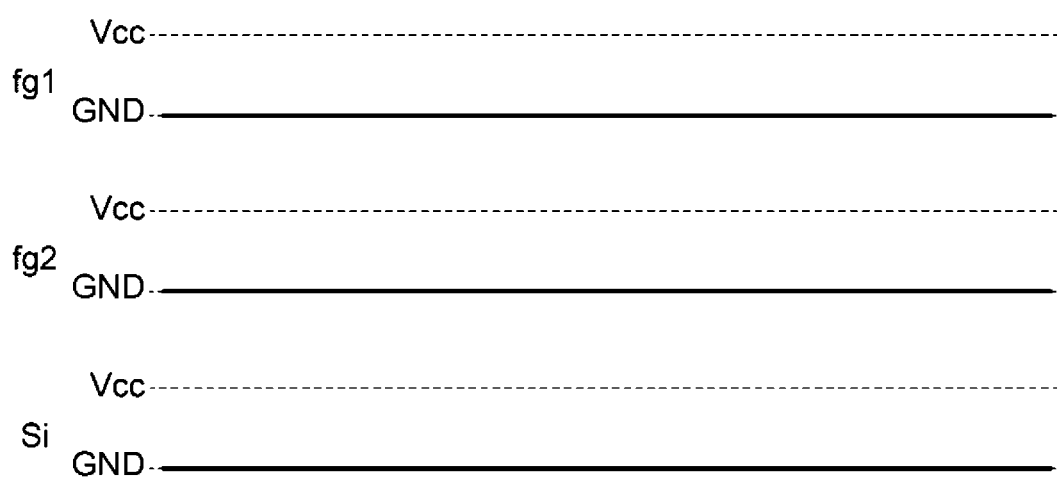
FIG. 7B is a timing chart showing the signals fg1 and fg2, and the composite signal Si when the motor is in the locked state in the fan according to the first embodiment.

FIGS. 7A and 7B are timing charts showing the signals fg1 and fg2, and the composite signal Si when the motor 50 is in a locked state in the fan 100 according to the first embodiment.

When the motor 50 is in a locked state, signals ifg1 and ifg2 output from the internal circuits 120_1 and 120_2, respectively, are fixed to either a low level (the ground voltage GND) or a high (Hi) level (the power supply voltage Vcc).

For example, when the motor 50 is in the locked state and both the signals ifg1 and ifg2 output from the internal circuits 120_1 and 120_2, respectively, are a low level, both the signals fg1 and fg2 are at a high level (an example of a first logical level), and the composite signal Si output from the composite signal generation circuit 21 is at a high level (the power supply voltage Vcc) as illustrated in FIG. 7A.

In addition, for example, when the motor 50 is in the locked state and both the signals ifg1 and ifg2 output from the internal circuits 120_1 and 120_2, respectively, are a high level, both the signals fg1 and fg2 are at a low level, and the composite signal Si output from the composite signal generation circuit 21 is at a low level (the ground voltage GND) as illustrated in FIG. 7B. In addition, when the motor 50 is in the locked state and the signals ifg1 and ifg2 output from the internal circuits 120_1 and 120_2, respectively, are at different levels, either the signal fg1 or fg2 is at a low level, and thus the composite signal Si output from the composite signal generation circuit 21 is at a low level (the ground voltage GND).

Because the waveform of the composite signal Si changes in accordance with a drive state of the fan 100 (the motor 50 and the motor drive circuits 10_1 and 10_2) as described above, the drive state of the fan 100 can be determined by observing the composite signal Si.

In the present embodiment, the drive control circuit 20 receives the input of the composite signal Si generated by the composite signal generation circuit 21 and determines the drive state of the fan 100 based on the composite signal Si.

Figure 8:
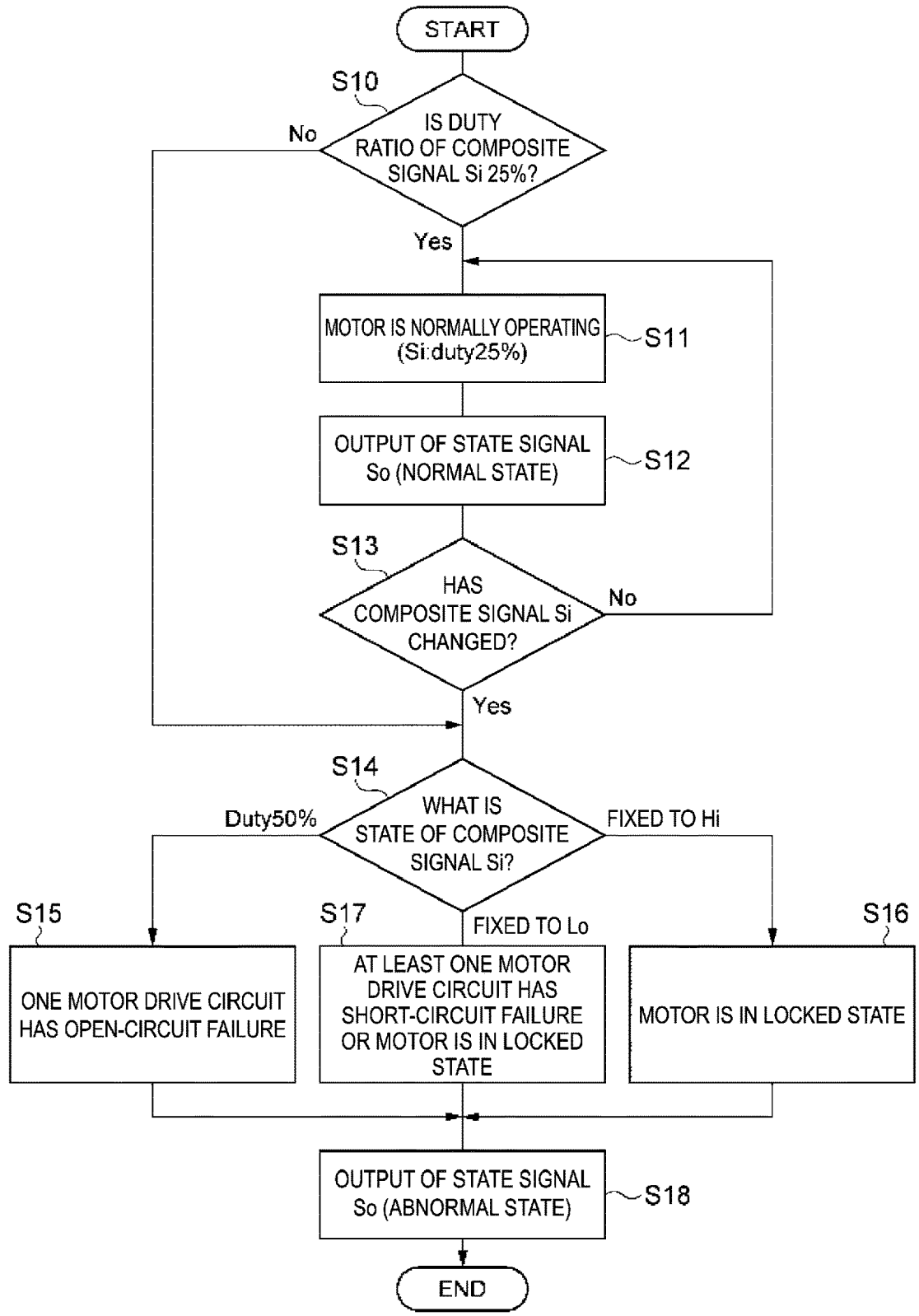
FIG. 8 is a flowchart illustrating a flow of drive state determination processing for the fan performed by a motor drive control device according to the first embodiment.

FIG. 8 is a flowchart illustrating a flow of drive state determination processing for the fan 100 by the motor drive control device 1 according to the first embodiment.

First, the drive control circuit 20 determines whether the duty ratio of the composite signal Si is 25% (step S10) as illustrated in FIG. 8. If the duty ratio of the composite signal Si is 25% (step S10: Yes), the drive control circuit 20 determines that the fan 100 (the motor 50 and the motor drive circuits 10_1 and 10_2) is being driven normally (step S11). Then, the drive control circuit 20 outputs a state signal So indicating that the fan 100 (the motor 50) is being driven normally to the upper device 500 (step S12). For example, the drive control circuit 20 outputs an FG signal having a duty ratio of 50% at a frequency according to the actual number of rotations of the motor 50 as the state signal So to the upper device 500 based on the composite signal Si generated from the signals fg1 and fg2.

Next, the drive control circuit 20 determines whether the duty ratio of the composite signal Si has been changed (step S13). If the duty ratio of the composite signal Si has not been changed (step S13: No), the fan 100 (the motor 50 and the motor drive circuits 10_1 and 10_2) is determined to be continuously driven normally (step S11) and then the state signal So indicating that the fan 100 is operating normally is output to the upper device 500 (step S12).

On the other hand, if the duty ratio of the composite signal Si has been changed (step S13: Yes) or if the duty ratio of the composite signal Si is not 25% in step S10 (step S10: No), the drive control circuit 20 distinguishes the waveform of the composite signal Si (step S14).

Specifically, if the duty ratio of the composite signal Si is 50%, the drive control circuit 20 determines that either the motor drive circuit 10_1 or 10_2 has an open-circuit failure (step S15; see FIG. 5).

In addition, the drive control circuit 20 determines that the motor 50 is in a locked state if the composite signal Si is at a high level (a level equivalent to the power supply voltage Vcc) (step S16; see FIG. 7A). On the other hand, if the composite signal Si is at a low level (a level equivalent to the ground voltage), the drive control circuit 20 determines that at least one of the motor drive circuits 10_1 or 10_2 has a short-circuit failure or that the motor 50 is in the locked state (step S17; see FIG. 7B).

Thereafter, the drive control circuit 20 generates the state signal So indicating the state of the fan 100 based on the determination results of steps S15, S16, and S17 and outputs the state signal So to the upper device 500 (step S18). For example, the drive control circuit 20 outputs the state signal So to the upper device 500 as the power supply voltage Vcc (high (Hi) level) or the ground voltage GND (low (Lo) level). This allows the upper device 500 to ascertain the drive state of the fan 100.

The motor drive control device 1 according to the first embodiment described above includes the drive control circuit 20 generating the drive control signals Sca1 and Sca2 for controlling a rotational speed of the motor 50 based on the speed command signal Sc indicating a target rotational speed of the motor, the motor drive circuits 10_1 and 10_2 controlling energization of the motor 50 based on the drive control signals Sca1 and Sca2 and outputting the signals fg1 and fg2 having a frequency corresponding to the actual number of rotations of the motor 50 and different phases from each other, and the composite signal generation circuit 21 generating the composite signal Si by combining the signals fg1 and fg2.

According to this configuration, because the composite signal Si obtained by combining the two FG signals having different phases and changing an aspect (waveform) in accordance with the drive state of the motor 50 is generated, the drive state of the fan 100 (the motor 50 and the motor drive circuits 10_1 and 10_2) can be determined by determining the waveform of the composite signal Si.

Specifically, when the signals fg1 and fg2 are rectangular-wave shaped signals having a predetermined duty ratio (e.g., binary signals having a duty ratio of 50%) and the phase difference is 90 degrees, the composite signal generation circuit 21 generates the composite signal Si based on the logical AND of the signals fg1 and fg2.

According to this configuration, the motor 50 can be determined to be driven normally if the composite signal Si is a binary signal having the duty ratio (e.g., 25%) according to the phase difference between the signal fg1 and the signal fg2. Further, if the composite signal Si has a predetermined duty ratio, that is, the same duty ratio as the signals fg1 and fg2 (e.g., 50%), either the motor drive circuit 10_1 or 10_2 (the terminals FG1 and FG2 for outputting the signals fg1 and fg2) can be determined to have an open-circuit failure. Furthermore, if the composite signal Si is fixed to the ground voltage GND (a low level), at least one of the motor drive circuits 10_1 or 10_2 (the terminals FG1 and FG2) can be determined to have a short-circuit failure, or the motor 50 can be determined to be in a locked state. Furthermore, if the composite signal Si is fixed to the power supply voltage Vcc (a high level), the motor 50 can be determined to be in the locked state.

The motor drive control device 1 according to the first embodiment can notify an outside device (e.g., the upper device 500) of the drive state of the motor 50 (the fan 100) as described above. In addition, by configuring the composite signal generation circuit 21, the motor drive control device 1 can cut the number of signal lines output from the motor drive circuits 10_1 and 10_2 to the drive control circuit 20 and can reduce signal processing performed by the drive control circuit 20.

Second Embodiment

Figure 9:
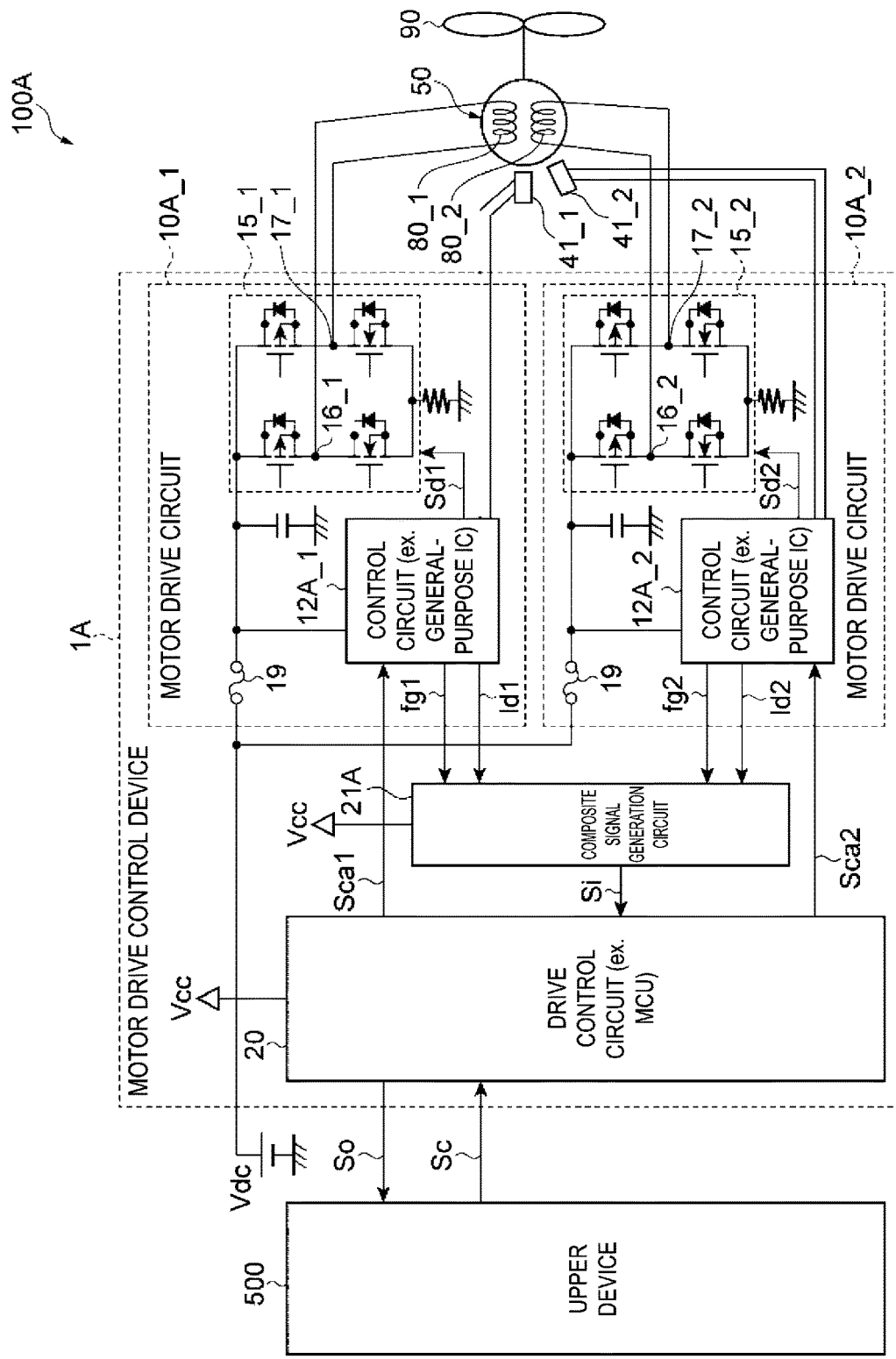
FIG. 9 is a diagram illustrating a configuration of a fan according to a second embodiment.

FIG. 9 is a block diagram illustrating a configuration of a fan according to a second embodiment of the present invention.

A motor drive control device 1A of a fan 100A according to the second embodiment is different from the motor drive control device 1 according to the first embodiment with respect to the point that FG signals as well as a lock detection signal indicating whether the motor 50 is in a locked state are used to generate the composite signal Si, and similar to the motor drive control device 1 according to the first embodiment with respect to other points.

Control circuits 12A_1 and 12A_2 of motor drive circuits 10A_1 and 10A_2 in the motor drive control device 1A generate and output lock detection signals ld1 and ld2 in addition to signals fg1 and fg2, respectively, as illustrated in FIG. 9.

Here, the lock detection signals ld1 and ld2 are signals indicating whether the motor 50 is in a state of incapable of rotating, that is, the motor 50 is in a locked state. The lock detection signals ld1 and ld2 are, for example, binary signals. For example, the motor 50 is indicated to be in an unlocked state (normal state) when the lock detection signal ld1 is at a low level (the ground voltage GND), and the motor 50 is indicated to be in a state of being locked (locked state) when the lock detection signal ld1 is at a high level (the power supply voltage Vcc).

For example, when a general-purpose IC is used as the control circuits 12A_1 and 12A_2, the signals output based on the lock detection function of the general-purpose IC can be used as the lock detection signals ld1 and ld2.

Figure 10:
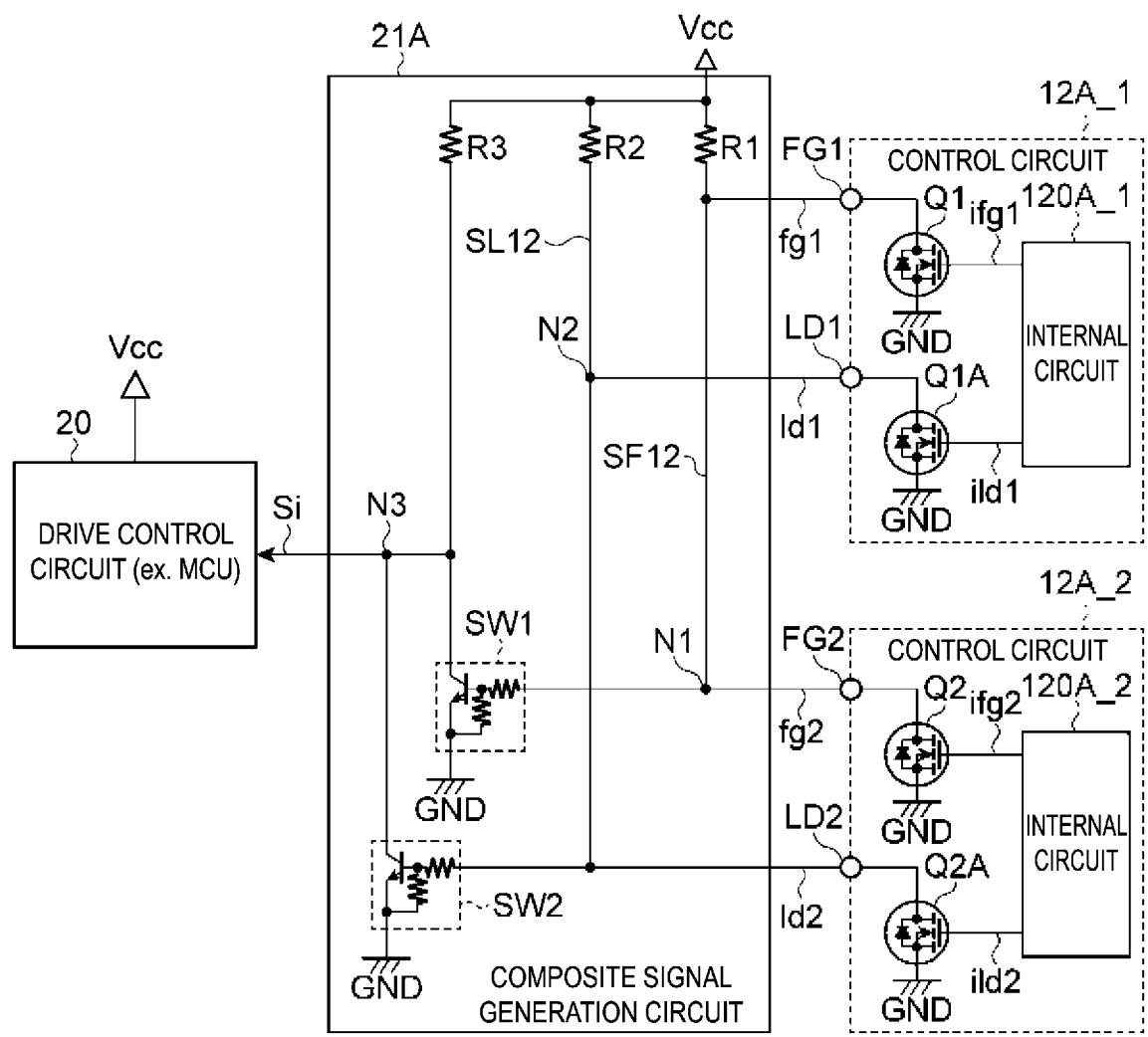
FIG. 10 is a diagram illustrating a configuration of a composite signal generation circuit and peripheral circuits of the composite signal generation circuit according to the second embodiment.

FIG. 10 is a diagram illustrating a configuration of a composite signal generation circuit 21A and peripheral circuits of the composite signal generation circuit 21A according to the second embodiment.

Further, in FIG. 10, only the configuration of the surroundings of the composite signal generation circuit 21A is illustrated for convenience of description.

The control circuit 12A_1 and the control circuit 12A_2 include internal circuits 120A_1 and 120A_2 to achieve functions as the control circuits 12A_1 and 12A_2, respectively, and a plurality of external terminals for performing input and output of signals between the internal circuits 120A_1 and 120A_2 and the outside (the drive control circuit 20 in the present embodiment).

The internal circuits 120A_1 and 120A_2 include the same functions as the internal circuits 120_1 and 120_2 according to the first embodiment as well as functions of generating the lock detection signals ld1 and ld2 based on position detection signals, respectively.

The control circuits 12A_1 and 12A_2 further include LD signal output terminals for outputting the lock detection signals ld1 and ld2, respectively, in addition to the same external terminals as the control circuits 12_1 and 12_2 according to the first embodiment.

Further, in the following description, the LD signal output terminals outputting the lock detection signals ld1 and ld2 will be referred to as a terminal LD1 and a terminal LD2, respectively. In addition, for convenience in explanation, only the terminals FG1 and FG2 and the terminals LD1 and LD2 are illustrated in FIG. 10 as external terminals of the control circuits 12A_1 and 12A_2, respectively.

The control circuit 12A_1 includes an output transistor Q1A for outputting, from the terminal LD1, the first lock detection signal ld1 generated by the internal circuit 120A_1 based on the position detection signal from the position detector 41_1 as illustrated in FIG. 10. The output transistor Q1A is connected between the terminal LD1 and the ground voltage GND as a first fixed potential.

The control circuit 12A_2 includes an output transistor Q2A for outputting, from the terminal LD2, the second lock detection signal ld2 generated by the internal circuit 120A_2 based on the position detection signal from the position detector 41_2. The output transistor Q2A is connected between the terminal LD2 and the ground voltage GND as the first fixed potential. The output transistors Q1A and Q2A are, for example, FETs.

The composite signal generation circuit 21A receives inputs of the signals fg1 and fg2 and the lock detection signals ld1 and ld2 generated by the control circuits 12A_1 and 12A_2, respectively, and generates the composite signal Si by combining the input signals. For example, the composite signal generation circuit 21A generates the composite signal Si based on the logical AND of the signal fg1 and the signal fg2 and the logical AND of the lock detection signals ld1 and ld2.

In the second embodiment, the composite signal generation circuit 21A is formed on the same circuit board as general-purpose ICs as the control circuits 12A_1 and 12A_2, and an MCU as the drive control circuit 20 mounted, for example, similarly to the composite signal generation circuit 21 according to the first embodiment.

The composite signal generation circuit 21A includes, for example, loads R1 to R3 and switch elements SW1 and SW2. The loads R1 to R3 are, for example, resistors. The load R1 is connected between a node (a connection point) N1 and the power supply voltage Vcc. To the node N1, the terminal FG1 of the control circuit 12A_1 and the terminal FG2 of the control circuit 12A_2 are commonly connected. The load R2 is connected between a node (a connection point) N2 and the power supply voltage Vcc. To the node N2, the terminal LD1 of the control circuit 12A_1 and the terminal LD2 of the control circuit 12A_2 are commonly connected. The load R3 includes one end connected to the power supply voltage Vcc.

The switch element SW1 is connected between the ground voltage GND and the other end of the load R3 and is controlled to on or off based on a voltage of the node N1. The switch element SW1 includes, for example, a transistor (a bipolar transistor). In the transistor as the switch element SW1, an emitter electrode is connected to the ground voltage GND, and a collector electrode is connected to the other end (node N3) of the load R3.

The switch element SW2 is connected between the ground voltage GND and the other end of the load R3 and is controlled to on or off based on a voltage of the node N2. The switch element SW2 includes, for example, a transistor (a bipolar transistor). In the transistor as the switch element SW2, an emitter electrode is connected to the ground voltage GND, and a collector electrode is connected to the other end (node N3) of the load R3.

Further, in the transistor constituting the switch elements SW1 and SW2, resistors may be connected between the emitter electrodes and the base electrodes, or resistors may be connected between the base electrodes and the nodes N1 and N2 as illustrated in FIG. 10.

In the composite signal generation circuit 21A, the node N3 is an output terminal, and a voltage of the node N3 is input to the drive control circuit 20 as a composite signal Si.

FIG. 11 is a table showing a relationship between states of the fan 100A and aspects of the composite signal Si according to the second embodiment.

Figure 12:
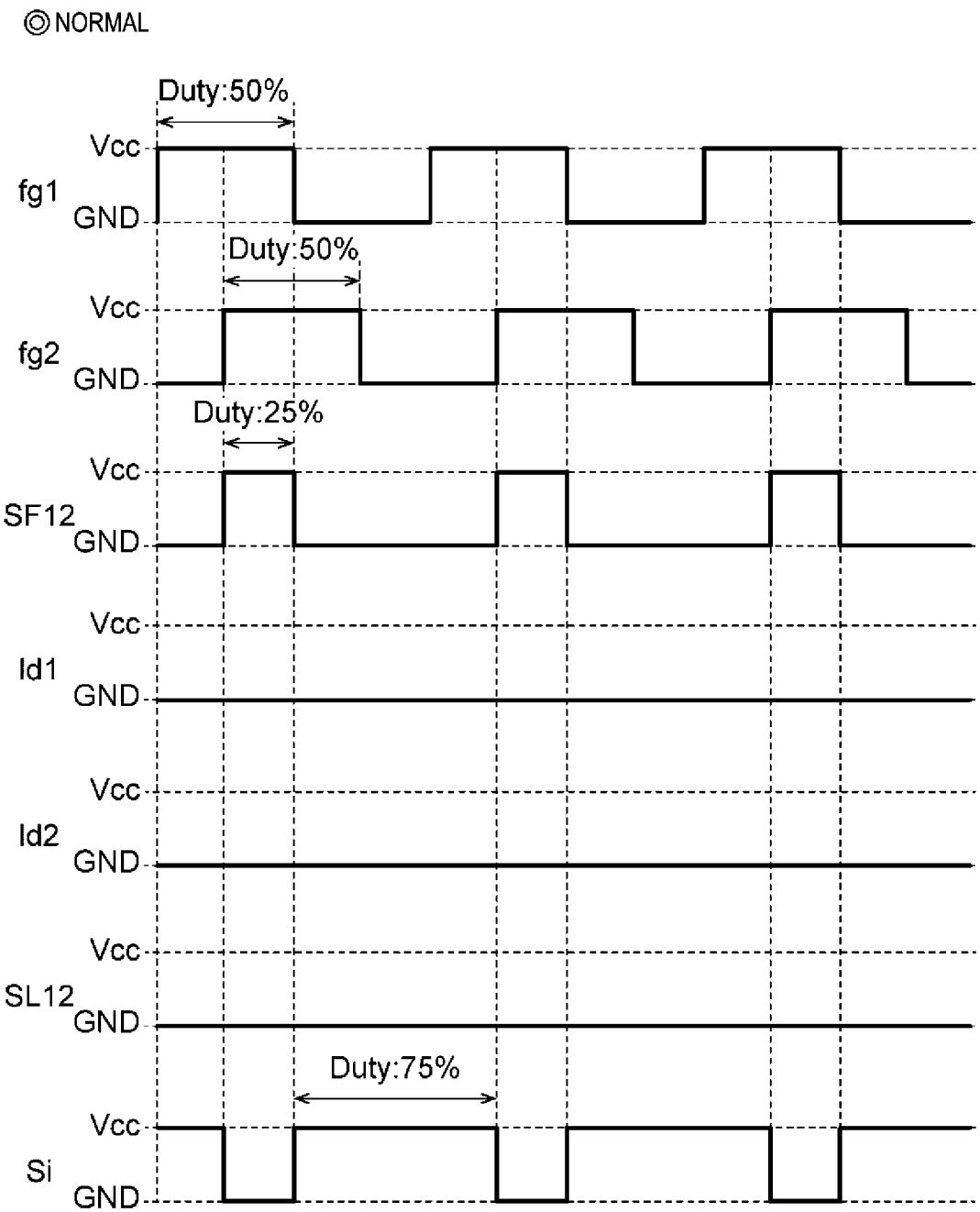
FIG. 12 is a timing chart showing signals fg1 and fg2, lock detection signals ld1 and ld2, and the composite signal Si when the motor is rotating normally in the fan according to the second embodiment.

FIG. 12 is a timing chart showing the signals fg1 and fg2, a signal SF12, the lock detection signals ld1 and ld2, a signal SL12, and the composite signal Si when the motor 50 is rotating normally in the fan 100A according to the second embodiment.

First, a case of the fan 100A being driven normally, that is, a case of the motor 50 in normal rotation will be considered. In this case, the signals fg1 and fg2 (binary signals) having a duty ratio of 50% are output from the terminals FG1 and FG2 of the control circuits 12A_1 and 12A_2, respectively, as illustrated in FIG. 12. In addition, the signal fg1 and the signal fg2 have a phase difference of 90 degrees as described above. Thus, the voltage (the signal SF12) of the node N1 is a binary signal having a duty ratio of 25% as illustrated in FIG. 12.

In addition, when the motor 50 is rotating normally, the internal circuits 120A_1 and 120A_2 of the control circuits 12A_1 and 12A_2 output signals ild1 and ild2 indicating whether the motor 50 is in the locked state as a high level (the power supply voltage Vcc), respectively. As a result, the lock detection signals ld1 and ld2 output from the terminals LD1 and LD2 are at a low level (the ground voltage GND), respectively, and the voltage (the signal SL12) of the node N2 is at a low level as illustrated in FIG. 12.

At this time, the switch element SW2 is not on because the node N2 as an input signal is at the low level. On the other hand, the switch element SW1 receives an input of the binary signal having the duty ratio of 25% as an input signal from the node N1 and thus is controlled to on or off according to the duty ratio of the input signal. Thus, when the motor 50 is rotating normally, the voltage of the node N3, that is, the composite signal Si, is a binary signal having a duty ratio of 75%, as illustrated in FIG. 12.

Next, a case of occurrence of a failure in either the terminal FG1 or FG2 of the motor drive circuits 10A_1 and 10A_2, respectively, being in an open state (an open-circuit failure) will be considered. Here, an example of the output transistor Q1 connected to the terminal FG1 of the control circuit 12A_1 in the motor drive circuit 10A_1 having a failure and the terminal FG1 being in an open-circuit failure will be described.

Figure 13:
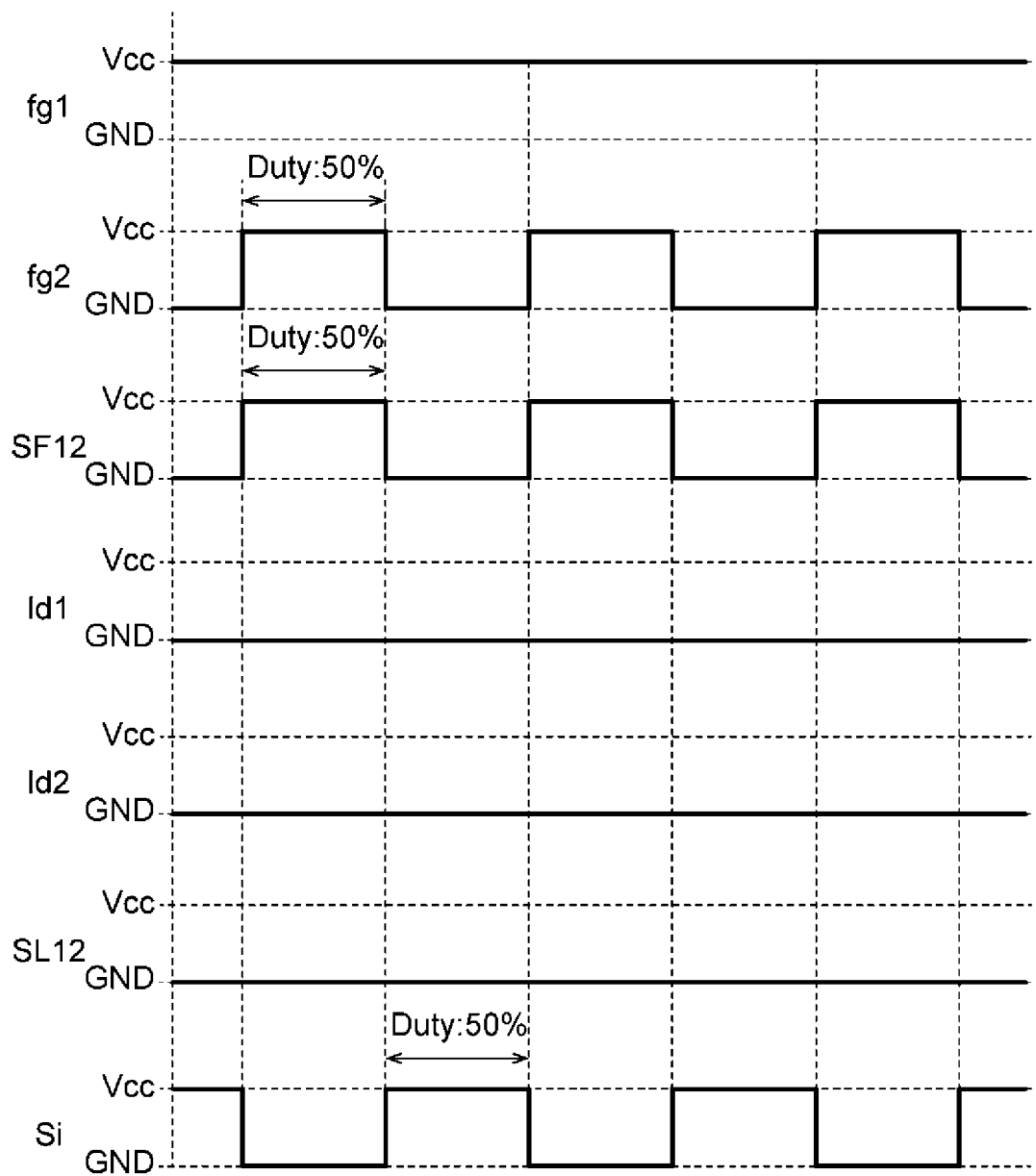
FIG. 13 is a timing chart showing the signals fg1 and fg2, the lock detection signals ld1 and ld2, and the composite signal Si when an open-circuit failure occurs in a terminal FG1 of a motor drive circuit 10A_1 of the fan according to the second embodiment.

FIG. 13 is a timing chart showing the signals fg1 and fg2, the signal SF12, the lock detection signals ld1 and ld2, the signal SL12, and the composite signal Si when an open-circuit failure occurs in the terminal FG1 of the motor drive circuit 10A_1 of the fan 100A according to the second embodiment.

When the terminal FG1 is in the open state, the terminal FG1 is in a high impedance state (Hi-Z) as illustrated in FIG. 13. Meanwhile, because the motor drive circuit 10A_2 is operating normally, the signal fg2 output from the terminal FG2 is a binary signal having a duty ratio of 50%. Thus, the signal SF12 output from the node N1 is a binary signal having a duty ratio of 50% as illustrated in FIG. 13.

In addition, the aspect of the lock detection signal ld1 output from the terminal LD1 of the motor drive circuit 10A_1 depends on the details of the failure of the motor drive circuit 10A_1. For example, when only the output transistor Q1 of the control circuit 12A_1 fails, the internal circuit 120A_1 outputs a high-level signal ild1, and thus the lock detection signal ld1 output from the terminal LD1 is at a low level as described above.

On the other hand, when the internal circuit 120A_1 of the control circuit 12A_1 fails and the signal ild1 is at a low level, the terminal LD1 is in a high impedance state (Hi-Z).

In this way, when the terminal FG1 is in the open state, the terminal LD1 is at a low level or in a high impedance state (see FIG. 11).

Meanwhile, because the motor drive circuit 10A_2 is operating normally, the lock detection signal ld2 output from the terminal LD2 is at a low level (the ground voltage GND), similarly to the case of the motor 50 in normal rotation. As a result, the signal SL12 output from the node N2 is at a low level, regardless of the state of the terminal LD1 as illustrated in FIG. 13.

At this time, the switch element SW2 is not on because the node N2 as an input signal is at the low level. On the other hand, the switch element SW1 receives an input of the binary signal having a duty ratio of 50% as the input signal from the node N1, and thus is controlled to ON or OFF according to the duty ratio of the input signal.

As a result, when the terminal FG1 of the motor drive circuit 10A_1 has an open-circuit failure and the motor drive circuit 10A_2 is normal, the composite signal Si becomes a binary signal having a duty ratio of 50% as illustrated in FIG. 13.

Further, the composite signal Si becomes a binary signal having a duty ratio of 50% also when the terminal FG2 of the motor drive circuit 10A_2 has an open-circuit failure and the motor drive circuit 10A_1 is normal (see FIG. 11).

Next, a case of occurrence of a failure in either the terminal FG1 or FG2 of the motor drive circuits 10A_1 and 10A_2, respectively, being in a short-circuit state (short-circuit failure) will be considered. Here, an example of the output transistor Q1 connected to the terminal FG1 of the control circuit 12A_1 in the motor drive circuit 10A_1 having a failure and the emitter electrode and the collector electrode of the output transistor Q1 being short-circuited will be described.

Figure 14:
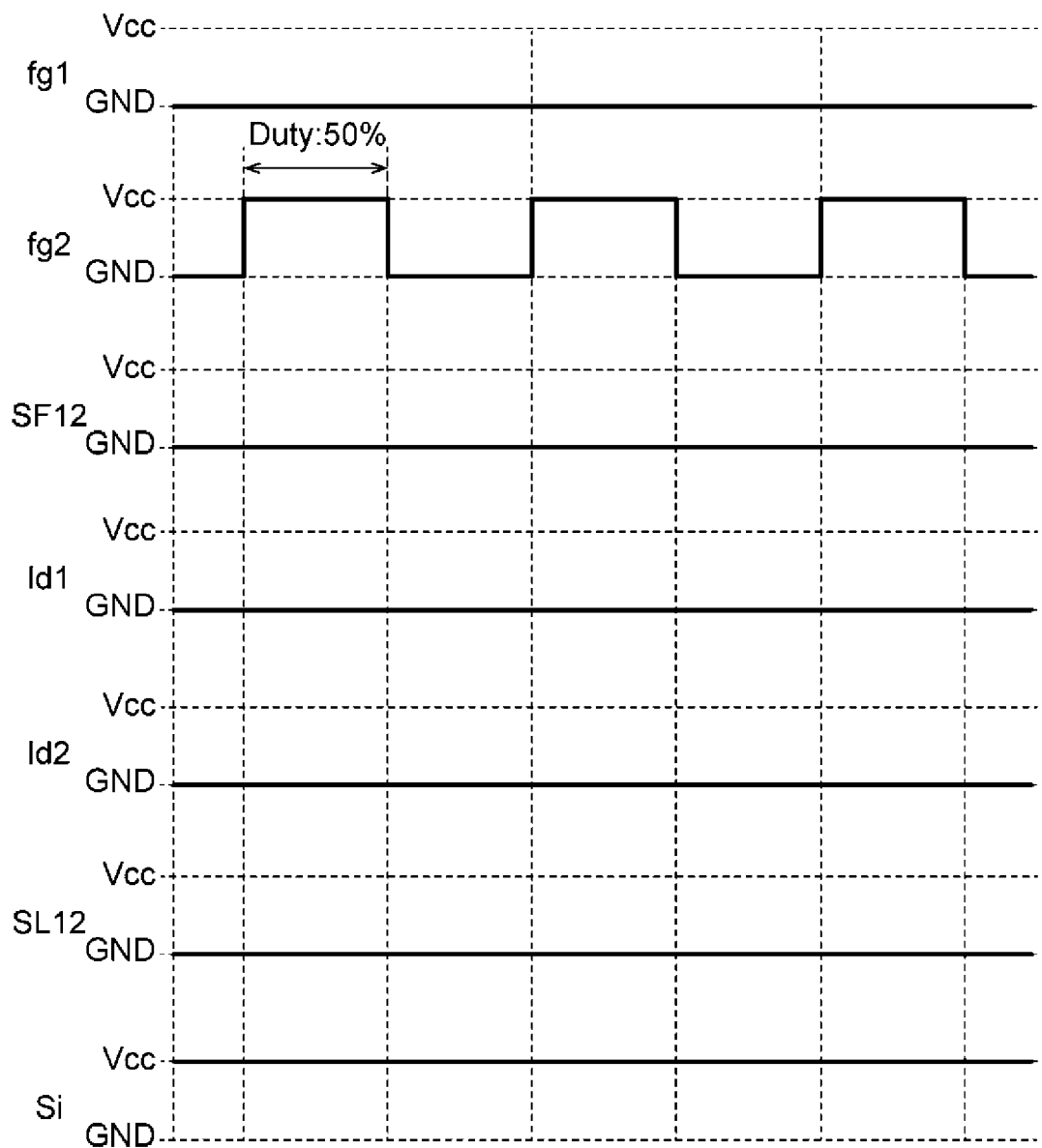
FIG. 14 is a timing chart showing the signals fg1 and fg2, the lock detection signals ld1 and ld2, and the composite signal Si when a short-circuit failure occurs in the terminal FG1 of the motor drive circuit 10A_1 of the fan according to the second embodiment.

FIG. 14 is a timing chart showing the signals fg1 and fg2, the signal SF12, the lock detection signals ld1 and ld2, the signal SL12, and the composite signal Si when a short-circuit failure occurs in the terminal FG1 of the motor drive circuit 10A_1 of the fan 100A according to the second embodiment.

When the terminal FG1 is in the short-circuit state, the voltage (the signal fg1) of the terminal FG1 becomes the ground voltage GND (a low level) as illustrated in FIG. 14. Meanwhile, although the motor drive circuit 10A_2 attempts to output the signal fg2 having a duty ratio of 50% from the terminal FG2 because the motor drive circuit 10A_2 is normally operating, the signal SF12 output from the node N1 has the ground voltage GND (a low level) due to the node N1 being short-circuited via the terminal FG1.

In addition, because the aspect of the lock detection signal ld1 output from the terminal LD1 of the motor drive circuit 10A_1 depends on the details of the failure of the motor drive circuit 10A_1 as described above, the terminal LD1 is at a low level or in a high impedance state (see FIG. 11).

Meanwhile, because the motor drive circuit 10A_2 is operating normally, the lock detection signal ld2 output from the terminal LD2 is at a low level (the ground voltage GND), similarly to the case of the motor 50 in normal rotation. As a result, the signal SL12 output from the node N2 is at a low level, regardless of the state of the terminal LD1 as illustrated in FIG. 14.

At this time, the switch element SW2 is not on because the signal SL12 output from the node N2 is at the low level. Similarly, the switch element SW1 is not on because the signal SF12 output from the node N1 is at the low level.

As a result, when the terminal FG1 of the motor drive circuit 10A_1 has an short-circuit failure and the motor drive circuit 10A_2 is normal, the composite signal Si is fixed at a high level (the power supply voltage Vcc) as illustrated in FIG. 14. Further, the composite signal Si is fixed at the high level (the power supply voltage Vcc) also when the terminal FG2 of the motor drive circuit 10A_2 has a short-circuit failure and the motor drive circuit 10A_1 is normal (see FIG. 11).

Next, a case of the motor 50 being in a locked state will be considered.

Figure 15:
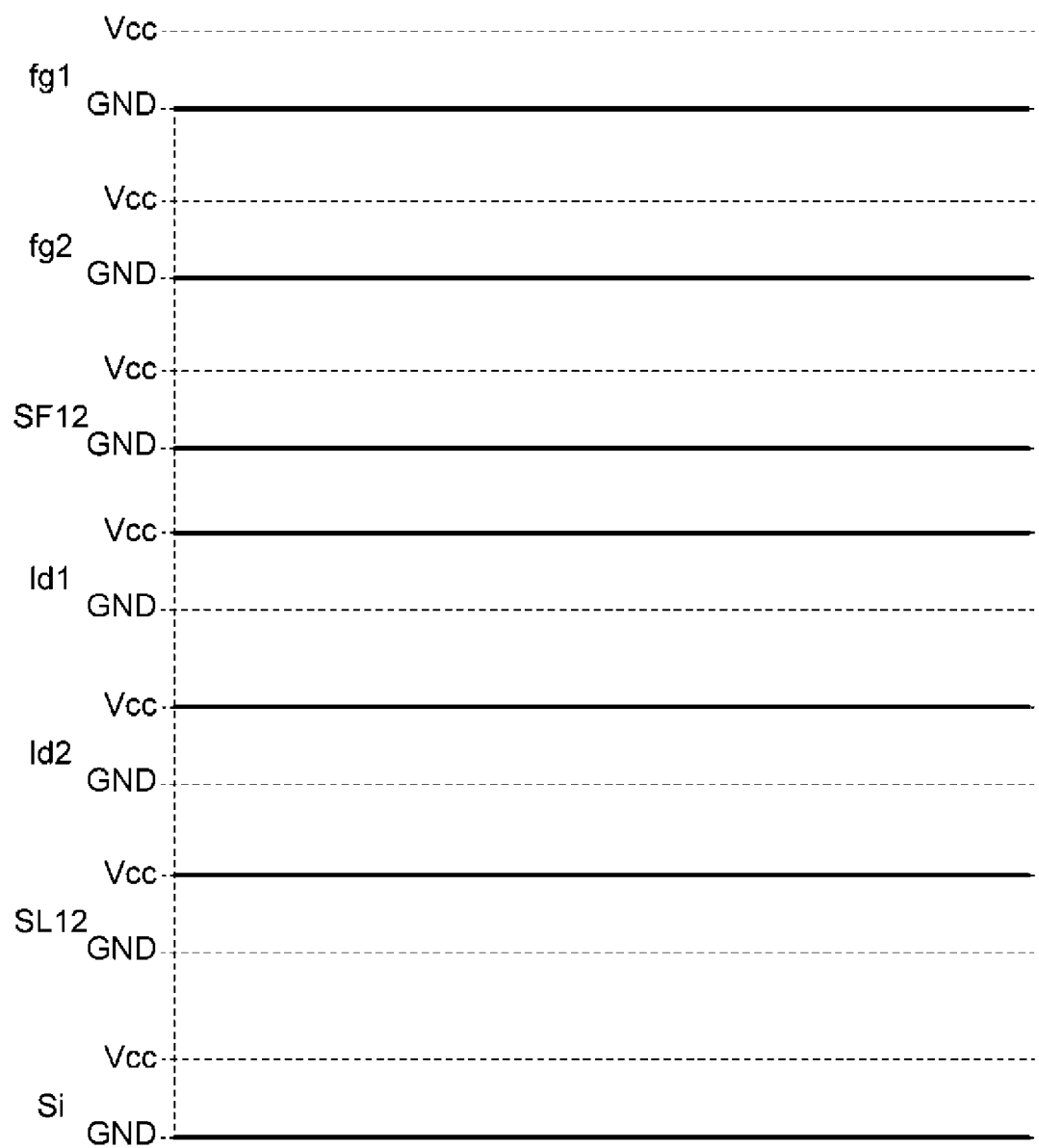
FIG. 15 is a timing chart showing the signals fg1 and fg2, and the composite signal Si when the motor is in a locked state in the fan according to the second embodiment.

FIG. 15 is a timing chart showing the signals fg1 and fg2, the signal SF12, the lock detection signals ld1 and ld2, the signal SL12, and the composite signal Si when the motor 50 is in a locked state in the fan 100A according to the second embodiment.

When the motor 50 is in a locked state, signals ifg1 and ifg2 output from the internal circuits 120A_1 and 120A_2, respectively, are fixed to either a low level (the ground voltage GND) or a high level (the power supply voltage Vcc).

For example, when the motor 50 is in the locked state and both the signals ifg1 and ifg2 output from the internal circuits 120A_1 and 120A_2 are fixed to a high level, both the signals fg1 and fg2 are at a low level, respectively, and the signal SF12 output from the node N1 is at a low level as illustrated in FIG. 15.

Meanwhile, the internal circuits 120A_1 and 120A_2 determine that the motor 50 is in the locked state and output the low-level signals ild1 and ild2, respectively. As a result, both the signals ld1 and ld2 are at the high level, the signal SL12 output from the node N2 is at the high level (the power supply voltage Vcc), and thus the switch element SW2 is turned on as illustrated in FIG. 15. As a result, regardless of whether the switch element SW1 is on, the composite signal Si is at a low level (see FIG. 11). In this way, when the motor 50 is in the locked state, the composite signal Si is at a low level.

Because the waveform of the composite signal Si changes in accordance with a drive state of the fan 100A (the motor 50 and the motor drive circuits 10A_1 and 10A_2) as described above, a drive state of the fan 100A can be determined.

In the present embodiment, the drive control circuit 20 determines a drive state of the fan 100A based on the composite signal Si generated by the composite signal generation circuit 21A.

Figure 16:
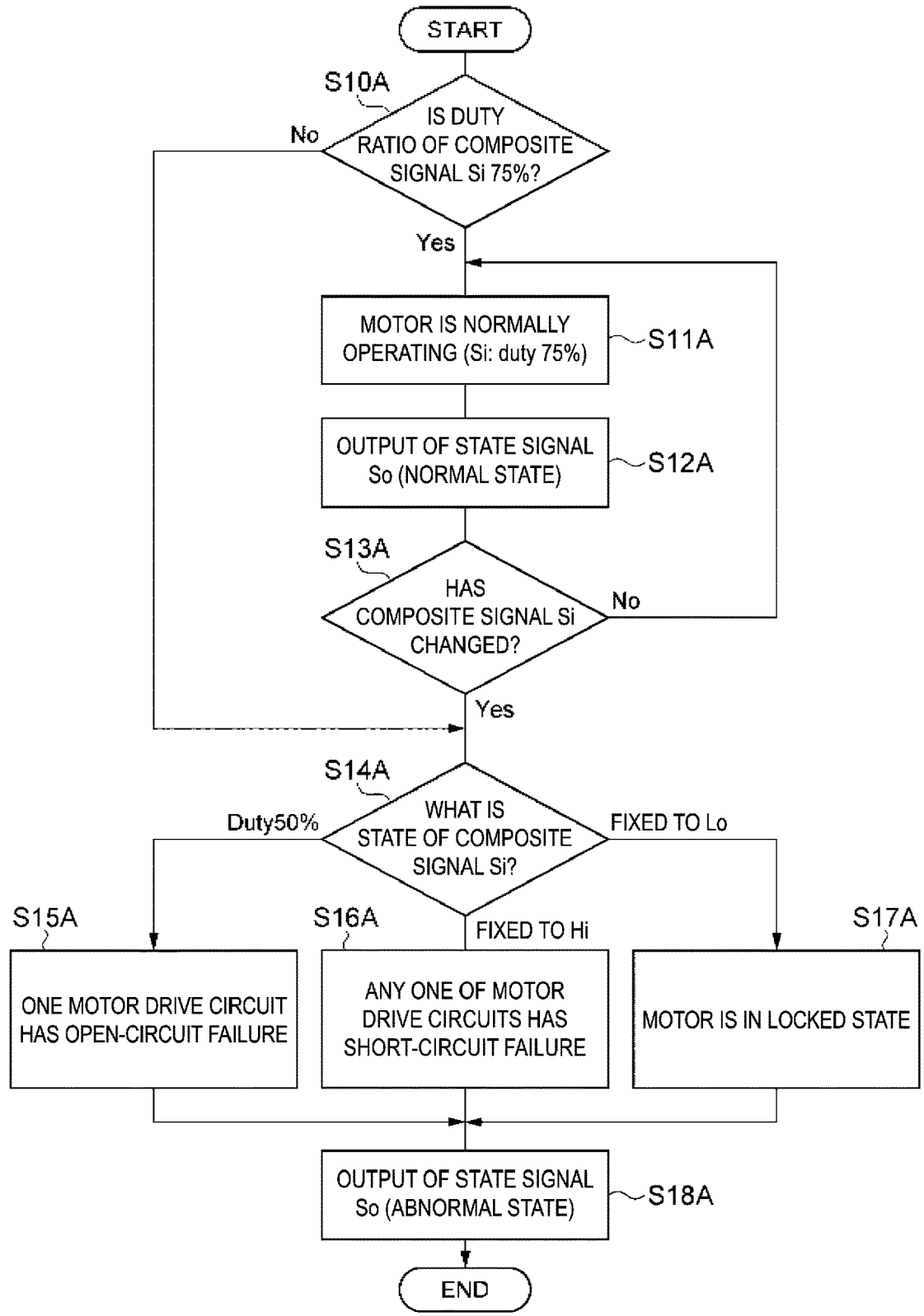
FIG. 16 is a flowchart illustrating a flow of drive state determination processing for the fan performed by a motor drive control device according to the second embodiment.

FIG. 16 is a flowchart illustrating a flow of drive state determination processing for the fan 100A by the motor drive control device 1A according to the second embodiment.

First, the drive control circuit 20 determines whether the duty ratio of the composite signal Si is 75% (step S10A) as illustrated in FIG. 16. If the duty ratio of the composite signal Si is 75% (step S10A: Yes), the drive control circuit 20 determines that the fan 100A (the motor 50 and the motor drive circuits 10A_1 and 10A_2) is being driven normally (step S11A). Then, the drive control circuit 20 outputs a state signal So indicating that the fan 100A (the motor 50) is being driven normally to the upper device 500 (step S12A). For example, the drive control circuit 20 outputs an FG signal having a duty ratio of 50% at a frequency according to the actual number of rotations of the motor 50 as the state signal So to the upper device 500 based on the composite signal Si generated from the signals fg1 and fg2 and the signals ld1 and ld2.

Next, the drive control circuit 20 determines whether the duty ratio of the composite signal Si has been changed (step S13A). If the duty ratio of the composite signal Si has not been changed (step S13A: No), the fan 100A (the motor 50 and the motor drive circuits 10A_1 and 10A_2) is determined to be continuously driven normally (step S11A), and then the state signal So indicating that the fan 100A is operating normally is output to the upper device 500 (step S12A).

On the other hand, if the duty ratio of the composite signal Si has been changed (step S13A: Yes) or if the duty ratio of the composite signal Si is not 75% in step S10A (step S10A: No), the drive control circuit 20 distinguishes the waveform of the composite signal Si (step S14A).

Specifically, the drive control circuit 20 determines, if the duty ratio of the composite signal Si is 50%, that either the motor drive circuit 10A_1 or 10A_2 has an open-circuit failure (step S15A; see FIG. 13). In addition, the drive control circuit 20 determines, if the composite signal Si is at a low level (the ground voltage GND), that the motor 50 is in a locked state (step S17A; see FIG. 15). In addition, if the composite signal Si is at a high level (the power supply voltage Vcc), the drive control circuit 20 determines that either the motor drive circuit 10A_1 or 10A_2 has a short-circuit failure (see step S16A; see FIG. 14).

Thereafter, the drive control circuit 20 generates the state signal So indicating the state of the fan 100A based on the determination results of steps S15A, S16A, and S17A, and outputs the state signal So to the upper device 500 (step S18A). For example, the drive control circuit 20 outputs, if either the motor drive circuit 10A_1 or 10A_2 is the open-circuit failure or the short-circuit failure, the state signal So as the ground voltage GND (a low (Lo) level) to the upper device 500 and outputs, if the motor 50 is in the locked state, the state signal So as the power supply voltage Vcc (a high (Hi) level) to the upper device 500. This allows the upper device 500 to ascertain the drive state of the fan 100A in more detail.

In the motor drive control device 1A according to the second embodiment described above, the motor drive circuits 10A_1 and 10A_2 output the lock detection signals ld1 and ld2 being binary signals indicating whether the motor 50 is locked, respectively, and the composite signal generation circuit 21A combines the signals fg1 and fg2 and the lock detection signals ld1 and ld2 to generate the composite signal Si.

According to this configuration, not only the two FG signals fg1 and fg2 but also the two lock detection signals ld1 and ld2 are further combined to generate the composite signal Si, and thus, by determining the waveform of the composite signal Si, the drive state of the fan 100A (the motor 50 and the motor drive circuits 10A_1 and 10A_2) can be determined more specifically.

Specifically, by generating the composite signal Si based on the logical AND of the logical AND of the signal fg1 and the signal fg2 and the logical AND of the lock detection signal ld1 and the lock detection signal ld2, whether the case of either the motor drive circuit 10A_1 or 10A_2 being the open-circuit failure, the case of either the motor drive circuit 10A_1 or 10A_2 being the short-circuit failure, or the state of the motor 50 being locked can be determined correctly.

For example, if the composite signal Si is a binary signal having the duty ratio (e.g., 75%) according to the phase difference between the signal fg1 and the signal fg2, the motor 50 can be determined to be driven normally. Further, if the composite signal Si has a predetermined duty ratio, that is, the same duty ratio as the signals fg1 and fg2 (e.g., 50%), either the motor drive circuit 10A_1 or 10A_2 (the terminals FG1 and FG2 for outputting the signals fg1 and fg2, respectively) can be determined to have an open-circuit failure. Furthermore, if the composite signal Si is fixed at the power supply voltage Vcc (a high level), either the motor drive circuit 10A_1 or 10A_2 (the terminals FG1 and FG2) can be determined to have a short-circuit failure. Furthermore, if the composite signal Si is fixed at the ground voltage GND (a low level), the motor 50 can be determined to be in the locked state.

The motor drive control device 1A according to the second embodiment can notify an outside device (e.g., the upper device 500) of the more accurate drive state of the fan 100A (the motor 50) as described above. In addition, because the motor drive control device 1A includes the composite signal generation circuit 21A, the number of signal lines output from the motor drive circuits 10A_1 and 10A_2 to the drive control circuit 20 can be cut and signal processing performed by the drive control circuit 20 can be reduced.

Expansion of First and Second Embodiments

Although the invention made by the present inventors has been specifically described above based on the first and second embodiments, the present invention is not limited to the first and second embodiments, and it is needless to say that various modifications can be made without departing from the gist of the present invention.

For example, although the first and second embodiments have exemplified the case of the motor drive control devices 1 and 1A being applied to the fan system including a single-phase brushless motor provided with the coils 80_1 and 80_2 of the two systems, the embodiment is not limited to the first and second embodiments. For example, the motor drive control devices 1 and 1A may be applied to a fan system including two single-phase brushless motors provided with a coil of one system.

Figure 17:
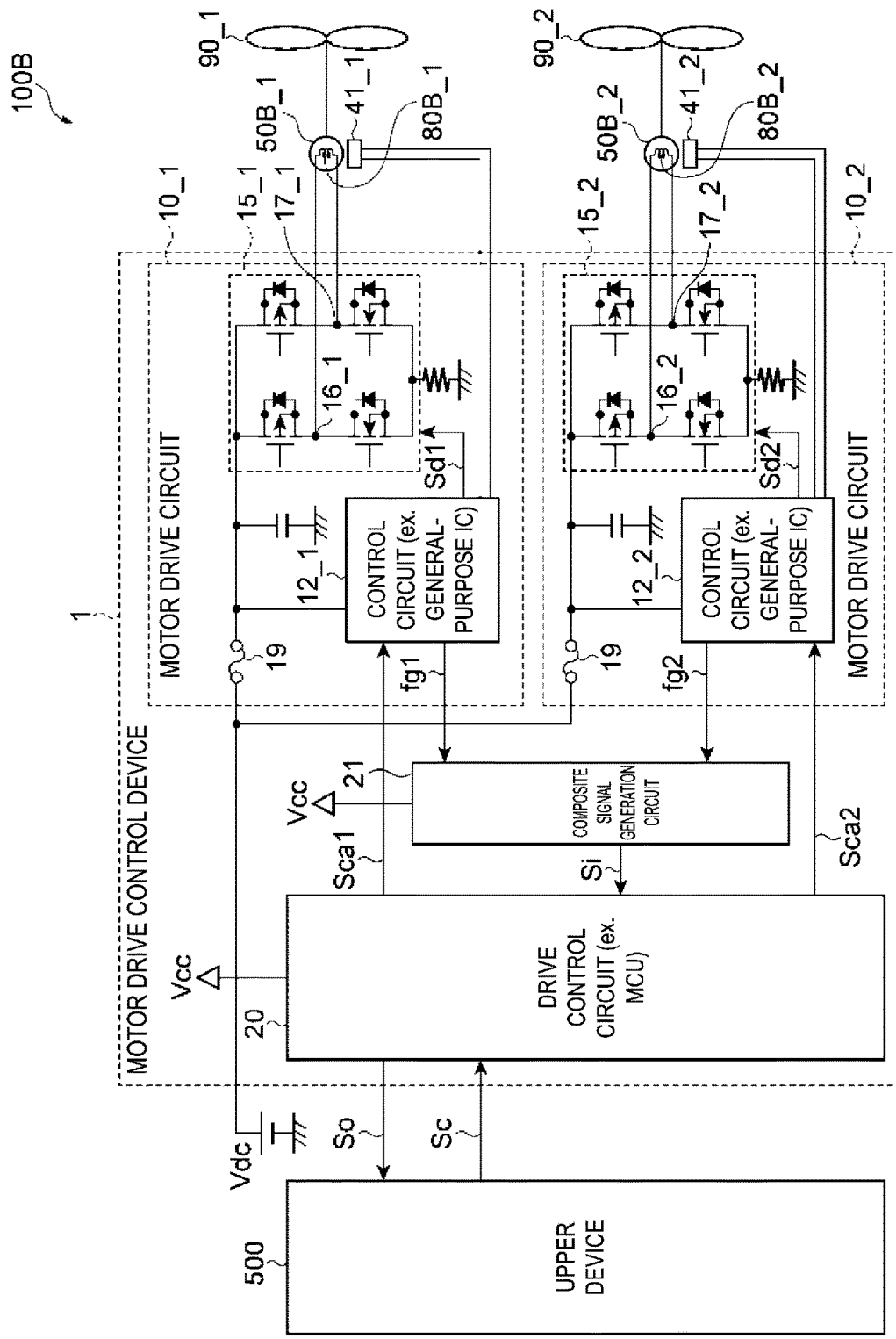
FIG. 17 is a diagram illustrating a configuration of a fan according to another embodiment of the present invention.

For example, the motor drive control device 1 may be applied to a fan 100B including a system configuration for motors 50B_1 and 50B_2 each having a coil of one system to individually rotate two impellers 90_1 and 90_2 as illustrated in FIG. 17. In this case, the drive control circuit 20 generates drive control signals Sca1 and Sca2 to make phases of the signals fg1 and fg2 output from the motor drive circuits 10_1 and 10_2 (the control circuits 12_1 and 12_2), respectively, different from each other (e.g., a phase difference of 90 degrees). The motor drive circuit 10_1 controls energization of the coil 80B_1 of one motor 50B_1 based on the drive control signal Sca1, and the motor drive circuit 10_2 controls energization of the coil 80B_2 of the other motor 50B_2 based on the drive control signal Sca2.

According to this configuration, the drive state of the fan 100B (the motors 50B_1 and 50B_2) can be determined, and the upper device 500 can be notified of the determined drive state, similarly to the fan 100 according to the first embodiment.

Figure 18:
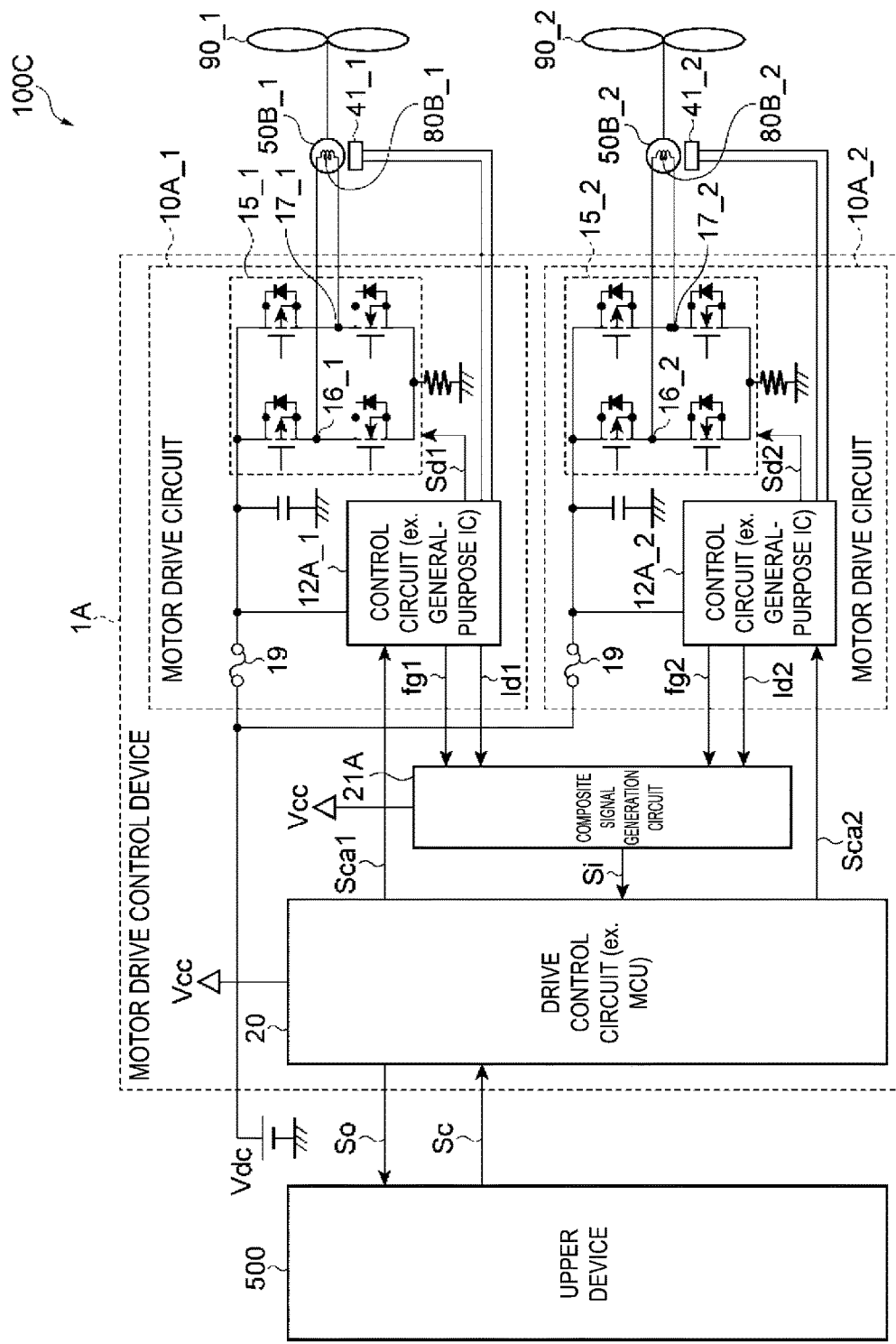
FIG. 18 is a diagram illustrating a configuration of a fan according to yet another embodiment of the present invention.

In addition, for example, a motor drive control device 1A may be applied to a fan 100C including a system configuration for motors 50B_1 and 50B_2 each having a coil of one system to individually rotate two impellers 90_1 and 90_2 as illustrated in FIG. 18. In this case, the drive control circuit 20 generates drive control signals Sca1 and Sca2 to make phases of the signals fg1 and fg2 output from the motor drive circuits 10A_1 and 10A_2 (the control circuits 12A_1 and 12A_2), respectively, different from each other (e.g., a phase difference of 90 degrees). The motor drive circuit 10A_1 controls energization of the coil 80B_1 of one motor 50B_1 based on the drive control signal Sca1, and the motor drive circuit 10A_2 controls energization of the coil 80B_2 of the other motor 50B_2 based on the drive control signal Sca2.

According to this configuration, the drive state of the fan 100C (the motors 50B_1 and 50B_2) can be determined, and the upper device 500 can be notified of the determined drive state, similarly to the fan 100A according to the second embodiment.

In addition, although the motors 50, 50B_1 and 50B_2 are exemplified as being single-phase brushless motors in the above embodiments, the types and the number of phases of the motors 50, 50B_1, and 50B_2 are not limited to the above embodiments. The motors may be, for example, three-phase brushless motors.

In addition, the flowcharts in the first and second embodiments are examples for explaining operations, and the embodiments are not limited to these flowcharts. That is, the steps illustrated in each drawing of the flowcharts are specific examples, and the embodiments are not limited to these flowcharts. For example, the order of some processing operations may be partially changed, another processing may be inserted between individual processing operations, or some processing operations may be performed in parallel.

Third Embodiment

Figure 19:
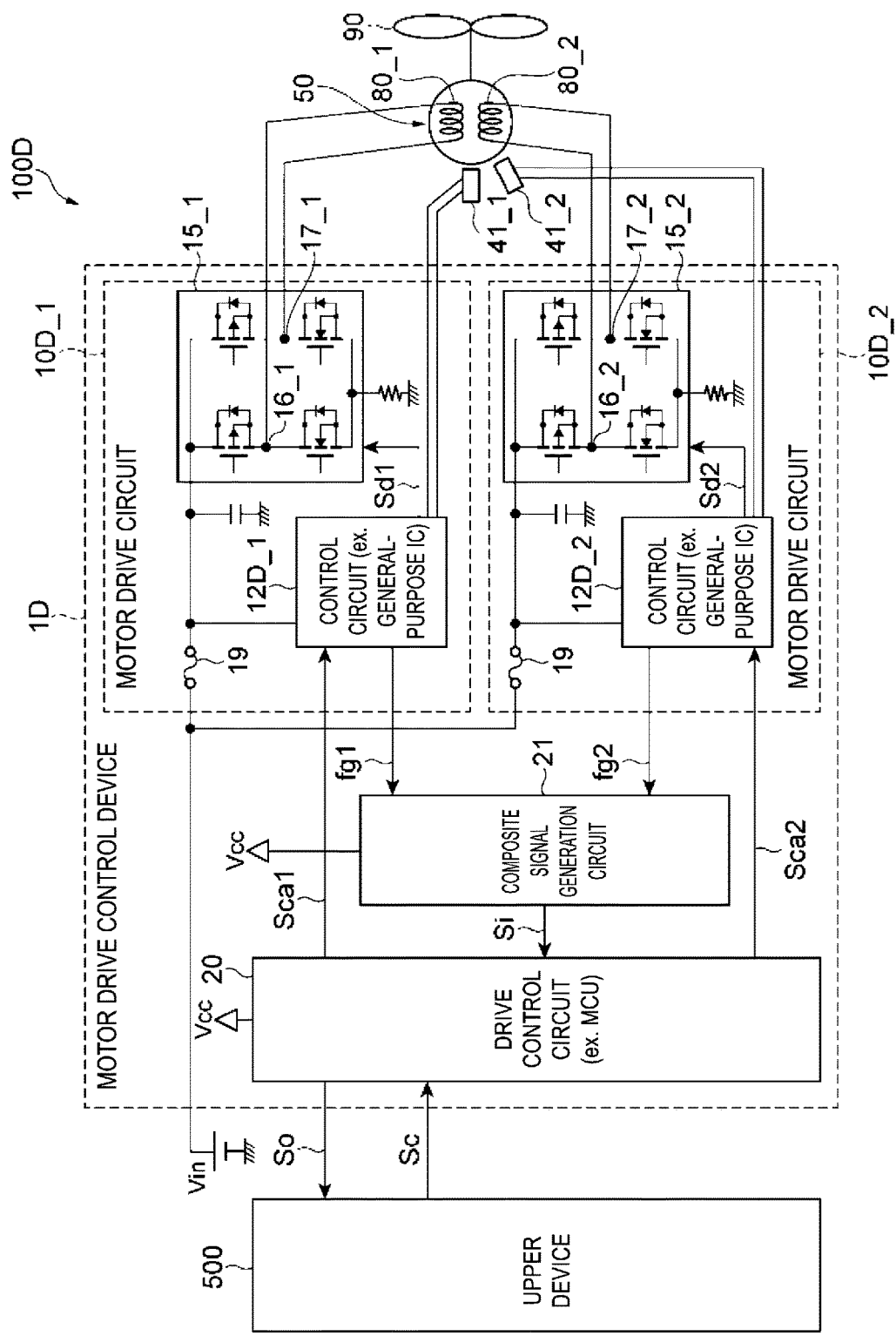
FIG. 19 is a block diagram illustrating a configuration of a fan according to a third embodiment.

FIG. 19 is a block diagram illustrating a configuration of a fan according to a third embodiment.

A fan (fan motor) 100D according to the third embodiment is a device generating airflow by rotating an impeller (bladed wheel). The fan 100D can be used as one of cooling devices discharging heat generated inside the device to the outside to cool the inside of the device and can be mounted on, for example, a machine tool or the like used in an environment with generation of oil mist, cutting chips, smoke, dust, and the like, in addition to an information processing device such as a server. The fan 100D is, for example, an axial fan.

The fan 100D includes a motor 50, an impeller 90, position detectors 41_1 and 41_2, and a motor drive control device 1D as illustrated in FIG. 19.

In the present embodiment, the motor 50 is, for example, a single-phase brushless motor provided with coils 80_1 and 80_2 of two systems wound around teeth (not illustrated). The impeller 90 is configured to be rotatable by a rotation force of the motor 50. For example, the impeller 90 is connected to an output shaft (not illustrated) of the motor 50.

The motor drive control device 1D is a device used for controlling the rotation of the motor 50. The motor drive control device 1D rotates the motor 50 by periodically flowing a drive current into each of the single-phase coils 80_1 and 80_2 constituting the motor 50.

The position detectors 41_1 and 41_2 output a position detection signal in accordance with the position of a rotor of the motor 50. The position detectors 41_1 and 41_2 are Hall elements, for example. The Hall elements are elements for detecting a magnetic field by using the Hall effect and generate and output, as voltage values, Hall signals hp and hn having positive polarity as position detection signals of the magnet used in the rotor. The position detection signals will also be referred to as "position detection signals hp and hn" below.

Further, as an example, the Hall elements as the position detectors 41_1 and 41_2 are configured to be driven by DC voltages (power supply voltages) generated by the control circuits 12D_1 and 12D_2 in the present embodiment, and when the supply of the DC voltages is cut off, the output of the Hall signals (position detection signals) hp and hn is stopped and becomes lower to a level equivalent to the ground voltage GND.

The position detector 41_1 is disposed at a position corresponding to the coil 80_1 of the first system and outputs a position detection signal to a control circuit 12D_1 of a motor drive circuit 10D_1 to be described below. The position detector 41_2 is disposed at a position corresponding to the coil 80_2 of the second system and outputs a position detection signal to a control circuit 12D_2 of a motor drive circuit 10D_2 to be described below. The position detector 41_1 and the position detector 41_2 are disposed at relative positions having an electrical angle of $\pi/2$ (90 degrees), for example.

The motor drive control device 1D receives supply of a DC power supply voltages Vin and Vcc from the outside. Further, the power supply voltage Vcc (lower than or equal to the power supply voltage Vin) may be supplied externally or may be generated based on a power supply voltage Vin by a power supply circuit (not illustrated) such as a DC/DC converter separately provided in the motor drive control device 1D.

The motor drive control device 1D is connected to an upper device 500. The motor drive control device 1D receives an input of a speed command signal Sc output from the upper device 500. The motor drive control device 1D drives the motor 50 in accordance with the input speed command signal Sc. The motor drive control device 1D also outputs information regarding a state of the motor 50 to the upper device 500. For example, the motor drive control device 1D outputs a signal according to the actual number of rotations of the motor 50 and a signal indicating an abnormal state of the motor described below to the upper device 500 as a state signal So, as will be described below. As a result, the upper device 500 can ascertain the rotational state of the fan 100D and the presence or absence of an abnormality of the fan 100D.

Specifically, the motor drive control device 1D includes a plurality of motor drive circuits 10D, a drive control circuit 20 controlling operations of the plurality of motor drive circuits 10D, and a composite signal generation circuit 21.

The motor drive control device 1D according to the present embodiment includes, for example, motor drive circuits 10D_1 and 10D_2 of two systems as the plurality of motor drive circuits 10D.

The drive control circuit 20 is a circuit for controlling drive of the motor 50 via a first motor drive circuit 10D_1 and a second motor drive circuit 10D_2. For example, the drive control circuit 20 includes hardware elements such as a processor such as a CPU, various types of memories such as a ROM and a RAM, a timer (a counter), an A/D conversion circuit, an input and output I/F circuit, and a clock generation circuit and is constituted by a program processing device (for example, a micro controller (MCU)) including each of the constituent elements connected to each other via a bus or a dedicated line.

In the present embodiment, the drive control circuit 20 is packaged as one semiconductor device (an Integrated Circuit (IC)) but is not limited to this form.

The drive control circuit 20 generates a drive control signal Sca for controlling a rotational speed of the motor 50 based on the speed command signal Sc and outputs the drive control signal Sca to each of the motor drive circuits 10D. Specifically, the drive control circuit 20 generates drive control signals Sca1 and Sca2 based on the speed command signal Sc input from the upper device 500 and outputs the drive control signals to each of the motor drive circuits 10D_1 and 10D_2. Further, the drive control circuit 20 may output one drive control signal and split the drive control signal into two lines to supply the drive control signal to the motor drive circuits 10D_1 and 10D_2. In this case, a switch configured to make the drive control signals invalid by grounding each of the drive control signals to be supplied to the motor drive circuits 10D_1 and 10D_2 may be provided.

Here, the speed command signal Sc is a signal indicating a target number of rotations (a target rotational speed) of the motor 50 and is, for example, a pulse width modulation (PWM) signal having a duty ratio corresponding to the target number of rotations of the motor. Further, the speed command signal Sc may be, for example, a signal in another format, such as a PFM signal with a cycle corresponding to the target number of rotations.

The drive control signals Sca1 and Sca2 are signals indicating a target number of rotations (a target rotational speed) of the motor 50, similar to the speed command signal Sc and are, for example, PWM signals having a duty ratio corresponding to the target number of rotations of the motor.

In addition, the drive control circuit 20 has a function of determining whether there is an abnormality in the fan 100D (the motor 50 and the motor drive circuits 10D_1 and 10D_2) and outputting the determination result, in addition to a function of controlling drive of the motor 50 according to the speed command signal Sc from the upper device 500.

Specifically, the drive control circuit 20 determines, based on a composite signal Si generated by the composite signal generation circuit 21, whether a normal state indicating that the motor 50 is operating normally, an FG failure state indicating that either the motor drive circuit 10D_1 or 10D_2 cannot output the FG signals (the signals fg1 and fg2) normally, or a locked state indicating that the motor 50 becomes incapable of rotating and outputs the state signal So indicating the state of the fan 100D to the upper device 500. For example, when the fan 100D (the motor 50 and the motor drive circuits 10D_1 and 10D_2) is in the normal state, the drive control circuit 20 outputs an FG signal having a duty ratio of 50% as the state signal So in the cycle according to the actual number of rotations of the motor 50 based on the composite signal Si generated by the composite signal generation circuit 21. In the stopped state including the FG failure state and the locked state, the drive control circuit 20 outputs the power supply voltage Vcc (a high level) or the ground voltage GND (a low level) as the state signal So. This allows the upper device 500 to ascertain the drive state of the fan 100D using the cycle of the state signal So.

The plurality of motor drive circuits 10D are circuits performing control of energizing the motor 50 based on the drive control signal Sca and outputting FG signals having a cycle corresponding to the actual number of rotations of the motor 50. The FG signals output from each of the motor drive circuits 10D have a phase difference from each other. In the present embodiment, the motor drive circuit 10D_1 and the motor drive circuit 10D_2 as the plurality of motor drive circuits 10D have the same circuit configuration as each other, for example.

The motor drive circuits 10D_1 and 10D_2 control energizing the motor 50 based on the drive control signals Sca1 and Sca2 and output the FG signals (signals fg1 and fg2), respectively, having a cycle corresponding to the actual number of rotations of the motor 50.

As will be described below, the motor drive circuits 10D_1 and 10D_2 can stop operations of at least some of circuits inside the motor drive circuits 10D_1 and 10D_2 and transition to a power-saving state to fix the output of the FG signals (signals fg1 and fg2) to a high level.

The motor drive circuit 10D_1 includes the control circuit 12D_1 and an inverter circuit (energization circuit) 15_1 energizing the coil 80_1 according to control by the control circuit 12D_1. The motor drive circuit 10D_2 includes the control circuit 12D_2 and an inverter circuit (energization circuit) 15_2 energizing the coil 80_2 according to control by the control circuit 12D_2. Further, the control circuits 12D_1 and 12D_2 may include the inverter circuits 15_1 and 15_2, respectively.

Each of the motor drive circuits 10D_1 and 10D_2 includes a fuse 19 including one end connected to the power supply voltage Vin. In the motor drive circuits 10D_1 and 10D_2, the power supply voltage Vin is supplied to the inverter circuits 15_1 and 15_2 and the control circuits 12D_1 and 12D_2 of the motor drive circuits 10D_1 and 10D_2, respectively, via the fuses 19.

The inverter circuit 15_1 energizes the coil 80_1 of the motor 50 connected to output terminals 16_1 and 17_1 based on a drive signal Sd1 output from the control circuit 12D_1. The inverter circuit 15_2 controls energization of the coil 80_2 of the motor 50 connected to output terminals 16_2 and 17_2 based on a drive signal Sd2 output from the control circuit 12D_2, similarly to the inverter circuit 15_1. The drive signals Sd1 and Sd2 are, for example, pulse width modulation (PWM) signals.

As illustrated in FIG. 19, the inverter circuits 15_1 and 15_2 are, for example, H-bridge circuits and include two pairs of serial circuits of two switch elements (e.g., transistors) provided at both ends of the power supply voltage Vin. The connection points between the two switch elements in each serial circuit are the output terminals 16_1, 17_1, 16_2, and 17_2 for energizing the coils 80_1 and 80_2.

Each switch element constituting the inverter circuits 15_1 and 15_2 is controlled to on or off with the drive signals Sd1 and Sd2 output from the control circuits 12D_1 and 12D_2, respectively. Thus, the energization of the coil 80_1 connected to the output terminals 16_1 and 17_1 of the inverter circuit 15_1 and the energization of the coil 80_2 connected to the output terminals 16_2 and 17_2 of the inverter circuit 15_2 are controlled individually.

The control circuit 12D_1 sets an energization direction of the coil 80_1 based on the drive control signal Sca1 output from the drive control circuit 20 and the position detection signals hp and hn output from the position detector 41_1 to generate a drive signal Sd1 and control the inverter circuit 15_1. The control circuit 12D_2 sets an energization direction of the coil 80_2 based on the drive control signal Sca2 output from the drive control circuit 20 and the position detection signals hp and hn output from the position detector 41_2 to generate a drive signal Sd2 and control the inverter circuit 15_2.

For example, the control circuit 12D_1 controls the on and off operation of each switch element of the inverter circuit 15_1 by detecting the actual number of rotations of the motor 50 based on the position detection signals hp and hn, generating a PWM signal having an adjusted duty ratio to make the actual number of rotations of the motor 50 match the number of rotations specified by the drive control signal Sca1, and supplying the PWM signal to the inverter circuit 15_1 as a drive signal Sd1.

In addition, similarly, the control circuit 12D_2 generates a PWM signal to make the actual number of rotations of the motor 50 based on the position detection signals hp and hn match the number of rotations specified by the drive control signal Sca2 and supplies the PWM signal to the inverter circuit 15_2 as the drive signal Sd2.

Further, the control circuits 12D_1 and 12D_2 may generate PWM signals having duty ratios corresponding to the number of rotations specified by the drive control signals Sca1 and Sca2, regardless of the actual number of rotations, and may supply the PWM signal to the inverter circuits 15_1 and 15_2 as drive signals Sd1 and Sd2, respectively.

Furthermore, the control circuit 12D_1 generates a first FG signal (hereinafter referred to as a "signal fg1") corresponding to the actual number of rotations of the motor 50 based on the position detection signal from the position detector 41_1 and outputs the first FG signal. The control circuit 12D_2 generates a second FG signal (hereinafter referred to as a "signal fg2") corresponding to the actual number of rotations of the motor 50 based on the position detection signal from the position detector 41_2 and outputs the second FG signal.

The signals fg1 and fg2 are, for example, rectangular-wave shaped signals having a predetermined duty ratio and have different phases from each other. For example, the signals fg1 and fg2 have cycles corresponding to the actual number of rotations of the motor 50 and are binary signals (digital signals) generated to have a duty ratio of 50% when the number of rotations is constant.

The phase difference between the signal fg1 and the signal fg2 is set by a relative position of the electrical angle of the position detector 41_1 and the position detector 41_2 and is, for example, $\pi/2$ (90 degrees). Further, when the phase difference between the signal fg1 and the signal fg2 is $\pi/2$ (90 degrees), the phase difference may have a value close to π/2 (90 degrees) (e.g., π/2±10%).

The composite signal generation circuit 21 receives inputs of the signals fg1 and fg2 generated by the control circuits 12D_1 and 12D_2, respectively, and generates the composite signal Si by combining the input signals. For example, the composite signal generation circuit 21 generates the composite signal Si based on the logical AND of the signal fg1 and the signal fg2. The composite signal generation circuit 21 and the peripheral circuits of the composite signal generation circuit 21 will be described below in detail.

Figure 20:
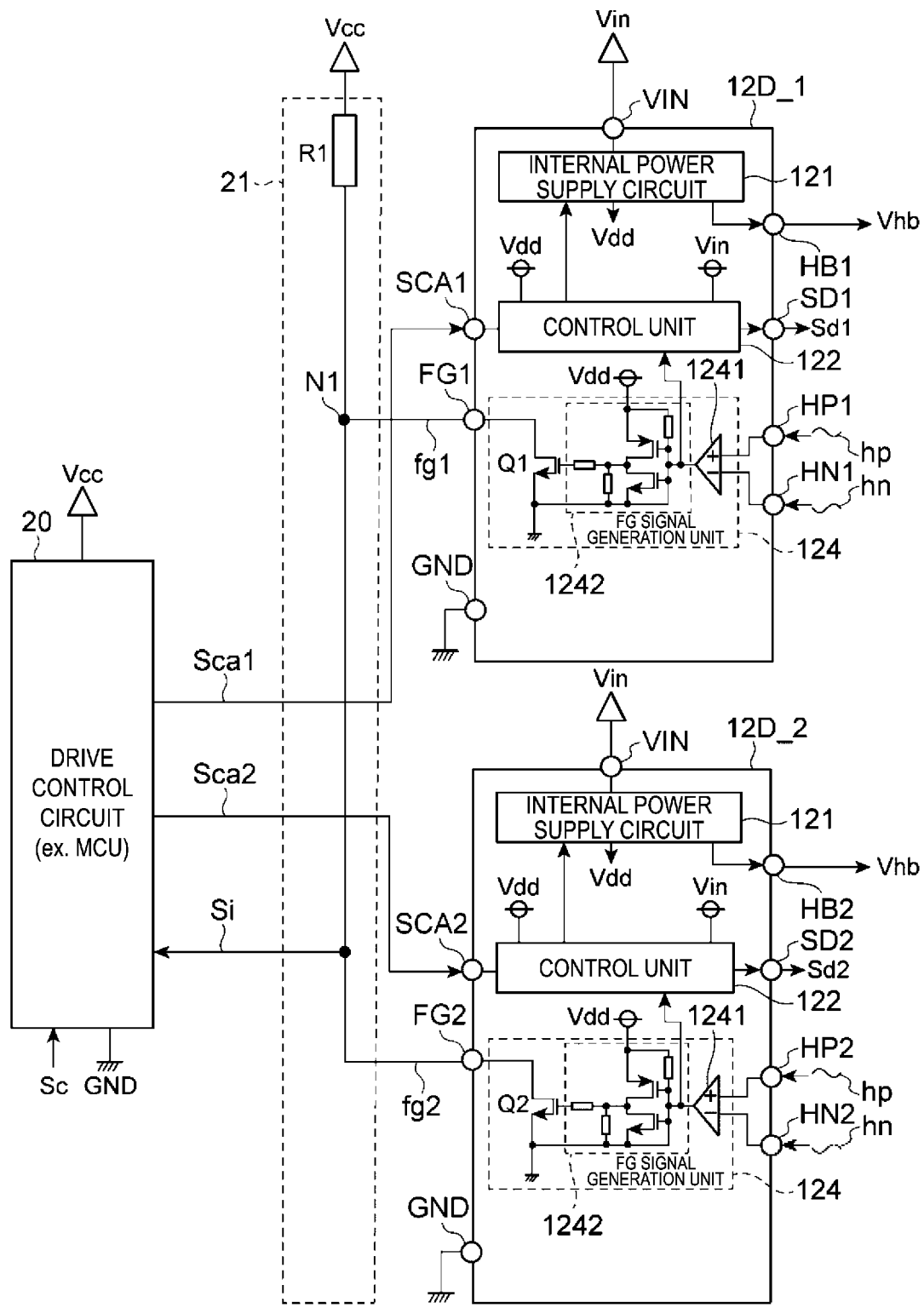
FIG. 20 is a block diagram illustrating internal configurations of control circuits 12D_1 and 12D_2 and a composite signal generation circuit 21 according to the third embodiment.

FIG. 20 is a block diagram illustrating an internal configuration of the control circuits 12D_1 and 12D_2 and the composite signal generation circuit 21 according to the third embodiment. Further, in FIG. 20, only the configuration associated with the generation of the FG signals (the signals fg1 and fg2) among the internal configurations of the control circuits 12D_1 and 12D_2 is illustrated.

Further, in the following description, constituent elements with attached suffixes such as the motor drive circuits 10D_1 and 10D_2, the control circuits 12D_1 and 12D_2, and the drive control signals Sca1 and Sca2 may be denoted without the suffixes like "the motor drive circuit 10D", "the control circuit 12D", "the drive control signal Sca", and the like if the constituent elements just having different suffixes are not distinguished from each other or collectively referred to.

The control circuit 12D_1 and the control circuit 12D_2 are each implemented by one integrated circuit (IC). In the present embodiment, both the control circuit 12D_1 and the control circuit 12D_2 are configured by using general-purpose ICs having the same circuit configuration as hardware. Further, the control circuit 12D_1 and the control circuit 12D_2 are not limited to have the configuration by the general-purpose ICs. For example, the control circuits may be configured by the microcontrollers (MCUs).

The control circuit 12D_1 and the control circuit 12D_2 each include an internal power supply circuit 121, a control unit 122, an FG signal generation unit 124, and a plurality of external terminals as functional units associated with generation of the FG signals (signals fg1 and fg2).

The control circuits 12D_1 and 12D_2 include, as the external terminals, for example, ground terminals GND for inputting a ground voltage GND as a first fixed potential, power supply terminals VIN for inputting a power supply voltage Vin (higher than GND), terminals SCA1 and SCA2 for inputting the drive control signals Sca1 and Sca2, FG signal output terminals FG1 and FG2 for outputting the signals fg1 and fg2 as FG signals, terminals HP1, HN1, HP2 and HN2 for inputting the position detection signals hp and hn from the position detectors 41_1 and 41_2, terminals SD1 and SD2 for outputting drive signals Sd1 and Sd2, and external output power supply terminals HB1 and HB2 for supplying an external output power supply voltage Vhb to the position detectors 41_1 and 41_2.

Further, in FIG. 20, only the external terminals associated with the FG signals (the signals fg1 and fg2) as external terminals of the control circuits 12D_1 and 12D_2 are illustrated for convenience of description. In the present embodiment, as an example, the control circuit 12D_1 and the control circuit 12D_2 are assumed to have the same circuit configuration, and as a representative, a circuit configuration of the control circuit 12D_1 will be described in detail.

The internal power supply circuit 121 is a circuit generating and outputting an internal power supply voltage. The internal power supply circuit 121 generates a predetermined DC voltage based on the DC voltage Vin supplied to the power supply terminal VIN, and supplies the DC voltage as an internal power supply voltage Vdd (lower than or equal to the power supply voltage Vin) to the circuits inside the control circuit 12D_1. In addition, the internal power supply circuit 121 generates a predetermined DC voltage based on the internal power supply voltage Vdd and supplies the DC voltage as the external output power supply voltage Vhb (lower than or equal to the power supply voltage Vdd) to the position detector 41_1.

The control unit 122 is a functional unit for comprehensively controlling the circuits inside the control circuit 12D_1. The control unit 122 includes, for example, a program processing device such as a dedicated hardware logic circuit or an MCU, and a pre-drive circuit for generating the drive signal Sd1.

The control unit 122 controls supply and cutoff of the internal power supply voltage Vdd to the FG signal generation unit 124. Specifically, the control unit 122 controls supply and cutoff of the internal power supply voltage Vdd to the FG signal generation unit 124 based on an input of the drive control signal Sca1 and the presence or absence of a change in the input of the position detection signals hp and hn. For example, when the state of the drive control signal Sca1 not being input, the input of the position detection signals hp and hn not being changed, and an output of a comparator 1241 not being shifted (i.e., a state of a next shifting of the signal fg1 not occurring) continues for a predetermined power-saving waiting time (an example of a predetermined period; a third period Ts3), the control unit 122 determines that the motor 50 has stopped intentionally, transitions to a power-saving state, and cuts off the supply of the internal power supply voltage Vdd to the FG signal generation unit 124 by controlling the internal power supply circuit 121. At this time, the supply of the external output power supply voltage Vhb to the position detector 41_1 is cut off at the same time.

In the present embodiment, the state of the control circuit 12D cutting off the supply of the internal power supply voltage Vdd by the internal power supply circuit 121 is referred to as a power-saving state of the motor drive circuit 10D.

The control unit 122 generates the drive signal Sd1 for energizing the motor 50 based on the drive control signal Sca1. Specifically, the control unit 122 sets an energization direction of the coil 80_1 based on the signal generated, based on the position detection signals hp and hn, by the comparator 1241 built in the FG signal generation unit 124, detects the actual number of rotations of the motor 50, generates a PWM signal having an adjusted duty ratio to make the actual number of rotations of the motor 50 match the number of rotations specified by, for example, the duty ratio of the PWM signal of the drive control signal Sca1, and outputs the PWM signal to the inverter circuit 15_1 as the drive signal Sd1. This drive signal Sd1 is used to control the on and off operation of each switch element of the inverter circuit 15_1. In addition, the control unit 122 may output the drive signal Sd1 at the duty ratio of the PWM signal equal to the drive control signal Sca1.

The FG signal generation unit 124 is a circuit generating the FG signal based on the position detection signals hp and hn input to the terminals HP1 and HN1 and outputting the generated FG signal from the terminal FG1. The FG signal generation unit 124 is configured to be operable with power supply from the internal power supply voltage Vdd.

The Hall element as the position detector 41_1 changes the output corresponding to a magnetic flux density. Thus, the position detector 41_1 outputs, in accordance with the rotation of the rotor of the motor 50, the position detection signals hp and hn being sine wave signals with a cycle corresponding to the number of rotations the rotor at an analog voltage. The position detection signals hp and hn are 180 degrees out of phase with each other. The FG signal generation unit 124 generates a binary signal (a digital signal) in accordance with the polarity (positive or negative) of the difference between the voltage of the position detection signal hp and the voltage of the position detection signal hn (hp−hn), converts the binary signal into a binary signal fg1, and outputs the binary signal fg1.

For example, the FG signal generation unit 124 includes an output transistor Q1, the comparator (voltage comparator) 1241, and a pre-drive circuit 1242 as illustrated in FIG. 20.

The comparator 1241 is a circuit generating a binary signal according to the positive or negative of the difference between the position detection signals hp and hn input to the terminals HP1 and HN1 (hp−hn), respectively. The pre-drive circuit 1242 is a circuit driving the output transistor Q1 based on the binary signal generated by the comparator 1241.

The output transistor Q1 is a circuit element for outputting the signal fg1 from the terminal FG1 and is connected between the terminal FG1 and the ground voltage GND as the first fixed potential.

In the present embodiment, the output transistor of the FG signal generation unit 124 in the control circuit 12D_1 is referred to as an "output transistor Q1", and the output transistor of the FG signal generation unit 124 in the control circuit 12D_2 is referred to as an "output transistor Q2". The output transistors Q1 and Q2 are, for example, Field Effect Transistors (FETs).

The composite signal generation circuit 21 receives inputs of the FG signals output from the plurality of motor drive circuits 10D and generates a composite signal Si by combining the input signals. Specifically, the composite signal generation circuit 21 generates the composite signal Si by combining the signal fg1 and the signal fg2. The power supply voltage Vcc is supplied to the composite signal generation circuit 21 as a second fixed potential for driving the circuit. The composite signal generation circuit 21 generates the composite signal Si based on the logical AND of the signals fg1 and fg2, for example. The composite signal generation circuit 21 includes, for example, a load R1. The load R1 is, for example, a resistor. The load R1 is connected between a node (a connection point) N1 and the power supply voltage Vcc. To the node N1, the terminal FG1 of the control circuit 12D_1 and the terminal FG2 of the control circuit 12D_2 are commonly connected. The voltage of the node N1 of the composite signal generation circuit 21 is input to the drive control circuit 20 as the composite signal Si.

In the present embodiment, the composite signal generation circuit 21 is mounted on one circuit board with, for example, the general-purpose ICs as the control circuits 12D_1 and 12D_2, and the MCU as the drive control circuit 20.

The waveform of the composite signal Si changes in accordance with the state of the fan 100D (the motor 50 and the motor drive circuits 10D_1 and 10D_2). The drive control circuit 20 determines the drive state of the fan 100D based on the composite signal Si. The composite signal Si will be described below in detail.

FIG. 21 is a table showing a relationship between states of the fan and aspects of the composite signal Si according to the third embodiment.

FIG. 21 shows the aspects of the composite signal Si at the time of a normal operation of the fan 100D, that is, when the drive control circuit 20 outputs the drive control signals Sca1 and Sca2 according to a speed command signal Sc to the motor drive circuits 10D_1 and 10D_2 to drive the motor 50.

First, a case of the fan 100D (the motor 50) operating normally, that is, being in a normal state, will be considered.

In this case, each of the terminals FG1 and FG2 of the control circuits 12D_1 and 12D_2 is pulled up to the power supply voltage Vcc of the composite signal generation circuit 21, and thus the signals fg1 and fg2 (binary signals) having the duty ratio of 50% having voltages equivalent to the power supply voltage Vcc as high (Hi) levels (an example of a predetermined logical value) and having voltages equivalent to the ground voltage GND as low (Lo) levels (an example of a predetermined logical value) are output from the terminals FG1 and FG2 of the control circuits 12D_1 and 12D_2, respectively. In addition, the signal fg1 and the signal fg2 have a phase difference of 90 degrees as described above. Thus, when the fan 100D (the motor 50) is in the normal state, the composite signal Si output from the composite signal generation circuit 21 (the node N1) is a binary signal having the same cycle as the signals fg1 and fg2 but having a duty ratio of 25%.

Next, a case of occurrence of a failure in either the terminal FG1 or FG2 of the motor drive circuits 10D_1 and 10D_2 being in an open state as an FG failure state will be considered. It is assumed that, for example, the Hall element as the position detector 41_1 fails, the position detection signal hp is fixed to a level equivalent to the external output power supply voltage Vhb, and/or the position detection signal hn is fixed to a level equivalent to the ground voltage GND. In this case, the polarity of the difference (hp−hn) is positive at all times, the output of the comparator 1241 is fixed to a high level, the output transistor Q1 is turned off, and thus the terminal FG1 is in an open state. In addition, for example, the terminal FG1 is also in the open state when power supply to the position detector 41_1 is disconnected or grounded while the comparator 1241 outputs a high level.

Hereinafter, the failure of the terminals FG1 and FG2 of the motor drive circuits 10D_1 and 10D_2 being brought into a high impedance (Hi-Z) state (open state) is also referred to as an "FG open-circuit failure".

When the terminal FG1 is in the open state, the signal fg1 at a high level is output from the terminal FG1. On the other hand, because the motor drive circuit 10D_2 is operating normally, when the motor 50 is rotating, the signal fg2 having a duty ratio of 50% is output from the terminal FG2. Thus, the composite signal Si output from the composite signal generation circuit 21 (the node N1) is a binary signal having a duty ratio of 50% according to the signal fg2.

Further, also when only the terminal FG2 of the motor drive circuit 10D_2 has an FG open-circuit failure, the composite signal Si having a duty ratio of 50% according to the signal fg1 is output from the composite signal generation circuit 21.

Next, a case of occurrence of a failure in either the terminal FG1 or FG2 of the motor drive circuits 10D_1 and 10D_2 being in a short-circuit state as the FG failure state will be considered. It is assumed that, for example, the Hall element as the position detector 41_1 fails, the position detection signal hp is fixed to a level equivalent to the ground voltage GND, and/or hn is fixed to a level equivalent to the external output power supply voltage Vhb. In this case, the polarity of the difference (hp−hn) is negative at all times, the output of the comparator 1241 is fixed to a low level, the output transistor Q1 is turned on, and thus the terminal FG1 is in a short-circuit state.

In addition, for example, the terminal FG1 is also in the short-circuit state when power supply to the position detector 41_1 is disconnected or grounded while the comparator 1241 outputs a low level.

Hereinafter, a failure of the terminals FG1 and FG2 of the motor drive circuits 10D_1 and 10D_2 being in a short-circuit state will also be referred to as an "FG short-circuit failure".

When the terminal FG1 is in the short-circuit state, the signal fg1 at a low level is output from the terminal FG1. On the other hand, although the motor drive circuit 10D_2 outputs the signal fg2 having a duty ratio of 50% from the terminal FG2 because the motor drive circuit 10D_2 is operating normally, the composite signal Si output from the composite signal generation circuit 21 (node N1) is at a low level due to the node N1 being short-circuited via the terminal FG1.

Further, also when only the terminal FG2 of the motor drive circuit 10D_2 has an FG short-circuit failure, the composite signal Si output from the composite signal generation circuit 21 is at a low level.

Next, a case of the motor 50 being in a locked state will be considered.

When a rotor lock occurs due to an external mechanical factor and thus the motor 50 is in a locked state and incapable of rotating, the position detection signals hp and hn input to the terminals HP1, HN1, HP2, and HN2 are not periodically changed from the position detectors 41_1 and 41_2, and thus the signals fg1 and fg2 are fixed to either the low level or the high level.

For example, in a case where at least one of the signals fg1 or fg2 output from the control circuits 12D_1 and 12D_2, respectively, is at a low level due to the rotor lock of the motor 50, the composite signal Si output from the composite signal generation circuit 21 (the node N1) is set to a low level.

Further, for example, when both the signals fg1 and fg2 output from the control circuits 12D_1 and 12D_2, respectively, are at high levels due to the rotor lock of the motor 50, the composite signal Si output from the composite signal generation circuit 21 (the node N1) is set to a high level.

Because the waveform of the composite signal Si changes in accordance with the drive state of the fan 100D (the motor 50 and the motor drive circuits 10D_1 and 10D_2) as described above, the drive control circuit 20 can determine the drive state of the fan 100D by monitoring the composite signal Si at the time of the normal operation of the fan 100D.

Specifically, by generating the composite signal Si based on the logical AND of the signals fg1 and fg2 output from the motor drive circuits 10D_1 and 10D_2, whether the case of either the motor drive circuit 10D_1 or 10D_2 being the FG open-circuit failure, the case of at least one of the motor drive circuits 10D_1 or 10D_2 being the FG short-circuit failure, or the case of the motor 50 being in the rotor lock can be determined.

However, when the composite signal Si is at a low level, whether the fan 100D is in an "FG failure state due to the FG short-circuit failure" or in the "locked state" cannot be determined, as illustrated in FIG. 21.

For this reason, in the motor drive control device 1D according to the present embodiment, when the composite signal Si is at a low level, whether the fan 100D is in the "FG failure state due to the FG short-circuit failure" or in the "locked state" can be determined based on the composite signal Si when the output of the FG signal by at least one of the motor drive circuits 10D_1 or 10D_2 is caused to transition to a high-level state.

Specifically, when the composite signal Si indicates a predetermined logical value, for example, and when the composite signal Si obtained by the composite signal generation circuit 21 combining the FG signals generated by the FG signal generation units 124 having the circuit configuration illustrated in FIG. 20 indicates a low level, the drive control circuit 20 causes at least one of the motor drive circuits 10D_1 or 10D_2 to transition to a high-level state to be incapable of outputting the signals fg1 or fg2 and performs, based on the composite signal Si at the time of the high-level state, first FG failure determination processing (an example of first determination processing) to distinguish whether either the motor drive circuit 10D_1 or 10D_2 is in the FG failure state or the motor 50 is in the locked state.

Specifically, when the composite signal Si is fixed to a predetermined logical value (a low level or a high level), the drive control circuit 20 stops the output of the drive control signals Sca1 and Sca2 and causes at least one of the motor drive circuits 10D_1 or 10D_2 to transition to a power-saving state.

As described above, the control circuit 12D (the control unit 122) of the motor drive circuit 10D cuts off the supply of the internal power supply voltage Vdd to the FG signal generation unit 124 when the state without an input of the drive control signal Sca and without the next shifting of the FG signal (the input of the position detection signals hp and hn does not change) has continued for a third period Ts3.

Thus, one of the motor drive circuits 10D being in the FG short-circuit failure or both motor drive circuits 10D being in the rotor lock transitions from the state without an input of the drive control signal Sca from the drive control circuit 20 and without the occurrence of the next shifting of the FG signals to the power-saving state after the third period Ts3 elapses. With this operation, the output transistor Q1 is turned off and the terminal FG (FG1 or FG2) of the motor drive circuit 10D is brought into a high impedance state.

In other words, the drive control circuit 20 makes a detailed determination regarding the state of the fan 100D based on the composite signal Si when at least one of the terminals FG1 or FG2 of the motor drive circuits 10D_1 and 10D_2 is brought into a high impedance state.

For example, when a predetermined change is detected in the composite signal Si while at least one of the motor drive circuits 10D_1 or 10D_2 is in the power-saving state, the drive control circuit 20 determines that either the motor drive circuit 10D_1 or 10D_2 is in the FG failure state due to the FG short-circuit failure and that the motor 50 is rotating by inertia. On the other hand, when the composite signal Si is fixed to a predetermined logical value (e.g., a high level), the drive control circuit 20 determines that the motor 50 is in a locked state and incapable of rotating.

Here, the predetermined change in the composite signal Si refers to, for example, shifting of a logical value of the composite signal Si two or more times.

When receiving an input of the drive control signal Sca, the control circuit 12D (the control unit 122) of the motor drive circuit 10D cancels the power-saving state and resumes the supply of the internal power supply voltage Vdd to the FG signal generation unit 124 and the external output power supply voltage Vhb. Thus, the motor drive circuit 10D resumes the output of the FG signals based on the position detection signals from the position detectors 41 according to the rotation position of the rotor of the motor 50. At this time, the motor drive circuit 10D being in the FG failure state may switch to the other FG failure state due to the re-output of the comparator 1241.

Next, a flow of the drive state determination processing for the fan 100D by the motor drive control device 1D will be described.

FIGS. 22, 23, 24, and 25A to 25D are examples of flowcharts illustrating a flow of the drive state determination processing for the fan 100D by the motor drive control device 1D according to the third embodiment.

Figure 22:
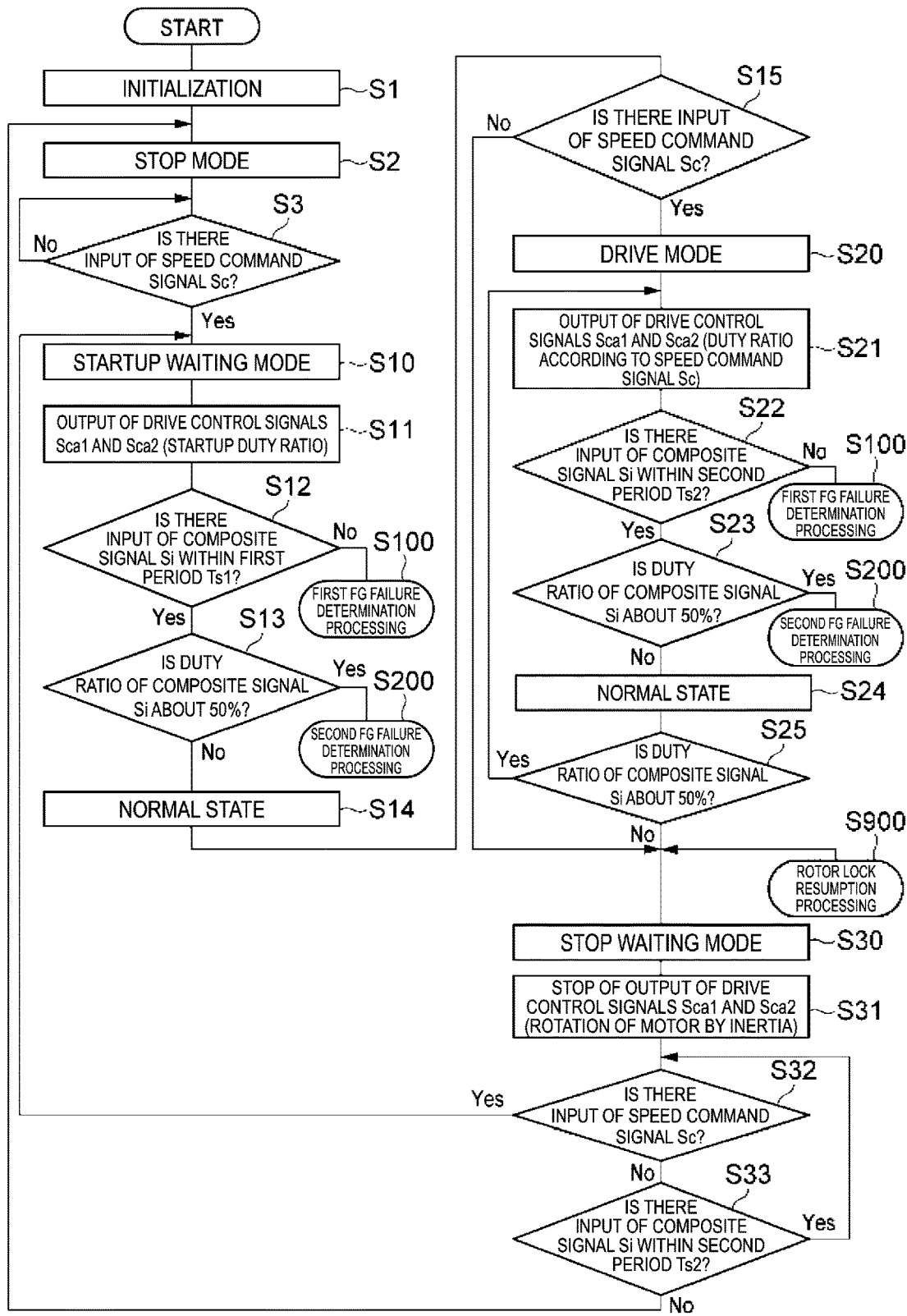
FIG. 22 is a flowchart illustrating a flow of drive state determination processing for the fan performed by a motor drive control device according to the third embodiment.

When the motor drive control device 1D receives an input of power supply, first, the drive control circuit 20 (MCU) or the like is initialized (step S1) as illustrated in FIG. 22. Next, the drive control circuit 20 is in a stop mode for not driving the motor 50 (step S2). Here, in the stop mode, the motor drive circuits 10D_1 and 10D_2 may be in the power-saving state. In the stop mode, the drive control circuit 20 determines whether the speed command signal Sc has been input from the upper device 500 (step S3). If the speed command signal Sc has not been input (step S3: No), the drive control circuit 20 continues to operate in the stop mode, and monitors the presence or absence of an input of the speed command signal Sc.

On the other hand, if the speed command signal Sc has been input (step S3: Yes), the drive control circuit 20 transitions to a startup waiting mode (step S10). In the startup waiting mode, first, the drive control circuit 20 outputs the drive control signals Sca1 and Sca2 having a preset fixed duty ratio (a startup duty ratio) to ensure rotation of the motor 50 to be started, regardless of the speed command signal Sc (step S11).

Further, for example, when switching (commutation) of an energization direction to the coil 80 does not take place due to the FG failure of one motor drive circuit 10D and the brake is applied to the rotation of the motor 50, the other normal motor drive circuit 10D may generate a drive control signal Sca having the duty ratio specified by the speed command signal Sc to bring the motor 50 into a rotatable state. In this case, the duty ratio corresponding to the speed command signal Sc may be used as the startup duty ratio.

Next, the drive control circuit 20 determines whether the motor 50 has rotated and detected a predetermined change in the composite signal Si, in other words, whether the composite signal Si is fixed to a predetermined logical value (a high level or a low level) in the period of a predetermined startup waiting time (a first period Ts1) (step S12). At this time, the first period Ts1 is a time equal to or longer than a second period Ts2 to be described below.

When a predetermined change in the composite signal Si is not detected (the composite signal Si is fixed to a high level or a low level) in the first period Ts1 (step S12: No), the drive control circuit 20 determines that the motor 50 has a rotor lock or an FG short-circuit failure unintentionally from the time of startup, and starts first FG failure determination processing (step S100).

Here, because a first falling edge of the composite signal Si may occur due to a restored internal power supply voltage caused by the cancellation of the power-saving state, the falling edge is not treated as an input of the composite signal Si. In other words, the drive control circuit 20 treats the composite signal Si as an input from the time of the detection of the predetermined change in the composite signal Si and starts measuring the cycle and the duty ratio of the composite signal Si.

Here, the first FG failure determination processing is processing for distinguishing the locked state of the motor 50 and the FG failure state of the motor drive circuit 10D. Details of the first FG failure determination processing will be described below.

On the other hand, if a predetermined change in the composite signal Si is detected (step S12: Yes), the drive control circuit 20 determines whether the duty ratio of the composite signal Si is 50% (step S13).

Here, "50%" may include some error. For example, if the duty ratio of the composite signal Si is in the range of "50%±10%", it may be determined that the duty ratio of the composite signal Si is "50%". In addition, when the motor 50 starts rotating from the stop state, the number of rotations changes significantly, and thus the duty ratio of the first few pulses of the composite signal Si becomes unstable. In this case, measuring of the duty ratio may be skipped. Furthermore, a plurality of pulses of the composite signal Si may be used for determining the duty ratio.

If the duty ratio of the composite signal Si is 50% (step S13: Yes), the drive control circuit 20 determines that any one of the motor drive circuits 10D is in the FG failure state due to the FG open-circuit failure and starts second FG failure determination processing (step S200).

Here, the second FG failure determination processing is processing for distinguishing the FG failure state due to the FG open-circuit failure of the motor drive circuit 10D. Details of the second FG failure determination processing will be described below.

On the other hand, if the duty ratio of the composite signal Si is not 50% (step S13: No), the drive control circuit 20 determines that the fan 100D (the motor 50 and the motor drive circuits 10D_1 and 10D_2) is normal (normal state) and then outputs the state signal So indicating that the fan 100D is driven normally to the upper device 500 (step S14).

If the speed command signal Sc has been input (step S15: Yes), the drive control circuit 20 transitions to step S20. On the other hand, if the speed command signal Sc has not been input (step S15: No), the drive control circuit 20 transitions to a stop waiting mode to stop the drive of the motor 50 (step S30).

Then, the drive control circuit 20 controls the motor drive circuits 10D_1 and 10D_2 to make the motor 50 rotate with the number of rotations specified in the speed command signal Sc and transitions to the drive mode to handle the "rotor lock" or "FG failure" while the motor 50 is driven (step S20).

In the drive mode, first, the drive control circuit 20 outputs the drive control signals Sca1 and Sca2 having the duty ratio according to the speed command signal Sc (step S21). Next, the drive control circuit 20 determines whether a predetermined change in the composite signal Si has been detected within a predetermined period of time of a minimum number of rotations (the second period Ts2) and determines the number of rotations acquired from the cycle of the composite signal Si (step S22). At this time, the second period Ts2 is shorter than the third period Ts3.

If a predetermined change in the composite signal Si is not detected or if the number of rotations is less than the minimum number of rotations (step S22: No), the drive control circuit 20 determines that the motor 50 has a rotor lock or an FG short-circuit failure unintentionally while being driven and starts the first FG failure determination processing (step S100).

On the other hand, if a predetermined change in the composite signal Si has been detected (step S22: Yes), the drive control circuit 20 determines whether the duty ratio of the composite signal Si is 50% (step S23). Here, "50%" may be determined by performing the determination processing, as step S13.

If the duty ratio of the composite signal Si is 50% (step S23: Yes), the drive control circuit 20 determines that any one of the motor drive circuits 10D is in the FG failure state due to the FG open-circuit failure and starts the second FG failure determination processing (step S200). On the other hand, if the duty ratio of the composite signal Si is not 50% (step S23: No), the drive control circuit 20 determines that the motor 50 and the motor drive circuits 10D_1 and 10D_2 are normal (normal state) and then outputs the state signal So indicating that the fan 100D is driven normally to the upper device 500 (step S24).

Then, the drive control circuit 20 determines whether the speed command signal Sc has been input again (step S25).

If the speed command signal Sc has been input (step S25: Yes), the drive control circuit 20 repeatedly executes steps S21 to S25. On the other hand, if the speed command signal Sc has not been input (step S25: No), the drive control circuit 20 transitions to the stop waiting mode to stop the drive of the motor 50 (step S30).

In the stop waiting mode, the drive control circuit 20 stops the output of the drive control signals Sca1 and Sca2 (step S31). In this way, the motor 50 continues to rotate by inertia and then stops. At this time, when the fan 100D (the motor 50 and the motor drive circuits 10D_1 and 10D_2) is in the normal state, the drive control circuit 20 may output an FG signal, as the state signal So, having a duty ratio of 50% in the cycle according to the actual number of rotations of the motor 50 to the upper device 500 based on the composite signal Si generated by the composite signal generation circuit 21.

After step S31, the drive control circuit 20 determines whether the speed command signal Sc has been input from the upper device 500 (step S32). If the speed command signal Sc has been input (step S32: Yes), the drive control circuit 20 transitions to the startup waiting mode to execute the processing from steps S10 to S25 again.

On the other hand, if the speed command signal Sc has not been input (step S32: No), the drive control circuit 20 awaits until the rotation of the motor 50 performed by inertia becomes less than the minimum number of rotations. In other words, the drive control circuit 20 determines whether a predetermined change in the composite signal Si has been detected within the second period Ts2 and determines the number of rotations acquired from the cycle of the composite signal Si (step S33). If no predetermined change in the composite signal Si is detected or the number of rotations is less than the minimum number of rotations (step S33: No), the drive control circuit 20 determines that the motor 50 has stopped, and transitions to the stop mode (step S2).

On the other hand, if a predetermined change in the composite signal Si is detected and the number of rotations is equal to or greater than the minimum number of rotations (step S33: Yes), the drive control circuit 20 determines that the motor 50 is rotating by inertia, transitions to step S32, and determines whether the speed command signal Sc has been input from the upper device 500 again.

Figure 26:
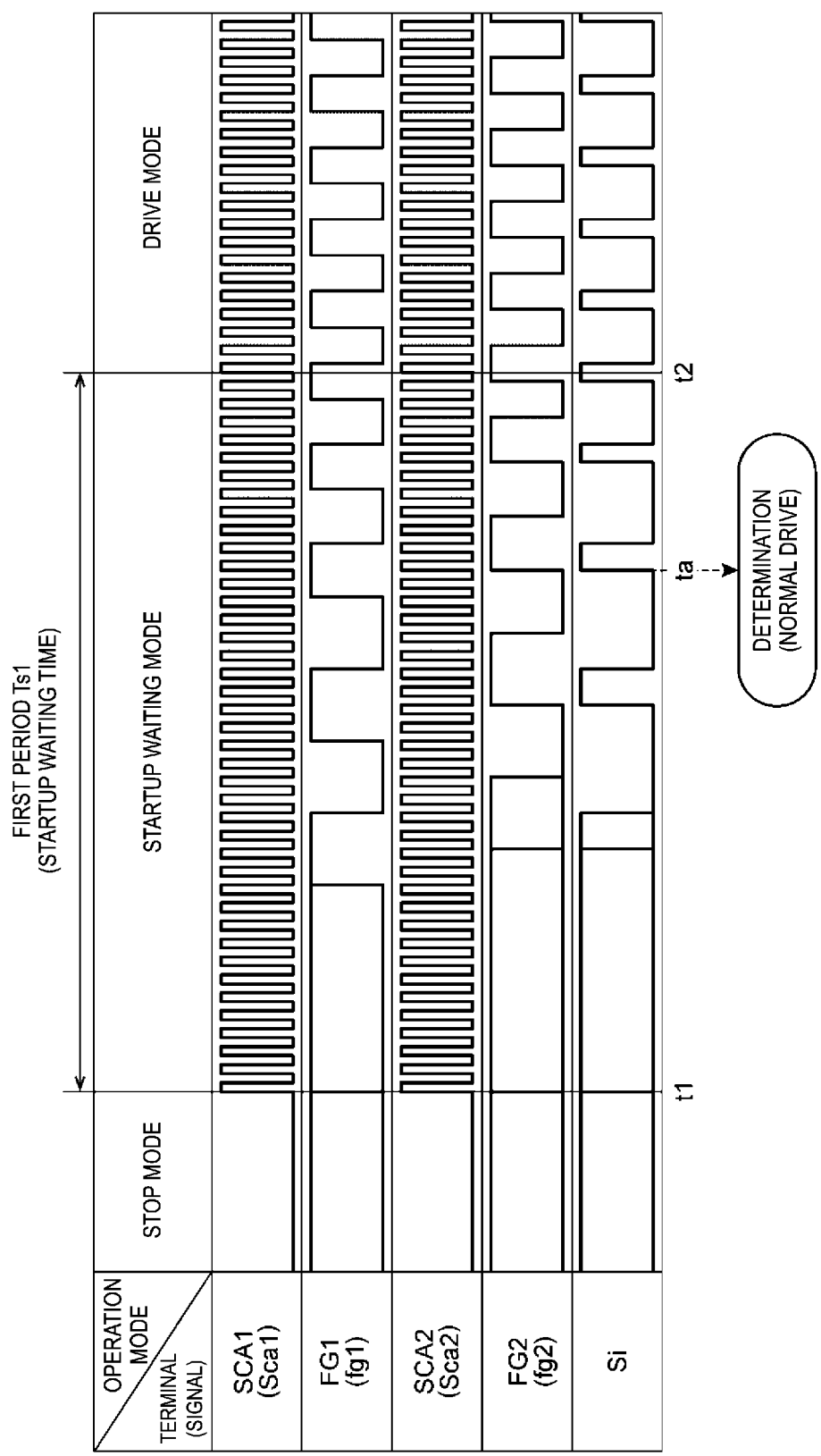
FIG. 26 is a timing chart showing drive control signals Sca1 and Sca2 (terminals SCA1 and SCA2), signals fg1 and fg2 (terminals FG1 and FG2), and a composite signal Si when motor drive circuits 10D_1 and 10D_2 are in a normal state and a motor 50 is in an unlocked state.

FIG. 26 is a timing chart showing the drive control signals Sca1 and Sca2 (terminals SCA1 and SCA2), signals fg1 and fg2 (terminals FG1 and FG2), and composite signal Si when the motor drive circuits 10D_1 and 10D_2 are in the normal state and the motor 50 is in an unlocked state. In FIG. 26, the vertical axis represents voltage or logical value of each signal, and the horizontal axis represents time.

As illustrated in FIG. 26, when the speed command signal Sc output from the upper device 500 is input and the mode transitions from the stop mode to the startup waiting mode at time t1 (step S10 in FIG. 22), the drive control circuit 20 outputs the drive control signals Sca1 and Sca2 with the predetermined startup duty ratio (step S11).

Then, the motor drive circuits 10D_1 and 10D_2 drive the motor 50 based on the drive control signals Sca1 and Sca2, and the motor 50 starts rotating. At this time, because the motor drive circuits 10D_1 and 10D_2 are in the normal state, the position detection signals hp and hn are input to the motor drive circuits 10D_1 and 10D_2 in accordance with the rotation of the motor 50. As a result, the motor drive circuits 10D_1 and 10D_2 output the signals fg1 and fg2 having the duty ratio of 50% from the terminals FG1 and FG2. As described above, because the signal fg1 and the signal fg2 have a phase difference of 90 degrees, the composite signal Si becomes a signal having a duty ratio of 25% while having the same cycle as the cycle of the signals fg1 and fg2.

The drive control circuit 20 determines, within the first period Ts1 after transitioning to the startup waiting mode, that the motor drive circuits 10D_1 and 10D_2 are in the normal state at a time ta when the composite signal Si is detected to have a predetermined change and is detected to have the duty ratio of 25% (not 50%) as illustrated in FIG. 26 (steps S12 to S14).

After that, at time t2, the drive control circuit 20 transitions to the drive mode (step S20), generates the drive control signals Sca1 and Sca2 according to the speed command signal Sc, and outputs the drive control signals Sca1 and Sca2 to the motor drive circuits 10D_1 and 10D_2 (step S21). At this time, the drive control circuit 20 may transition to the drive mode immediately after the determination at the time ta without waiting the end of the first period Ts1.

Next, the first FG failure determination processing (S100) will be described using FIG. 23.

The first FG failure determination processing is processing for distinguishing a locked state of the motor 50 and an FG failure state of the motor drive circuit 10D as described above.

Figure 23:
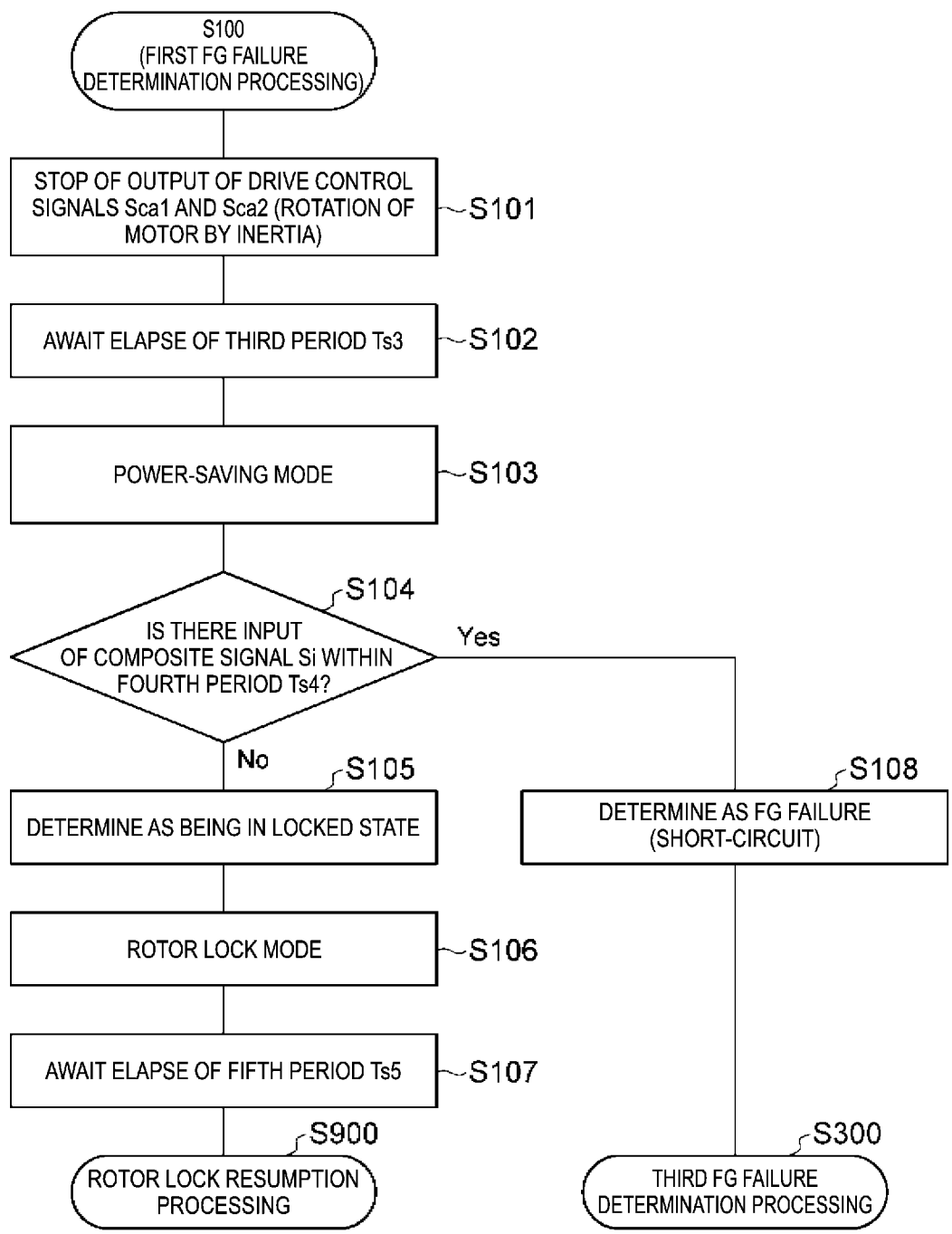
FIG. 23 is a flowchart illustrating a flow of drive state determination processing (first FG failure determination processing) for the fan performed by the motor drive control device according to the third embodiment.

In the first FG failure determination processing, the drive control circuit 20 first stops the output of the drive control signals Sca1 and Sca2 as illustrated in FIG. 23 (step S101). Then, the drive control circuit 20 awaits the elapse of the third period Ts3 and causes the motor drive circuits 10D_1 and 10D_2 (the control circuits 12D_1 and 12D_2) to transition to the power-saving state (step S102).

After the elapse of the third period Ts3, the drive control circuit 20 transitions to the power-saving mode (step S103). The power-saving mode is an operation mode after the motor drive circuits 10D_1 and 10D_2 (the control circuit 12D_1 and 12D_2) have transitioned to the power-saving state.

As described above, the drive control circuit 20 stops the output of the drive control signals Sca1 and Sca2 to cause the motor drive circuits 10D_1 and 10D_2 (the control circuits 12D_1 and 12D_2) of both systems to transition to the power-saving state.

When the motor 50 is rotating by inertia (in the case of the FG short-circuit failure), the normal control circuit 12D outputs the FG signal having a duty ratio of 50% and does not transition to the power-saving state because the input of the position detection signals hp and hn change and the output of the comparator 1241 is shifted even when the input of the drive control signal Sca is stopped. However, because the input of the position detection signals hp and hn does not change, and the output of the comparator 1241 is not shifted (low level), the control circuit 12D having the FG short-circuit failure transitions to the power-saving state after the third period Ts3 elapses from the state of the input of the drive control signal Sca being stopped and the next shifting of the output of the comparator 1241 not occurring. As a result, the composite signal Si has the duty ratio of 50% in accordance with the FG output from the normal motor drive circuit 10D.

On the other hand, when the motor 50 is not rotating (in the case of a rotor lock), the input of the position detection signals hp and hn does not change originally, and thus the control circuits 12D_1 and 12D_2 swiftly start timing after the input of the drive control signals Sca1 and Sca2 is stopped and transition to the power-saving state after the third period Ts3 elapses, and then the terminals FG1 and FG2 are in a high impedance state (the signals fg1 and fg2 are at a high level). As a result, the composite signal Si is at a high level.

After transitioning to the power-saving mode, the drive control circuit 20 determines whether a predetermined change in the composite signal Si has been detected within a predetermined period of rotation detection time (a fourth period Ts4) (step S104). For example, the fourth period Ts4 is a time equal to or longer than the second period Ts2, and in the following description, the fourth period Ts4 is assumed to be a time equal to the second period Ts2.

Here, a first rising edge of the composite signal Si may occur due to the supply of the internal power supply voltage cut off by the transition to the power-saving state, and thus the rising edge is not treated as a change in an input of the composite signal Si.

If no predetermined change in the composite signal Si is detected (step S104: NO), the drive control circuit 20 determines that the motor 50 is in the locked state and outputs the state signal So indicating that the fan 100D is in the locked state to the upper device 500 (step S105).

Here, in the case of the locked state, the drive control circuit 20 may output the state signal So as a power supply voltage Vcc (high level) to distinguish between the locked state and the FG failure state. Then, the drive control circuit 20 transitions to a rotor lock mode (step S106) and awaits elapse of the period of the predetermined rotor lock resumption time (a fifth period Ts5) (step S107) to start rotor lock resumption processing (step S900). Specifically, the drive control circuit 20 transitions to the stop waiting mode (step S30) and causes the motor 50 to automatically return from the startup as the rotor lock resumption processing.

On the other hand, if a predetermined change in the composite signal Si has been detected within the fourth period Ts4 (step S104: Yes), the drive control circuit 20 determines that either the motor drive circuit 10D_1 or 10D_2 is in the FG failure state due to the FG short-circuit failure (step S108). Then, the drive control circuit 20 executes a third FG failure determination processing (S300).

Here, the third FG failure determination processing (an example of second determination processing) is processing for identifying the motor drive circuit 10D being in the FG failure state among the motor drive circuits 10D of the two systems and continuing forward rotation of the motor 50 while monitoring the number of rotations of the motor 50 by using only the motor drive circuit 10D being in the normal state. Details of the third FG failure determination processing will be described below.

Figure 27:
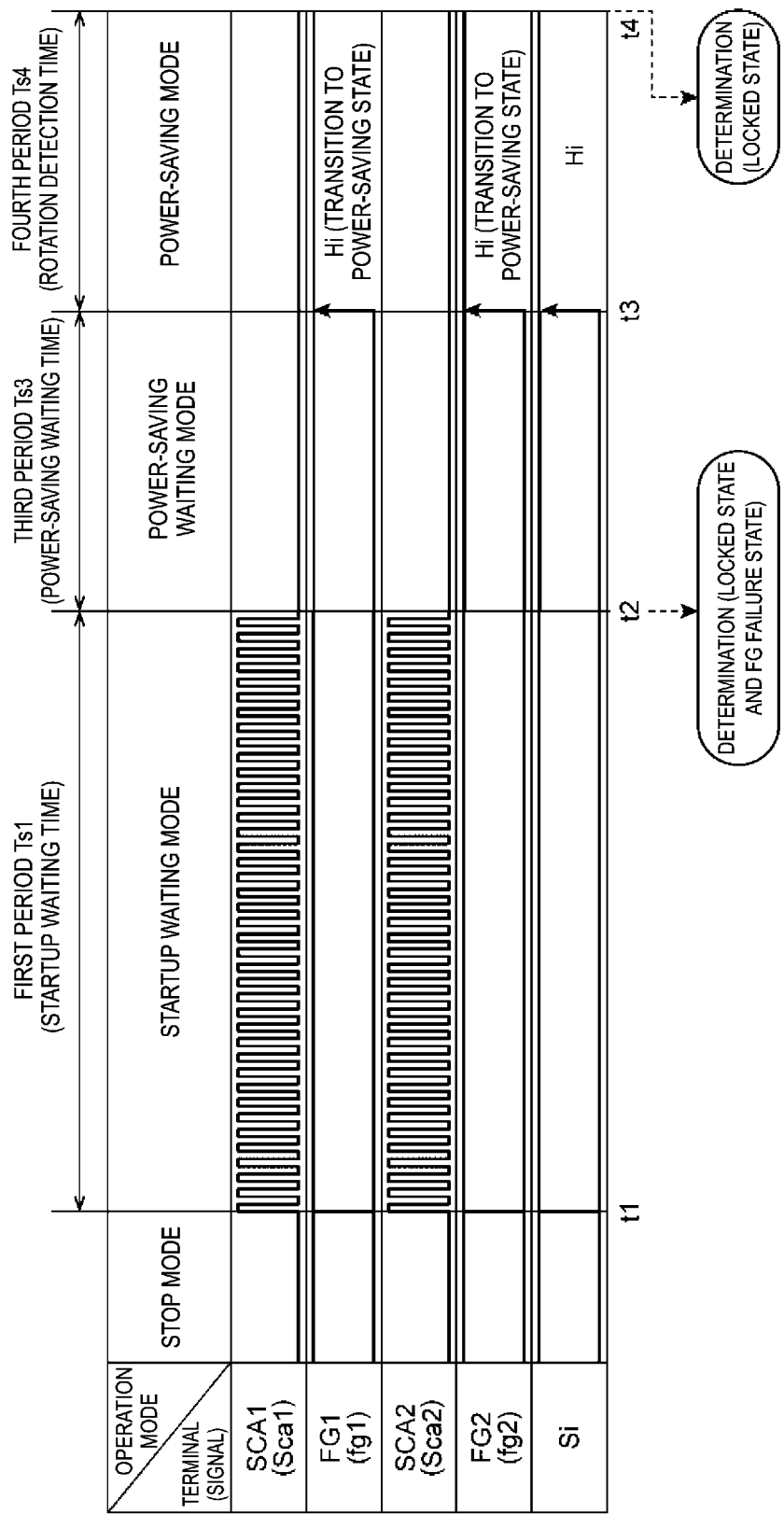
FIG. 27 is a timing chart showing the drive control signals Sca1 and Sca2 (terminals SCA1 and SCA2), the signals fg1 and fg2 (terminals FG1 and FG2), and the composite signal Si when the motor drive circuits 10D_1 and 10D_2 are in the normal state and the motor 50 is in a locked state.

FIG. 27 is an example of a timing chart showing the drive control signals Sca1 and Sca2 (terminals SCA1 and SCA2), signals fg1 and fg2 (terminals FG1 and FG2), and composite signal Si when motor drive circuits 10D_1 and 10D_2 are in the normal state and the motor 50 is in a locked state. In FIG. 27, the vertical axis represents voltage or logical value of each signal, and the horizontal axis represents time.

When transitioning from the stop mode to the startup waiting mode at a time t1 as illustrated in FIG. 27 (step S10 in FIG. 22), the drive control circuit 20 outputs the drive control signals Sca1 and Sca2 having the predetermined startup duty ratio (step S11).

Then, the motor drive circuits 10D_1 and 10D_2 drive the motor 50 based on the drive control signals Sca1 and Sca2, and the motor 50 starts rotating. Although the motor drive circuits 10D_1 and 10D_2 are in the normal state at this time, because the motor 50 is in the locked state and the input of the position detection signals hp and hn does not change, the signals fg1 and fg2 become signals fixed to either a high level or a low level.

The drive control circuit 20 starts the first FG failure determination processing (step S100) when a predetermined change in the composite signal Si is not detected within the first period Ts1 after transitioning to the startup waiting mode as shown in FIG. 22. Specifically, the drive control circuit 20 stops the output of the drive control signals Sca1 and Sca2 and transitions to a power-saving waiting mode (step S101 in FIG. 23) at a time t2 arriving after the first period Ts1 has elapsed after transitioning to the startup waiting mode as illustrated in FIG. 27.

Although the motor drive circuits 10D_1 and 10D_2 are in the normal state as described above, because the motor 50 is in the locked state, the output of the signals fg1 and fg2 does not change. As a result, at the time t3 arriving after the third period Ts3 has elapsed from the time t2 when the input of the drive control signals Sca1 and Sca2 stopped, the drive control circuit 20 transitions to the power-saving mode, and the motor drive circuits 10D_1 and 10D_2 (the control circuits 12D_1 and 12D_2) transitions to the power-saving state together (steps S102 and S103). As a result, the terminals FG1 and FG2 of the motor drive circuits 10D_1 and 10D_2, respectively, are in the high impedance state, and the composite signal Si has the high level.

When no predetermined change in the composite signal Si is detected and the composite signal Si fixed to the high level is detected within the fourth period Ts4 after transitioning to the power-saving mode, the drive control circuit 20 determines that the motor 50 is in the locked state at a time t4 arriving when the fourth period Ts4 has elapsed (step S105). Then, the drive control circuit 20 starts the rotor lock resumption processing (S900) at the time t4.

In such a manner, after the composite signal Si is detected as being a signal fixed to either the high level or the low level, the drive control circuit 20 can determine that the motor 50 is in the locked state when the composite signal Si is detected to have no predetermined change after the output of the drive control signals Sca1 and Sca2 to the motor drive circuits 10D of both systems is stopped and then the motor drive circuits 10D of both systems have transitioned to the power-saving state and is at the high level.

Figure 28:
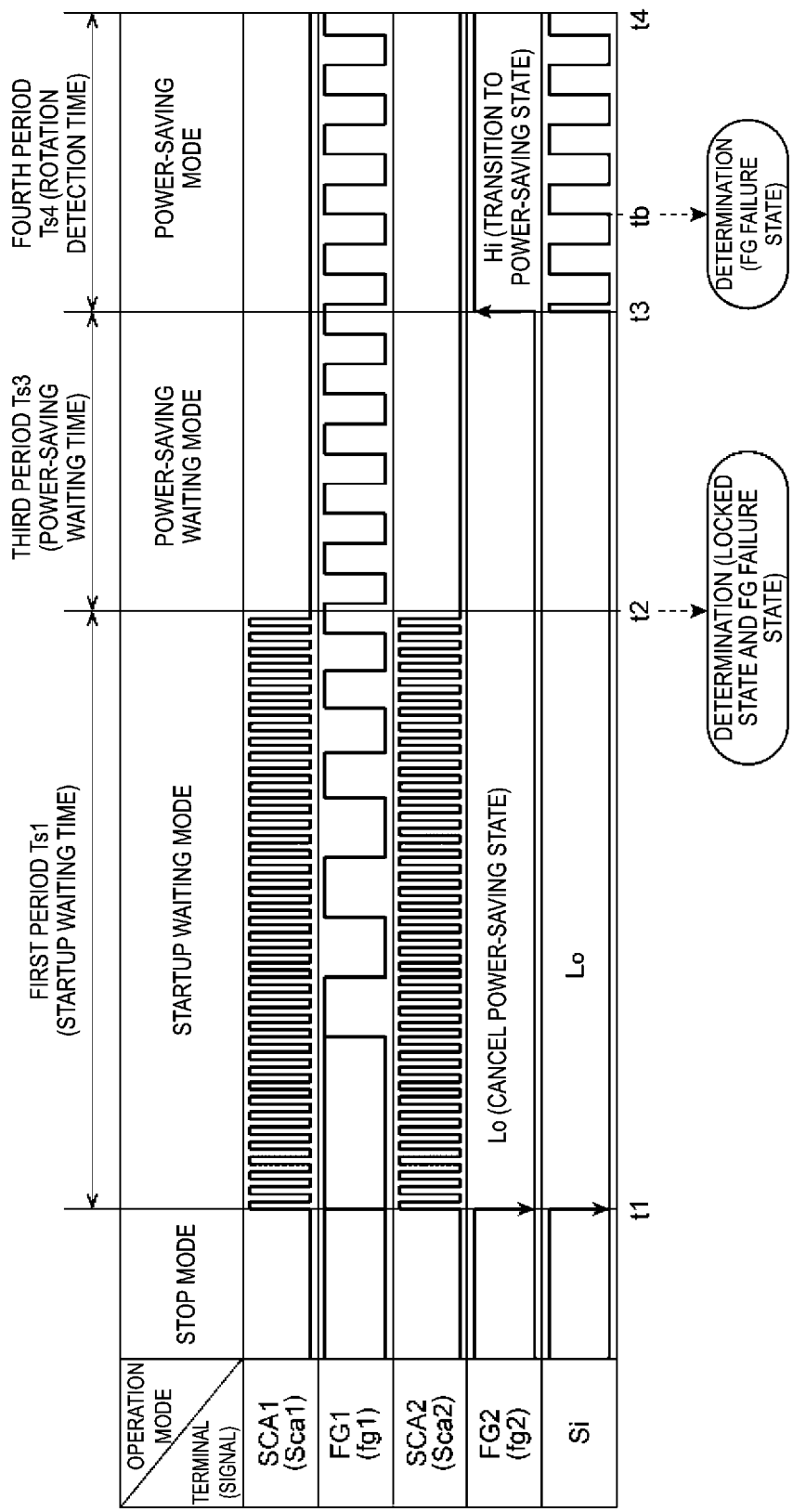
FIG. 28 is a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state and the motor drive circuit 10D_2 is in an FG failure state due to an FG short-circuit failure.

FIG. 28 is an example of a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state and the motor drive circuit 10D_2 is in an FG failure state due to the FG short-circuit failure. In FIG. 28, the vertical axis represents voltage or logical value of each signal, and the horizontal axis represents time.

When transitioning from the stop mode to the startup waiting mode at the time t1 as illustrated in FIG. 28 (step S10 in FIG. 22), the drive control circuit 20 outputs the drive control signals Sca1 and Sca2 having the predetermined startup duty ratio (step S11).

Then, the motor drive circuits 10D_1 and 10D_2 drive the motor 50 based on the drive control signals Sca1 and Sca2, and the motor 50 starts rotating. Because the motor drive circuit 10D_1 is in the normal state at this time, the change in the input of the position detection signals hp and hn by the rotation of the motor 50 is input to the motor drive circuit 10D_1, and thus the motor drive circuit 10D_1 outputs the signal fg1 having the duty ratio of 50% from the terminal FG1.

On the other hand, because the motor drive circuit 10D_2 is in the FG failure state due to the FG short-circuit failure, the low-level signal fg2 is output from the terminal FG2. Thus, the composite signal Si output from the composite signal generation circuit 21 is at the low level.

The drive control circuit 20 starts the first FG failure determination processing (step S100) when a predetermined change in the composite signal Si is not detected within the first period Ts1 after transitioning to the startup waiting mode as shown in FIG. 22. Specifically, the drive control circuit 20 stops the output of the drive control signals Sca1 and Sca2 and transitions to the power-saving waiting mode (step S101 in FIG. 23) at a time t2 arriving after the first period Ts1 has elapsed after transitioning to the startup waiting mode as illustrated in FIG. 28.

Because the motor 50 rotates by inertia after the time t2 as illustrated in FIG. 28, the motor drive circuit 10D_1 is in the normal state, and the signal fg1 having the duty ratio of 50% is output. Thus, while the signal fg1 is output, the motor drive circuit 10D_1 does not transition to the power-saving state.

On the other hand, because the motor drive circuit 10D_2 is in the FG failure state due to the FG short-circuit failure, the output of the signal fg2 is fixed to a low level. As a result, at the time t3 arriving after the third period Ts3 has elapsed from the time t2 when the input of the drive control signal Sca2 stopped, the drive control circuit 20 transitions to the power-saving mode, and the motor drive circuit 10D_2 transitions to the power-saving state (steps S102 and S103). As a result, the terminal FG2 of the motor drive circuit 10D_2 is brought into the high impedance state, and the composite signal Si has the duty ratio of 50% in accordance with the signal fg1.

After transitioning to the power-saving mode, the drive control circuit 20 determines, within the fourth period Ts4, that either the motor drive circuit 10D_1 or 10D_2 is in the FG failure state due to the FG short-circuit failure at the time tb when detecting the predetermined change in the composite signal Si (step S108). Then, the drive control circuit 20 starts, at a time t4, the third FG failure determination processing (S300) to be described below. At this time, the drive control circuit 20 may start the third FG failure determination processing immediately after the determination at the time tb without waiting the end of the fourth period Ts4.

In this way, after detecting that the composite signal Si is at the low level, the drive control circuit 20 can stop the output of the drive control signals Sca1 and Sca2 to the motor drive circuits 10D of both systems and determine, when the predetermined change in the composite signal Si after the motor drive circuit 10D being in the FG failure state transitioned to the power-saving state is detected, that either the motor drive circuit 10D_1 or 10D_2 is in the FG failure state due to the FG short-circuit failure.

Next, the second FG failure determination processing (S200) will be described using FIG. 24.

The second FG failure determination processing is processing for distinguishing the FG failure state due to the FG open-circuit failure of the motor drive circuit 10D as described above.

Figure 24:
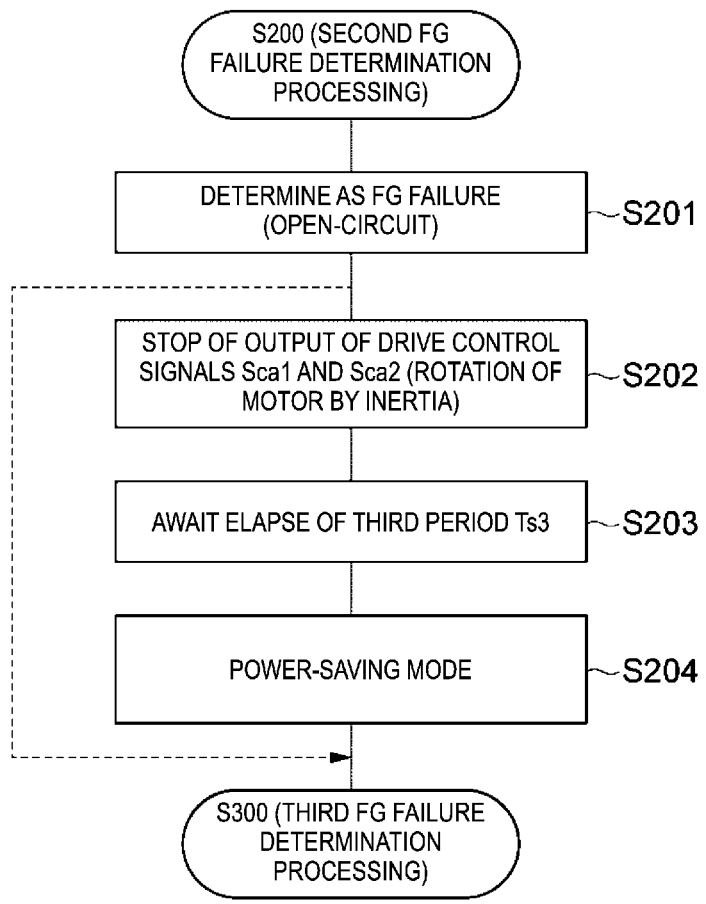
FIG. 24 is a flowchart illustrating a flow of drive state determination processing (second FG failure determination processing) for the fan performed by the motor drive control device according to the third embodiment.

In the second FG failure determination processing, first, the drive control circuit 20 determines that either the motor drive circuit 10D_1 or 10D_2 is in the FG failure state due to the FG open-circuit failure (step S201) because the duty ratio of the composite signal Si is 50% (see step S13 and step S23 in FIG. 22) as illustrated in FIG. 24.

Next, the drive control circuit 20 stops the output of the drive control signals Sca1 and Sca2 (step S202) by standardizing the processing flow with the first FG failure determination processing. Then, the drive control circuit 20 awaits the elapse of the third period Ts3 (step S203). After the elapse of the third period Ts3, the drive control circuit 20 transitions to the power-saving mode (step S204). Then, the drive control circuit 20 executes the third FG failure determination processing (S300).

Further, in FIG. 24, the drive control circuit 20 may execute the third FG failure determination processing (S300) without executing steps S202 to S204 and without standardizing the processing flow with the first FG failure determination processing after step S201.

Figure 29:
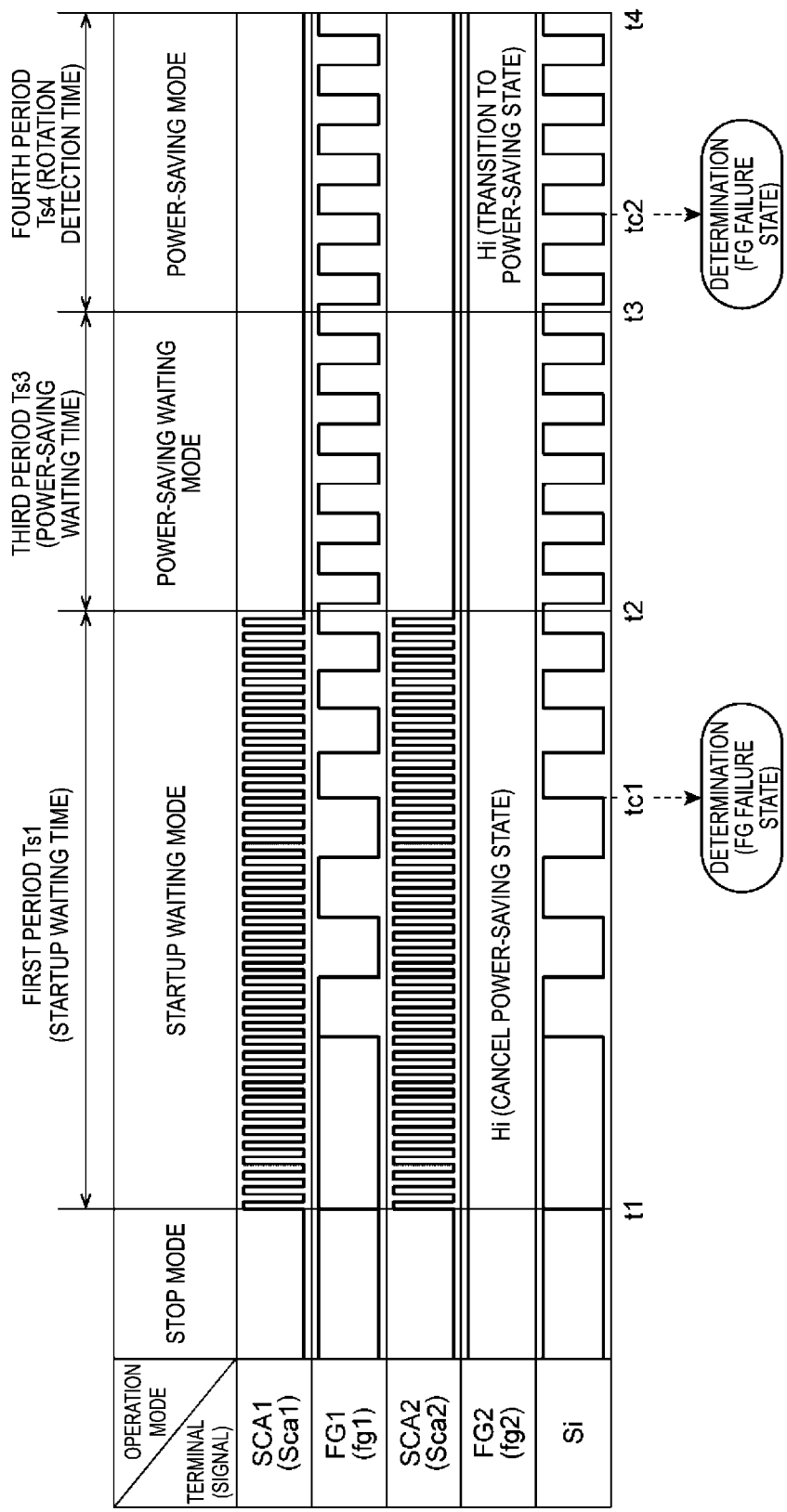
FIG. 29 is a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state and the motor drive circuit 10D_2 is in an FG failure state due to an FG open-circuit failure.

FIG. 29 is an example of a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state and the motor drive circuit 10D_2 is in an FG failure state due to the FG open-circuit failure. In FIG. 29, the vertical axis represents voltage or logical value of each signal, and the horizontal axis represents time.

When transitioning from the stop mode to the startup waiting mode at the time t1 as illustrated in FIG. 29 (step S10 in FIG. 22), the drive control circuit 20 outputs the drive control signals Sca1 and Sca2 having the predetermined startup duty ratio (step S11).

Then, the motor drive circuits 10D_1 and 10D_2 drive the motor 50 based on the drive control signals Sca1 and Sca2, and the motor 50 starts rotating. Because the motor drive circuit 10D_1 is in the normal state at this time, the change in the input of the position detection signals hp and hn by the rotation of the motor 50 is input to the motor drive circuit 10D_1, and thus the motor drive circuit 10D_1 outputs the signal fg1 with having duty ratio of 50% from the terminal FG1. On the other hand, because the motor drive circuit 10D_2 is in the FG failure state due to the FG open-circuit failure, the high-level signal fg2 is output from the terminal FG2. Thus, the composite signal Si output from the composite signal generation circuit 21 becomes a signal having a duty ratio of 50% in accordance with the signal fg1.

The drive control circuit 20 determines, within the first period Ts1 after transitioning to the startup waiting mode, that either the motor drive circuit 10D_1 or 10D_2 is in the FG failure state due to the FG open-circuit failure at a time tc1 when the composite signal Si is detected to have a predetermined change and is detected to have the duty ratio of 50% as illustrated in FIG. 29 (step S201).

Then, the drive control circuit 20 stops the output of the drive control signals Sca1 and Sca2, and transitions to the power-saving waiting mode at a time t2 (step S202). Because the motor 50 rotates by inertia after the time t2 as illustrated in FIG. 29, the motor drive circuit 10D_1 is in the normal state, and the signal fg1 having the duty ratio of 50% is output. Thus, while the signal fg1 is output, the motor drive circuit 10D_1 does not transition to the power-saving state.

On the other hand, because the motor drive circuit 10D_2 is in the FG failure state due to the FG open-circuit failure, the output of the signal fg2 is fixed to a high level. As a result, at the time t3 arriving after the third period Ts3 has elapsed from the time t2 when the input of the drive control signal Sca2 stopped, the drive control circuit 20 transitions to the power-saving mode, and the motor drive circuit 10D_2 transitions to the power-saving state (steps S203 and S204 in FIG. 24). Then, the drive control circuit 20 starts, at a time t4, the third FG failure determination processing (S300) to be described below. At this time, the drive control circuit 20 may start the third FG failure determination processing immediately after the determination at the time tc1 without waiting the end of the first period Ts1.

In this way, the drive control circuit 20 can determine that either the motor drive circuit 10D_1 or 10D_2 is in the FG failure state due to the FG open-circuit failure when, during the period outputting the drive control signals Sca1 and Sca2 to the motor drive circuits 10D of both systems, the composite signal Si is detected to have a predetermined change and is detected to have the duty ratio of 50%.

Further, the drive control circuit 20 may determine that either the motor drive circuit 10D_1 or 10D_2 is in the FG failure state due to the FG open-circuit failure at a time tc2 when detecting the composite signal Si having the duty ratio of 50% after transitioning to the power-saving mode by standardizing the processing flow not only with the period of the startup waiting mode but also with the first FG failure determination processing as illustrated in FIG. 29. At this time, the drive control circuit 20 may start the third FG failure determination processing immediately after the determination at the time tc2 without waiting the end of the fourth period Ts4.

Next, the third FG failure determination processing (S300) will be described using FIGS. 25A to 25D.

The third FG failure determination processing is processing for identifying the motor drive circuit 10D having the FG failure among the motor drive circuits 10D of the two systems and continuing forward rotation of the motor 50 while monitoring the number of rotations by using only the motor drive circuit 10D being in the normal state. This processing enables the motor drive circuit 10D having the FG failure to be identified even when the FG failure state is either the FG short-circuit failure or the FG open-circuit failure, or the FG failure state is switched.

The drive control circuit 20 executes the third FG failure determination processing (S300) when either the motor drive circuit 10D_1 or 10D_2 is determined to be in the FG failure state due to the FG short-circuit failure by the first FG failure determination processing (S100), or when either the motor drive circuit 10D_1 or 10D_2 is determined to be in the FG failure state due to the FG open-circuit failure by the second FG failure determination processing (S200) as described above.

Figure 25A:
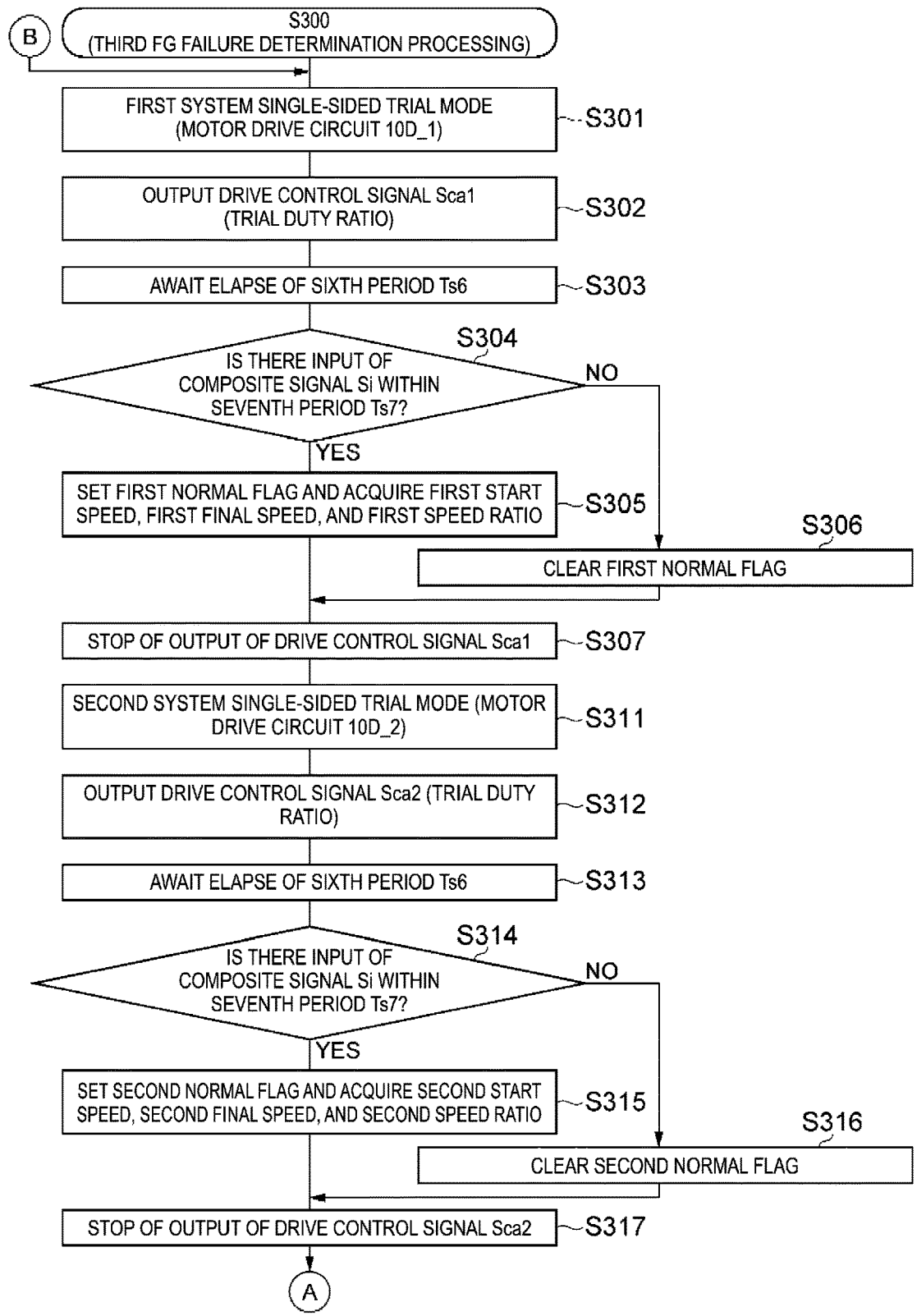
FIG. 25A is a flowchart illustrating a flow of drive state determination processing (third FG failure determination processing) for the fan performed by the motor drive control device according to the third embodiment.

In the third FG failure determination processing, first, the drive control circuit 20 transitions to a first system single-sided trial mode (step S301) as illustrated in FIG. 25A.

Here, the first system single-sided trial mode refers to an operation mode, to identify an occurrence location of the FG failure, for causing one motor drive circuit 10D (first system) of the motor drive circuits 10D_1 and 10D_2 of the two systems to operate with a preset fixed duty ratio (a trial duty ratio) and for causing the other motor drive circuit 10D (second system) to transition to the power-saving state.

Further, in the following description, causing either one motor drive circuit 10D of the motor drive circuits 10D_1 and 10D_2 of the two systems to operate and causing the other motor drive circuit 10D to transition to the power-saving state is also referred to as "single-sided drive".

Further, in the following description, a case of the motor drive circuit 10D_1 among the motor drive circuits 10D_1 and 10D_2 to be subject to single-sided drive as the first system single-sided trial mode will be described.

In the first system single-sided trial mode, first, the drive control circuit 20 outputs the drive control signal Sca1 having a predetermined trial duty ratio (step S302). At this time, the drive control signal Sca2 is not output. Here, the trial duty ratio may be the same as the startup duty ratio. Thereafter, the drive control circuit 20 awaits elapse of the period of the predetermined single-sided trial time (a sixth period Ts6) (step S303). At this time, the sixth period Ts6 is a time equal to or longer than the second period Ts2, and in the following description, the sixth period Ts6 is assumed to be a time equal to the third period Ts3.

Next, the drive control circuit 20 determines whether a predetermined change in the composite signal Si has been detected within a period of a predetermined single-sided rotation detection time (a seventh period Ts7) (step S304). For example, the seventh period Ts7 is a time equal to or longer than the second period Ts2. If a predetermined change in the composite signal Si has been detected (step S304: Yes), the drive control circuit 20 sets a first normal flag, assuming that the first motor drive circuit 10D_1 is in the normal state, and acquires a first start speed from the cycle of the composite signal Si.

Here, because a first falling edge of the composite signal Si may occur due to a restored internal power supply voltage caused by the cancellation of the power-saving state, the falling edge is not treated as an input of the composite signal Si. In other words, the drive control circuit 20 judges that the composite signal Si has been input from the time when the predetermined change in the composite signal Si is detected and starts measuring the cycle and the duty ratio of the composite signal Si. Thereafter, the drive control circuit 20 acquires a first final speed from the cycle of the final composite signal Si in the seventh period Ts7, calculates a first speed ratio (step S305), and then proceeds to step S307.

The first speed ratio is a ratio of the first final speed to the first start speed if the first start speed is acquired. For example, the first speed ratio is the percentage (%) obtained by dividing the first final speed by the first start speed. Thus, if the number of rotations of the motor 50 decreases from the start to the end of the seventh period Ts7, the value is less than 100.

On the other hand, if no predetermined change in the composite signal Si has been detected within the seventh period Ts7 (step S304: No), the drive control circuit 20 determines that the first motor drive circuit 10D_1 is in the FG failure state due to an FG short-circuit failure, clears the first normal flag, and proceeds to step S307. At this time, the drive control circuit 20 does not calculate a first speed ratio.

In step S307 where the seventh period Ts7 is ended, the drive control circuit 20 stops the output of the drive control signal Sca1. Thereafter, the drive control circuit 20 transitions to a second system single-sided trial mode (step S311).

Here, the second system single-sided trial mode refers to an operation mode, to identify an occurrence location of the FG failure, for causing one (first system) motor drive circuit 10D of the motor drive circuits 10D_1 and 10D_2 of the two systems operated in the first system single-sided trial mode to transition to a power-saving state and causing the other (second system) motor drive circuit 10D other than the aforementioned motor drive circuit 10D to operate with a predetermined trial duty ratio.

Here, a case of the motor drive circuit 10D_2 among the motor drive circuits 10D_1 and 10D_2 to be subject to single-sided drive as the second system single-sided trial mode will be described.

In the second system single-sided trial mode, first, the drive control circuit 20 outputs the drive control signal Sca2 having a predetermined trial duty ratio (step S312). At this time, the drive control signal Sca1 is not output. Then, the drive control circuit 20 awaits the elapse of the sixth period Ts6 (step S313).

Next, the drive control circuit 20 determines whether a predetermined change in the composite signal Si has been detected within the seventh period Ts7 (step S314). If a predetermined change in the composite signal Si has been detected (step S314: Yes), the drive control circuit 20 sets a second normal flag, assuming that the second motor drive circuit 10D_2 is in the normal state, and acquires a second start speed from the cycle of the composite signal Si.

Here, because a first falling edge of the composite signal Si may occur due to a restored internal power supply voltage caused by the cancellation of the power-saving state, the falling edge is not treated as an input of the composite signal Si. In other words, the drive control circuit 20 judges that the composite signal Si has been input from the time when the predetermined change in the composite signal Si is detected and starts measuring the cycle and the duty ratio of the composite signal Si. Thereafter, the drive control circuit 20 acquires a second final speed from the cycle of the final composite signal Si in the seventh period Ts7, calculates the second speed ratio (step S315), and then proceeds to step S317.

The second speed ratio is the ratio of the second final speed to the second start speed if the second start speed is acquired. For example, the second speed ratio is the percentage (%) obtained by dividing the second final speed by the second start speed. Thus, if the number of rotations of the motor 50 decreases from the start to the end of the seventh period Ts7, the value is less than 100.

On the other hand, if no predetermined change in the composite signal Si has been detected within the seventh period Ts7 (step S314: No), the drive control circuit 20 determines that the second motor drive circuit 10D_2 is in the FG failure state due to an FG short-circuit failure, clears the second normal flag, and proceeds to step S317. At this time, the second speed ratio is not calculated.

In step S317 where the seventh period Ts7 is ended, the drive control circuit 20 stops the output of the drive control signal Sca2. Thereafter, the drive control circuit 20 transitions to an FG failure-side determination mode (step S320 in FIG. 25B).

Figure 25B:
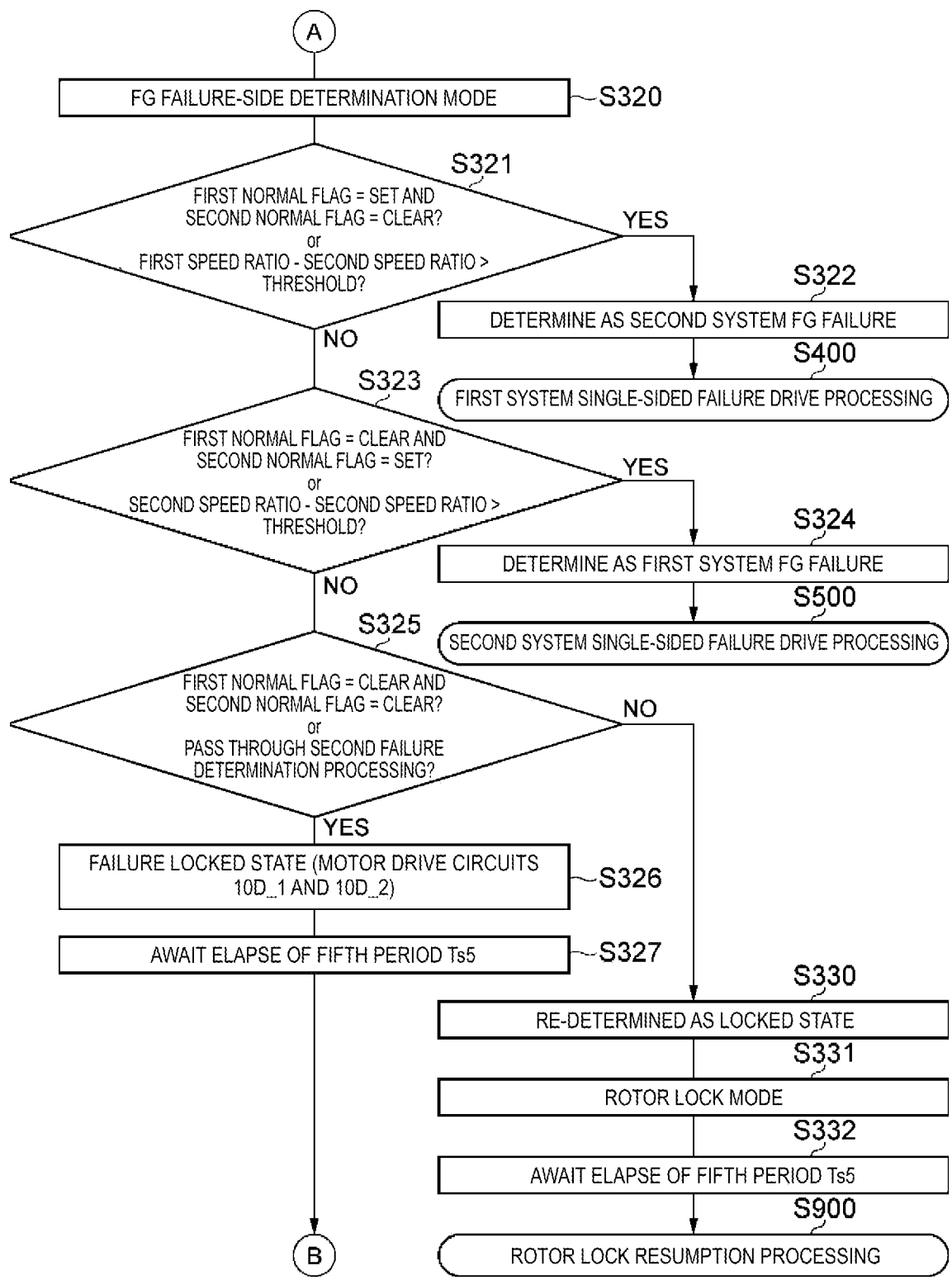
FIG. 25B is a flowchart illustrating the flow of the drive state determination processing (the third FG failure determination processing) for the fan performed by the motor drive control device according to the third embodiment.

As illustrated in FIG. 25B, the FG failure-side determination mode refers to a determination mode for identifying an occurrence location of the FG failure from the normal flags and the speed ratios acquired in the first system and the second system. Specifically, when single-sided drive is in a normal state, the normal flag is set, and the number of rotations is stable due to the predetermined trial duty ratio, and thus the speed ratio becomes high. On the other hand, if there is the FG failure, because the normal flag is cleared and switching (commutation) of an energization direction to the coil 80 does not occur for the motor 50 whose number of rotations decreases due to inertia, the rotation of the motor 50 may be braked, and thus the speed ratio becomes low.

The drive control circuit 20 performs, in step S321 as the FG failure-side determination mode, checking of the first normal flag and the second normal flag or comparing of the first speed ratio and the second speed ratio to determine whether the second system is in the FG failure state. If the first normal flag is set and the second normal flag is cleared (step S321: Yes), the drive control circuit 20 determines that the first system is in the normal state and the second system is in the FG failure state due to the FG short-circuit failure, proceeds to step S322, transitions to a single-sided failure drive mode, and thus executes the first system single-sided failure drive processing (S400). In addition, even when the first speed ratio is higher than the second speed ratio and greater than a predetermined threshold (step S321: Yes), the drive control circuit 20 determines that the first system is in the normal state and the second system is in the FG failure state due to the FG open-circuit failure and proceeds to step S322.

If the second system is not in the FG failure state (step S321: No), the drive control circuit 20 proceeds to step S323.

Next, if the second system is not in the FG failure state, the drive control circuit 20 performs, in step S323 as the FG failure-side determination mode, checking of the first normal flag and the second normal flag or comparing of the first speed ratio and the second speed ratio to determine whether the first system is in the FG failure state.

If the first normal flag is cleared and the second normal flag is set (step S323: Yes), the drive control circuit 20 determines that the first system is in the FG failure state due to the FG short-circuit failure and the second system is in the normal state, proceeds to step S324, transitions to the single-sided failure drive mode, and thus executes a second system single-sided failure drive processing (S500).

In addition, even when the second speed ratio is higher than the first speed ratio and greater than the predetermined threshold (step S323: Yes), the drive control circuit 20 determines that the first system is in the FG failure state due to the FG open-circuit failure and the second system is in the normal state and proceeds to step S324.

Here, the single-sided failure drive mode refers to an operation mode for causing only one motor drive circuit 10D being in the normal state among the motor drive circuits 10D of the two systems to operate and forcibly rotate the motor 50 at the number of rotations without depending on the speed command signal Sc. At this time, the motor drive circuit 10D being in the normal state outputs an FG signal having a duty ratio of 50%, the motor drive circuit 10D being in the FG failure state outputs a high-level FG signal due to being in the power-saving state, and the composite signal generation circuit 21 outputs the composite signal Si having a duty ratio of 50% in accordance with the FG signal of the motor drive circuit 10D being in the normal state. This allows the drive control circuit 20 to continue forward rotation of the fan motor while monitoring the number of rotations.

As the FG failure-side determination mode, the drive control circuit 20 proceeds to step S325 when both normal flags are the same or there is no clear difference between the speed ratios in steps S321 and S323 and determines whether both are in the FG failure state or have gone through the second FG failure determination processing. If both are in the FG failure state, that is, do not operate successfully (the first normal flag and the second normal flag are all cleared) or have gone through the second FG failure determination processing (step 325: Yes), the drive control circuit 20 judges that the motor 50 has not been rotated due to the rotor lock in each single-sided trial mode, determines to be a single-sided failure locked state (step S326), awaits the elapse of the fifth period Ts5 (step S327), and then resumes the third FG failure determination processing (S300).

If both are driven normally (the first normal flag and the second normal flag are all set) and have gone through the first FG failure determination processing (step 325: No), the drive control circuit 20 considers that rotor lock of the motor 50 is released due to any factor during the fourth period Ts4 of the power-saving mode in the first FG failure determination processing (step S104 in FIG. 23) and the state of the motor 50 rotating due to inertia is mistakenly determined to be the FG failure state due to the FG short-circuit failure, redetermines that the motor 50 is a locked state, and outputs the state signal So indicating the locked state of the fan 100D to the upper device 500 (step S330). Then, the drive control circuit 20 transitions to a rotor lock mode (step S331), awaits the elapse of the fifth period Ts5 (step S332), and then executes a rotor lock resumption processing (S900).

Figure 25C:
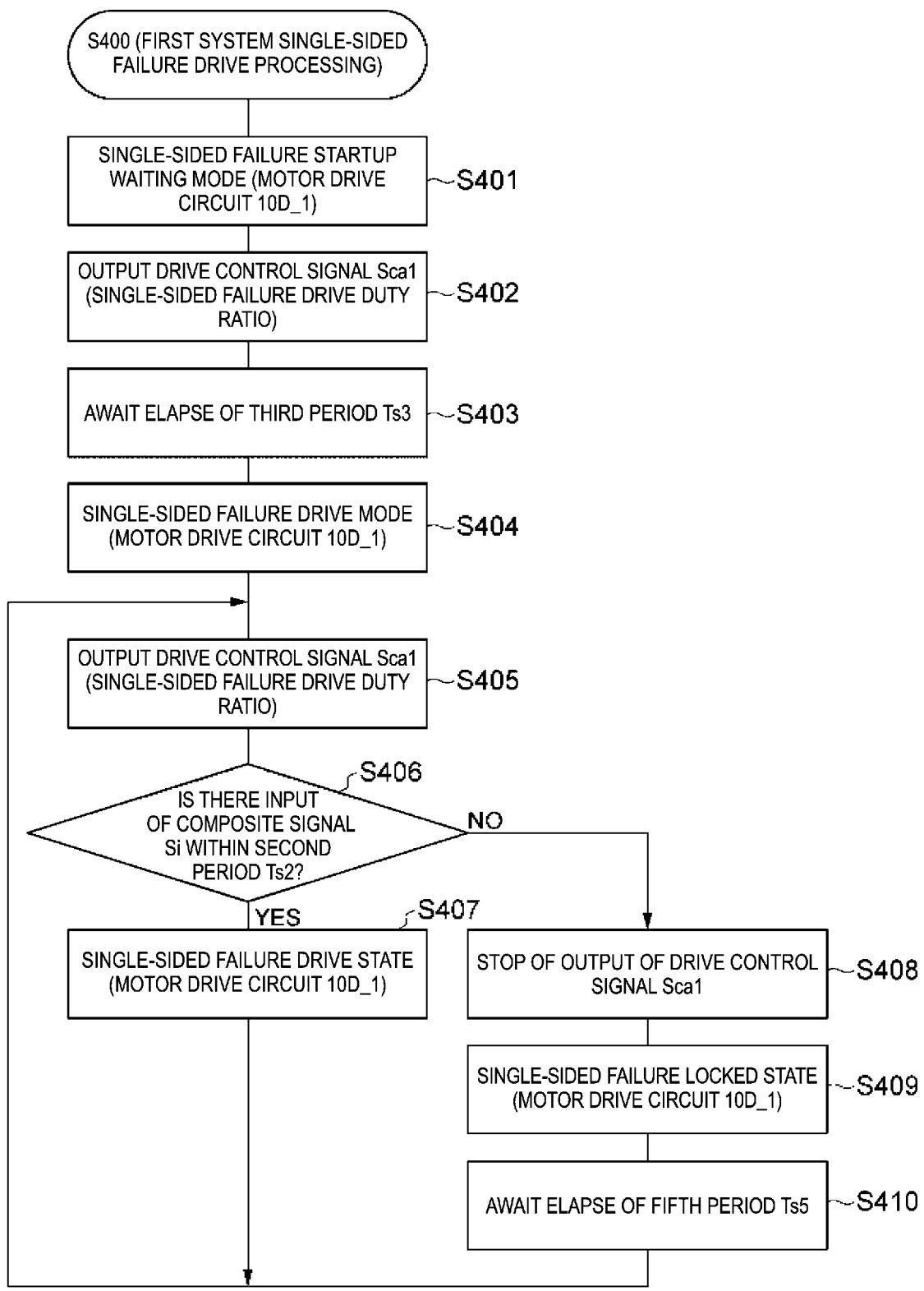
FIG. 25C is a flowchart illustrating a flow of drive state determination processing (first system single-sided failure drive processing) for a fan performed by the motor drive control device according to the third embodiment.

Next, the first system single-sided failure drive processing (S400) will be described using FIG. 25C.

In step S401, the drive control circuit 20 transitions to a single-sided failure startup waiting mode for causing the motor drive circuit 10D_1 operated in the first system single-sided trial mode to operate and outputs the state signal So indicating that the motor drive circuit 10D_2 is in the FG failure state to the upper device 500.

Here, in order to distinguish the locked state from the FG failure state, the drive control circuit 20 may output the state signal So as a ground voltage GND (low level) when being in the FG failure state. In addition, because the motor 50 can be driven by the motor drive circuit 10D on one side at this time, the drive control circuit 20 may output the FG signal having a duty ratio of 50% as the state signal So in the cycle according to the actual number of rotations of the motor 50 based on the composite signal Si generated by the composite signal generation circuit 21.

Next, the drive control circuit 20 generates a drive control signal Sca1 having a preset fixed duty ratio (single-sided failure drive duty ratio) and applies the drive control signal Sca1 to the motor drive circuit 10D_1 (step S402). Here, the single-sided failure drive duty ratio may be the same as the trial duty ratio.

Thereafter, the drive control circuit 20 awaits the elapse of the third period Ts3 (step S403) and transitions to a single-sided failure drive mode (step S404).

Next, the drive control circuit 20 outputs the drive control signal Sca1 having a predetermined single-sided failure drive duty ratio (step S405). After that, the drive control circuit 20 determines whether a predetermined change in the composite signal Si has been detected within the second period Ts2 (step S406).

If a predetermined change in the composite signal Si has been detected (step S406: Yes), the drive control circuit 20 determines to be in a single-sided failure drive state (step S407) and repeatedly executes steps S405 to S407. On the other hand, if no predetermined change in the composite signal Si has been detected (step S406: NO), the drive control circuit 20 stops the output of the drive control signal Sca1 (step S408) on the assumption that the motor 50 is stopped due to the rotor lock (less than the minimum number of rotations), determines to be in a single-sided failure locked state (step S409), awaits the elapse of the fifth period Ts5 (step S410), and then resumes single-sided failure drive.

Figure 25D:
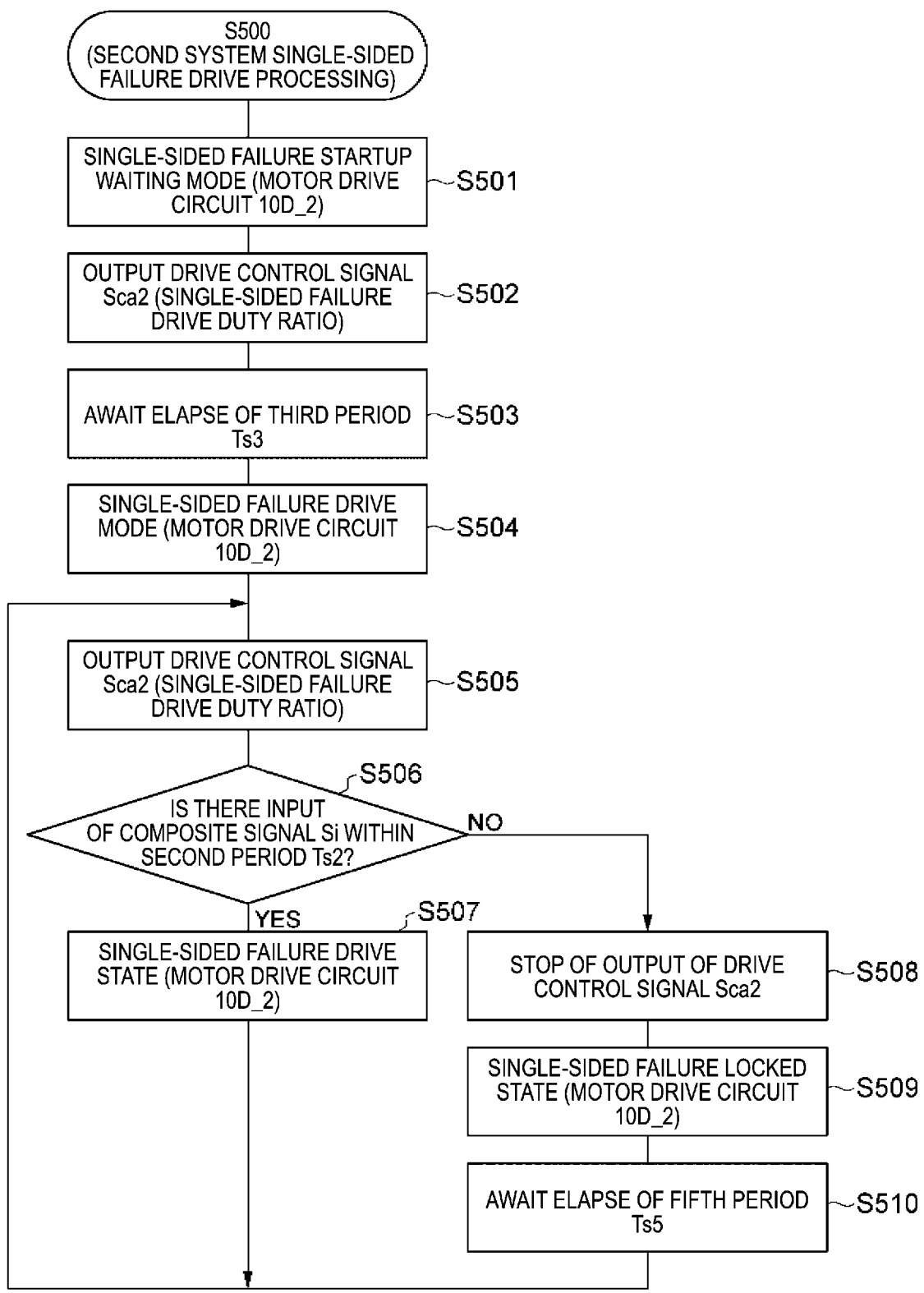
FIG. 25D is a flowchart illustrating a flow of drive state determination processing (second system single-sided failure drive processing) for the fan performed by the motor drive control device according to the third embodiment.

Next, the second system single-sided failure drive processing (S500) will be described using FIG. 25D.

In step S501, the drive control circuit 20 transitions to a single-sided failure startup waiting mode for causing the motor drive circuit 10D_2 operated in the second system single-sided trial mode to operate and outputs the state signal So indicating that the motor drive circuit 10D_1 is in the FG failure state to the upper device 500.

Next, the drive control circuit 20 generates a drive control signal Sca2 having a predetermined single-sided failure drive duty ratio and applies the drive control signal Sca2 to the motor drive circuit 10D_2 (step S502). Thereafter, the drive control circuit 20 awaits the elapse of the third period Ts3 (step S503) and transitions to the single-sided failure drive mode (step S504).

Next, the drive control circuit 20 outputs the drive control signal Sca2 having a predetermined single-sided failure drive duty ratio (step S505). After that, the drive control circuit 20 determines whether a predetermined change in the composite signal Si has been detected within the second period Ts2 (step S506).

If a predetermined change in the composite signal Si has been detected (step S506: Yes), the drive control circuit 20 determines to be in a single-sided failure drive state (step S507) and repeatedly executes steps S505 to S507. On the other hand, if no predetermined change in the composite signal Si has been detected (step S506: NO), the drive control circuit 20 stops the output of the drive control signal Sca2 (step S508) on the assumption that the motor 50 is stopped due to the rotor lock (less than the minimum number of rotations), determines to be in a single-sided failure locked state (step S509), awaits the elapse of the fifth period Ts5 (step S510), and then resumes single-sided failure drive.

Figure 30:
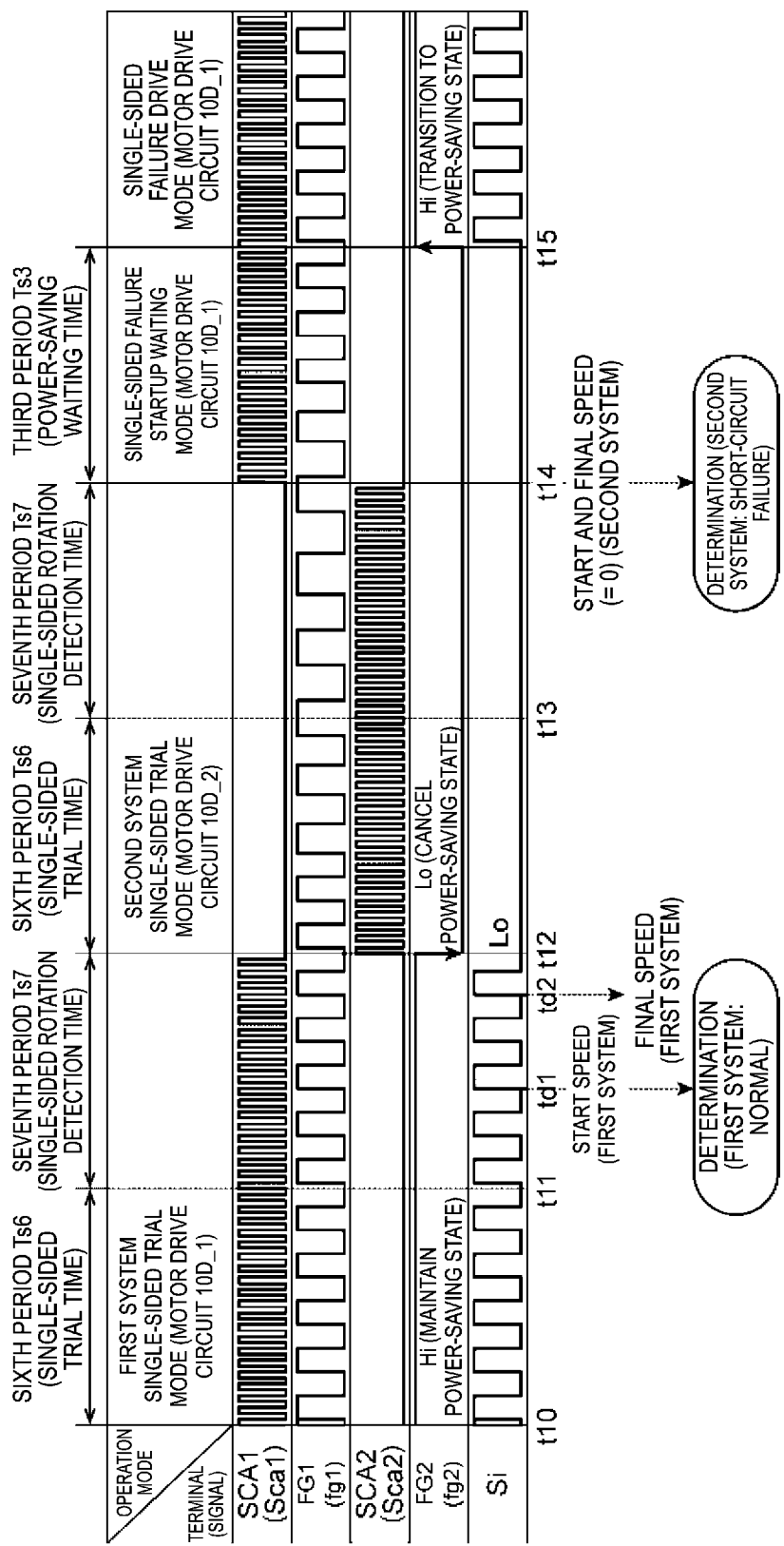
FIG. 30 is a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state, the motor drive circuit 10D_2 is in the FG failure state due to the FG short-circuit failure, and the motor drive circuit 10D_1 in the normal state is single-sided driven first.

FIG. 30 is an example of a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state, the motor drive circuit 10D_2 is in the FG failure state due to the FG short-circuit failure, and the motor drive circuit 10D_1 in the normal state is single-sided driven first. In FIG. 30, the vertical axis represents voltage or logical value of each signal, and the horizontal axis represents time.

As illustrated in FIG. 30, with the start of the third FG failure determination processing at a time t10, the drive control circuit 20 transitions from the power-saving mode to the first system single-sided trial mode for causing the first motor drive circuit 10D_1 to operate (step S301 in FIG. 25A). In the first system single-sided trial mode, the drive control circuit 20 outputs the drive control signal Sca1 having a predetermined trial duty ratio (step S302). At this time, the drive control circuit 20 does not output the drive control signal Sca2.

With this configuration, the motor drive circuit 10D_1 is in the normal state and drives the motor 50 based on the drive control signal Sca1, and the motor 50 rotating due to inertia or stopping transitions to the number of rotations corresponding to the trial duty ratio. At this time, the motor drive circuit 10D_1 outputs the signal fg1 having a duty ratio of 50% from the terminal FG1 because the input of the position detection signals hp and hn changes due to the rotation of the motor 50. On the other hand, the motor drive circuit 10D_2 is in the FG failure state due to the FG short-circuit failure, but outputs the high-level signal fg2 from the terminal FG2 because of maintaining of the power-saving state. Thus, the composite signal generation circuit 21 outputs the composite signal Si having the duty ratio of 50% in accordance with the signal fg1. Then, the drive control circuit 20 awaits the elapse of the sixth period Ts6 (step S303).

Next, at a time t11 when the sixth period Ts6 has elapsed, the drive control circuit 20 awaits the elapse of the seventh period Ts7 and determines whether a predetermined change in the composite signal Si has been detected within the seventh period Ts7 (step S304) as illustrated in FIG. 30. At this time, the motor drive circuit 10D_1 is in the normal state and outputs the signal fg1 having a duty ratio of 50% from the terminal FG1. On the other hand, because the motor drive circuit 10D_2 is in the power-saving state, the high-level signal fg2 is output from the terminal FG2. Thus, the composite signal generation circuit 21 outputs the composite signal Si having the duty ratio of 50% in accordance with the signal fg1. As a result, within the seventh period Ts7, the drive control circuit 20 detects a predetermined change in the composite signal Si (step S304: Yes) and, at a time td1 when the predetermined change in the composite signal Si is detected, temporarily determines that the first motor drive circuit 10D_1 is in the normal state, sets the first normal flag, and acquires the first start speed from the cycle of the composite signal Si. Furthermore, at a final time td2 when the cycle of the composite signal Si is detected within the seventh period Ts7, the drive control circuit 20 acquires the first final speed from the cycle of the composite signal Si and calculates the first speed ratio (step S305).

Next, at a time t12 when the seventh period Ts7 has elapsed, the drive control circuit 20 stops the output of the drive control signal Sca1 (step S307) and transitions from the first system single-sided trial mode for single-sided driving of the first motor drive circuit 10D_1 to the second system single-sided trial mode for single-sided driving of the second motor drive circuit 10D_2 (step S311) as illustrated in FIG. 30.

In the second system single-sided trial mode, the drive control circuit 20 outputs the drive control signal Sca2 having a predetermined trial duty ratio (step S312).

Thus, although the motor drive circuit 10D_2 attempts to drive the motor 50 instead of the motor drive circuit 10D_1, the motor is not driven due to the FG failure, and the rotation of the motor 50 continues by inertial. At this time, although the motor drive circuit 10D_1 is in the normal state and the drive control signal Sca1 is not input, the input of the position detection signals hp and hn is changed, and thus, the signal fg1 having the duty ratio of 50% is output from the terminal FG1 without transitioning to the power-saving state. On the other hand, the motor drive circuit 10D_2 is in the FG failure state due to the FG short-circuit failure but outputs the low-level signal fg2 from the terminal FG2 because the power-saving state is canceled by the input of the drive control signal Sca2. Thus, the composite signal Si output from the composite signal generation circuit 21 has a low level. Then, the drive control circuit 20 awaits the elapse of the sixth period Ts6 (step S313).

Next, at a time t13 when the sixth period Ts6 has elapsed, the drive control circuit 20 awaits the elapse of the seventh period Ts7 and determines whether a predetermined change in the composite signal Si has been detected within the seventh period Ts7 (step S314) as illustrated in FIG. 30. At this time, the motor drive circuit 10D_1 is in the normal state and outputs the signal fg1 having a duty ratio of 50% from the terminal FG1 while the motor 50 is rotating by inertia because the input of the position detection signals hp and hn changes.

On the other hand, the motor drive circuit 10D_2 is in the FG failure state due to the FG short-circuit failure and outputs the low-level signal fg2 from the terminal FG2. Thus, the composite signal Si output from the composite signal generation circuit 21 has a low level. As a result, no predetermined change in the composite signal Si is detected within the seventh period Ts7 (step S314: No).

Next, at a time t14 when the seventh period Ts7 has elapsed, the drive control circuit 20 clears the second normal flag and determines that the second motor drive circuit 10D_2 is in the FG failure state due to the FG short-circuit failure (step S316) as illustrated in FIG. 30. Thereafter, the drive control circuit 20 stops the output of the drive control signal Sca2 (step S317) and transitions to the FG failure-side determination mode (step S320 in FIG. 25B).

In the FG failure-side determination mode, because the first normal flag is set and the second normal flag is cleared (step S321: Yes), the drive control circuit 20 determines that the motor drive circuit 10D_2 is in the FG failure state (step S322) and executes the first system single-sided failure drive processing (S400 in FIG. 25C).

In the first system single-sided failure drive processing, the drive control circuit 20 transitions to the single-sided failure startup waiting mode (step S401), generates the drive control signal Sca1 having a predetermined single-sided failure drive duty ratio with respect to the motor drive circuit 10D_1, and gives the drive control signal Sca1 to the motor drive circuit 10D_1 (step S402). Thus, the motor drive circuit 10D_1 drives the motor 50 based on the drive control signal Sca1. Thereafter, the drive control circuit 20 awaits the elapse of the third period Ts3 (step S403).

Next, at a time t15 when the third period Ts3 has elapsed, the motor drive circuit 10D_2 transitions to the power-saving state as illustrated in FIG. 30. At this time, the motor drive circuit 10D_1 is in the normal state and outputs the signal fg1 having a duty ratio of 50% from the terminal FG1. On the other hand, because the motor drive circuit 10D_2 is in the power-saving state, the high-level signal fg2 is output from the terminal FG2. Thus, the composite signal generation circuit 21 outputs the composite signal Si having the duty ratio of 50% in accordance with the signal fg1. As a result, after the time t15, the composite signal Si becomes a signal having a duty ratio of 50% in accordance with the signal fg1 until the motor 50 is stopped (less than the minimum number of rotations).

Thereafter, the drive control circuit 20 transitions to the single-sided failure drive mode (step S404) and continuously outputs the drive control signal Sca1 having a predetermined single-sided failure drive duty ratio (step S405) to continue forward rotation of the motor 50 while monitoring the number of rotations by using only the motor drive circuit 10D_1 being in the normal state (steps S405 to S407).

As described above, when any one of the motor drive circuits 10D of the two systems has an FG short-circuit failure and even when the motor drive circuit 10D_1 being in the normal state is single-sided driven first, the drive control circuit 20 can determine the normal motor drive circuit 10D and the FG short-circuit failure motor drive circuit 10D based on the composite signal Si. This allows the drive control circuit 20 to continue forward rotation of the motor 50 while monitoring the number of rotations only using the normal motor drive circuit 10D.

Figure 31:
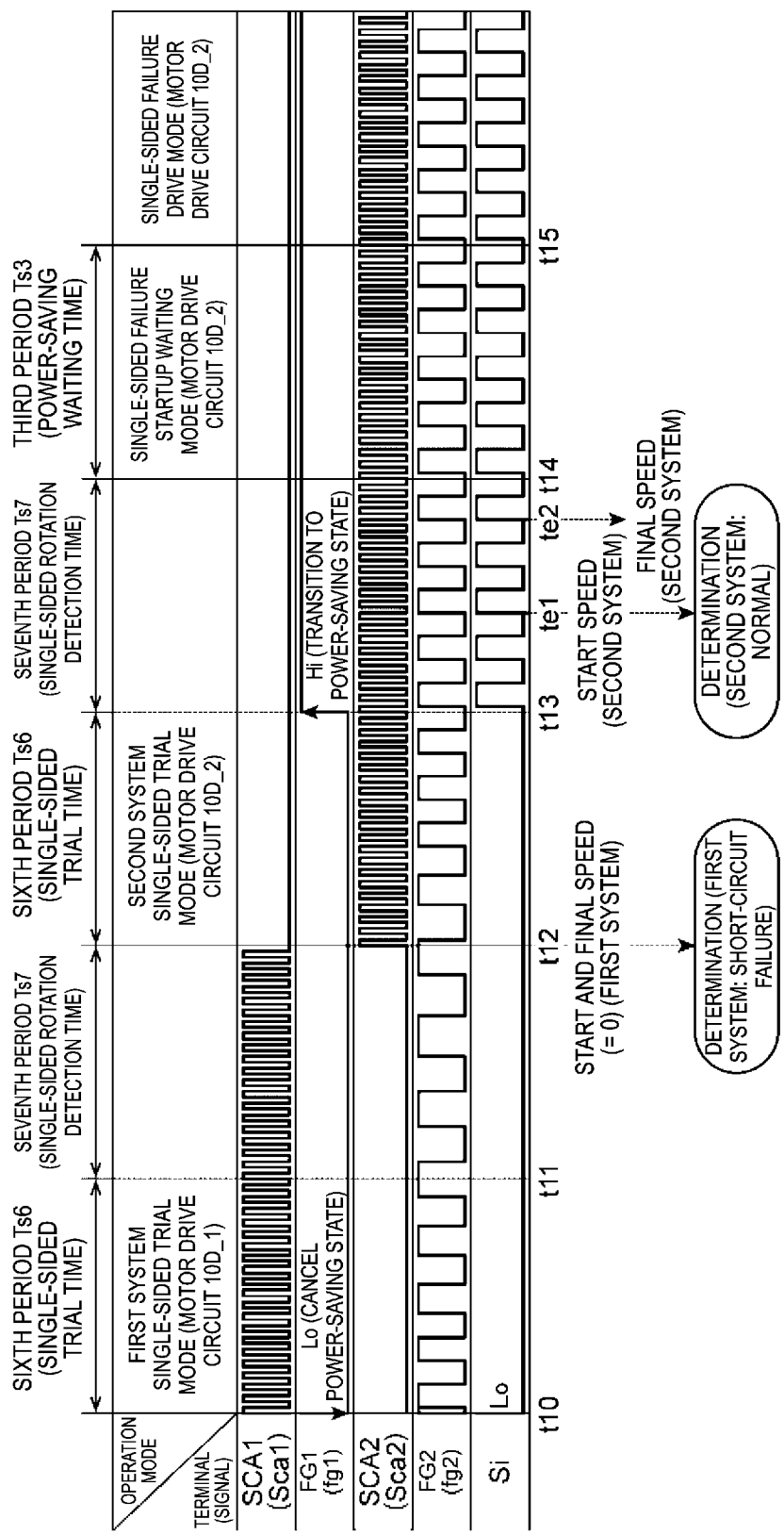
FIG. 31 is a timing chart showing the drive control signals Sca1 and Sca2 (terminals SCA1 and SCA2), the signals fg1 and fg2 (terminals FG1 and FG2), and the composite signal Si when the motor drive circuit 10D_1 is in an FG failure state due to an FG short-circuit failure, the motor drive circuit 10D_2 is in the normal state, and the motor drive circuit 10D_1 in the FG failure state is single-sided driven first.

FIG. 31 is an example of a timing chart showing the drive control signals Sca1 and Sca2 (terminals SCA1 and SCA2), the signals fg1 and fg2 (terminals FG1 and FG2), and the composite signal Si when the motor drive circuit 10D_1 is in an FG failure state due to an FG short-circuit failure, the motor drive circuit 10D_2 is in the normal state, and the motor drive circuit 10D_1 in the FG failure state is single-sided driven first. In FIG. 31, the vertical axis represents voltage or logical value of each signal, and the horizontal axis represents time.

As illustrated in FIG. 31, with the start of the third FG failure determination processing at the time t10, the drive control circuit 20 transitions from the power-saving mode to the first system single-sided trial mode for causing the first motor drive circuit 10D_1 to operate (step S301 in FIG. 25A). In the first system single-sided trial mode, the drive control circuit 20 outputs the drive control signal Sca1 having a predetermined trial duty ratio (step S302). At this time, the drive control circuit 20 does not output the drive control signal Sca2.

Thus, the motor drive circuit 10D_1 is in the FG failure state due to the FG short-circuit failure but outputs the low-level signal fg1 from the terminal FG1 because the power-saving state is canceled by the input of the drive control signal Sca1. On the other hand, the motor drive circuit 10D_2 is in the normal state. Therefore, although the drive control signal Sca2 is not input to the motor drive circuit 10D_2, the motor drive circuit 10D_2 outputs the signal fg2 having a duty ratio of 50% from the terminal FG2 without transitioning to the power-saving state while the motor 50 rotates by inertia because the input of the position detection signals hp and hn changes due to the rotation of the motor 50. Thus, the composite signal Si output from the composite signal generation circuit 21 has a low level. Then, the drive control circuit 20 awaits the elapse of the sixth period Ts6 (step S303).

Next, when the sixth period Ts6 elapses at the time t11, the drive control circuit 20 awaits the elapse of the seventh period Ts7 and determines whether a predetermined change in the composite signal Si has been detected within the seventh period Ts7 (step S304) as illustrated in FIG. 31. At this time, the motor drive circuit 10D_1 is in the FG failure state due to the FG short-circuit failure and outputs the low-level signal fg1 from the terminal FG1. On the other hand, the motor drive circuit 10D_2 is in the normal state and outputs the signal fg2 having a duty ratio of 50% from the terminal FG2 while the motor 50 is rotating by inertia because the input of the position detection signals hp and hn changes. Thus, the composite signal Si output from the composite signal generation circuit 21 has a low level. As a result, no predetermined change in the composite signal Si is detected within the seventh period Ts7 (step S304: No).

Next, when the seventh period Ts7 elapses at the time t12, the drive control circuit 20 clears the first normal flag and determines that the first system single-sided motor drive circuit 10D_1 is in the FG failure state due to the FG short-circuit failure (step S306) as illustrated in FIG. 31. Thereafter, the drive control circuit 20 stops the output of the drive control signal Sca1 (step S307) and transitions from the first system single-sided trial mode for single-sided driving of the first motor drive circuit 10D_1 to the second system single-sided trial mode for single-sided driving of the second motor drive circuit 10D_2 (step S311).

In the second system single-sided trial mode, the drive control circuit 20 outputs the drive control signal Sca2 having a predetermined trial duty ratio (step S312).

Thus, the motor 50 is driven by the motor drive circuit 10D_2, instead of the motor drive circuit 10D_1, and the rotation of the motor 50 continues. At this time, the motor drive circuit 10D_1 is in the FG failure state due to the FG short-circuit failure and outputs the low-level signal fg1 from the terminal FG1. On the other hand, the motor drive circuit 10D_2 is in the normal state and drives the motor 50 based on the drive control signal Sca2, and the motor 50 rotating due to inertia or stopping transitions to the number of rotations corresponding to the duty ratio. At this time, the motor drive circuit 10D_2 outputs the signal fg2 having the duty ratio of 50% from the terminal FG2 because the input of the position detection signals hp and hn changes due to the rotation of the motor 50. Thus, the composite signal Si output from the composite signal generation circuit 21 has a low level. Then, the drive control circuit 20 awaits the elapse of the sixth period Ts6 (step S313).

Next, at the time t13 when the sixth period Ts6 has elapsed, the motor drive circuit 10D_1 transitions to the power-saving state, and the drive control circuit 20 awaits the elapse of the seventh period Ts7 and determines whether a predetermined change in the composite signal Si has been detected within the seventh period Ts7 (step S314) as illustrated in FIG. 31. At this time, because the motor drive circuit 10D_1 is in the power-saving state, a high-level signal fg1 is output from the terminal FG1. On the other hand, the motor drive circuit 10D_2 is in a normal state and outputs a signal fg2 having the duty ratio of 50% from the terminal FG2. Thus, the composite signal generation circuit 21 outputs the composite signal Si having the duty ratio of 50% in accordance with the signal fg2. As a result, within the seventh period Ts7, the drive control circuit 20 detects a predetermined change in the composite signal Si (step S314: Yes) and, at a time te1 when the predetermined change in the composite signal Si is detected, temporarily determines that the second motor drive circuit 10D_2 is in the normal state, sets the second normal flag, and acquires the second start speed from the cycle of the composite signal Si. Furthermore, at a final time te2 when the cycle of the composite signal Si is detected within the seventh period Ts7, the drive control circuit 20 acquires the second final speed from the cycle of the composite signal Si and calculates the second speed ratio (step S315).

Next, when the seventh period Ts7 elapses at the time t14, the drive control circuit 20 stops the output of the drive control signal Sca2 (step S317) and transitions to the FG failure-side determination mode (step S320 in FIG. 25B) as illustrated in FIG. 31.

In the FG failure-side determination mode, because the first normal flag is cleared and the second normal flag is set (step S323: Yes), the drive control circuit 20 determines that the motor drive circuit 10D_1 is in the FG failure state (step S324) and executes the second system single-sided failure drive processing (S500 in FIG. 25D).

In the second system single-sided failure drive processing, the drive control circuit 20 transitions to the single-sided failure startup waiting mode (step S501), generates the drive control signal Sca2 having a predetermined single-sided failure drive duty ratio with respect to the motor drive circuit 10D_2, and gives the drive control signal Sca2 to the motor drive circuit 10D_2 (step S502). Thus, the motor drive circuit 10D_2 drives the motor 50 based on the drive control signal Sca2. Thereafter, the drive control circuit 20 awaits the elapse of the third period Ts3 (step S503).

Next, when the third period Ts3 elapses at the time t15, the motor drive circuit 10D_1 maintains the power-saving state as illustrated in FIG. 31. At this time, because the motor drive circuit 10D_1 is in the power-saving state, a high-level signal fg1 is output from the terminal FG1. On the other hand, the motor drive circuit 10D_2 is in a normal state and outputs a signal fg2 having the duty ratio of 50% from the terminal FG2. Thus, the composite signal generation circuit 21 outputs the composite signal Si having the duty ratio of 50% in accordance with the signal fg2. As a result, after the time t15, the composite signal Si becomes a signal having the duty ratio of 50% in accordance with the signal fg2 until the motor 50 is stopped (less than the minimum number of rotations).

Thereafter, the drive control circuit 20 transitions to the single-sided failure drive mode (step S504) and continuously outputs the drive control signal Sca2 having a predetermined single-sided failure drive duty ratio (step S505) to continue forward rotation of the motor 50 while monitoring the number of rotations by using only the motor drive circuit 10D_2 being in the normal state (steps S505 to S507).

As described above, when any one of the motor drive circuits 10D of the two systems has an FG short-circuit failure and even when the motor drive circuit 10D_1 being in the FG failure state is single-sided driven first, the drive control circuit 20 can determine the normal motor drive circuit 10D and the FG short-circuit failure motor drive circuit 10D based on the composite signal Si. This allows the drive control circuit 20 to continue the forward rotation of the motor 50 only by using the normal motor drive circuit 10D while monitoring the number of rotations.

Figure 32:
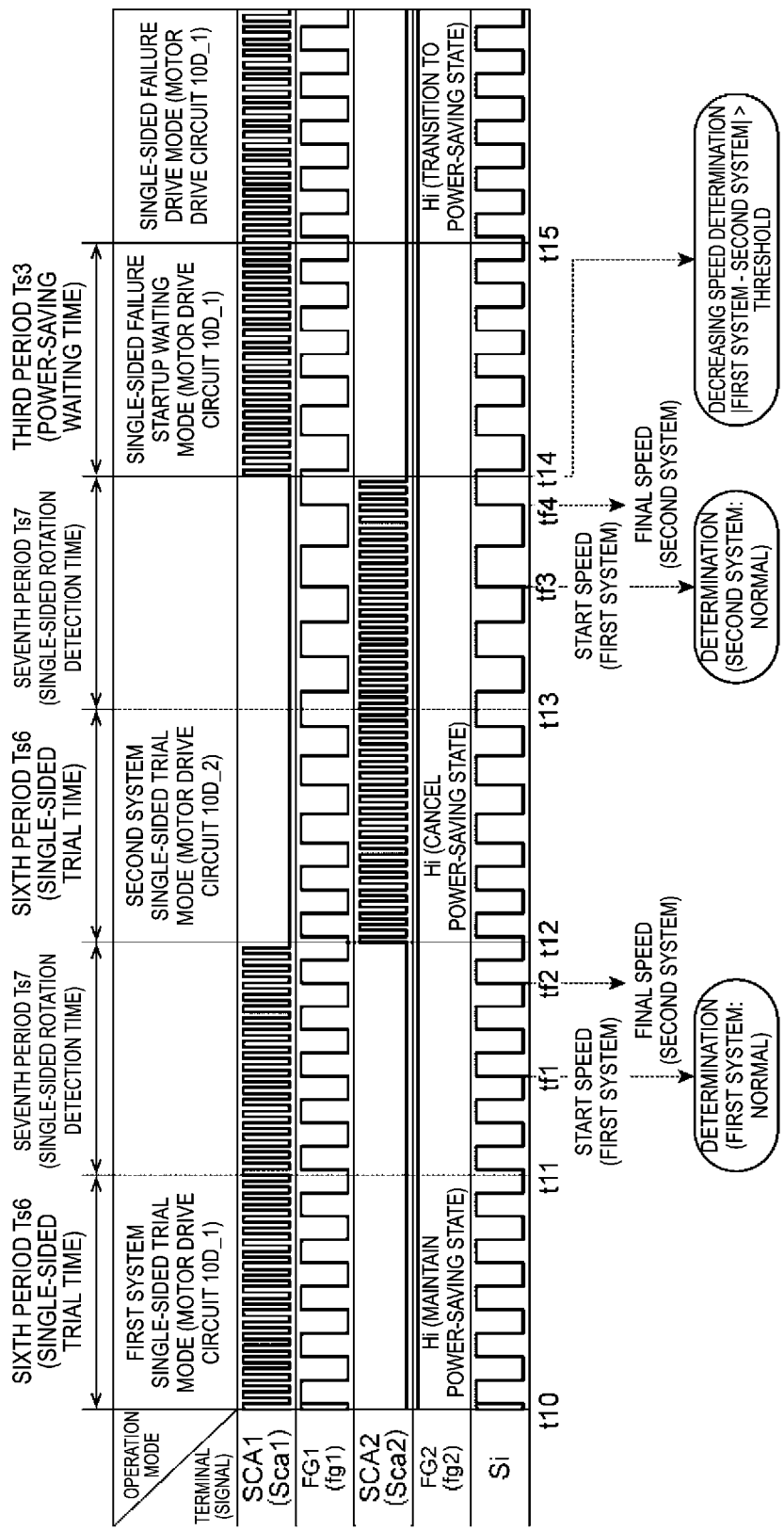
FIG. 32 is a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state, the motor drive circuit 10D_2 is in an FG failure state due to an FG open-circuit failure, and the motor drive circuit 10D_1 in the normal state is single-sided driven first.

FIG. 32 is an example of a timing chart showing the drive control signals Sca1 and Sca2 (terminals SCA1 and SCA2), the signals fg1 and fg2 (terminals FG1 and FG2), and the composite signal Si when the motor drive circuit 10D_1 is in the normal state, the motor drive circuit 10D_2 is in the FG failure state due to the FG open-circuit failure, and the motor drive circuit 10D_1 in the normal state is single-sided driven first. In FIG. 32, the vertical axis represents voltage or logical value of each signal, and the horizontal axis represents time.

As illustrated in FIG. 32, with the start of the third FG failure determination processing at the time t10, the drive control circuit 20 transitions from the power-saving mode to the first system single-sided trial mode for causing the first motor drive circuit 10D_1 to operate (step S301 in FIG. 25A). In the first system single-sided trial mode, the drive control circuit 20 outputs the drive control signal Sca1 having a predetermined trial duty ratio (step S302). At this time, the drive control circuit 20 does not output the drive control signal Sca2.

Thus, the motor drive circuit 10D_1 is in the normal state and drives the motor 50 based on the drive control signal Sca1, and the motor 50 rotating due to inertia or stopping transitions to the number of rotations corresponding to the duty ratio. At this time, the motor drive circuit 10D_1 outputs the signal fg1 having the duty ratio of 50% from the terminal FG1 because the input of the position detection signals hp and hn changes due to the rotation of the motor 50. On the other hand, the motor drive circuit 10D_2 is in the FG failure state due to the FG open-circuit failure and outputs the high-level signal fg2 from the terminal FG2 because of maintaining of the power-saving state. Thus, the composite signal generation circuit 21 outputs the composite signal Si having the duty ratio of 50% in accordance with the signal fg1. Then, the drive control circuit 20 awaits the elapse of the sixth period Ts6 (step S303).

Next, when the sixth period Ts6 elapses at the time t11, the drive control circuit 20 awaits the elapse of the seventh period Ts7 and determines whether a predetermined change in the composite signal Si has been detected within the seventh period Ts7 (step S304) as illustrated in FIG. 32. At this time, the motor drive circuit 10D_1 is in the normal state and outputs the signal fg1 having a duty ratio of 50% from the terminal FG1. On the other hand, because the motor drive circuit 10D_2 is in the power-saving state, the high-level signal fg2 is output from the terminal FG2. Thus, the composite signal generation circuit 21 outputs the composite signal Si having the duty ratio of 50% in accordance with the signal fg1. As a result, within the seventh period Ts7, the drive control circuit 20 detects a predetermined change in the composite signal Si (step S304: Yes) and, at a time tf1 when the predetermined change in the composite signal Si is detected, temporarily determines that the first motor drive circuit 10D_1 is in the normal state, sets the first normal flag, and acquires the first start speed from the cycle of the composite signal Si. Furthermore, at a final time tf2 when the cycle of the composite signal Si is detected within the seventh period Ts7, the drive control circuit 20 acquires the first final speed from the cycle of the composite signal Si and calculates the first speed ratio (step S305).

Next, at a time t12 when the seventh period Ts7 has elapsed, the drive control circuit 20 stops the output of the drive control signal Sca1 (step S307) and transitions from the first system single-sided trial mode for single-sided driving of the first motor drive circuit 10D_1 to a second system single-sided trial mode for single-sided driving of the second motor drive circuit 10D_2 (step S311) as illustrated in FIG. 32.

In the second system single-sided trial mode, the drive control circuit 20 outputs the drive control signal Sca2 having a predetermined trial duty ratio (step S312).

Thus, although the motor drive circuit 10D_2 attempts to drive the motor 50 instead of the motor drive circuit 10D_1, the motor is not driven due to the FG failure, and the rotation of the motor 50 continues by inertial. At this time, although the motor drive circuit 10D_1 is in the normal state and the drive control signal Sca1 is not input, the input of the position detection signals hp and hn is changed, and thus, the signal fg1 having the duty ratio of 50% is output from the terminal FG1. On the other hand, the motor drive circuit 10D_2 is in the FG failure state due to the FG open-circuit failure and cancels the power-saving state by the input the drive control signal Sca2, but outputs a high-level signal fg2 from the terminal FG2. Thus, the composite signal generation circuit 21 outputs the composite signal Si having the duty ratio of 50% in accordance with the signal fg1. Then, the drive control circuit 20 awaits the elapse of the sixth period Ts6 (step S313).

Next, at the time t13 when the sixth period Ts6 has elapsed, the drive control circuit 20 awaits the elapse of the seventh period Ts7 and determines whether a predetermined change in the composite signal Si has been detected within the seventh period Ts7 (step S314) as illustrated in FIG. 32. At this time, the motor drive circuit 10D_1 is in the normal state and outputs the signal fg1 having the duty ratio of 50% from the terminal FG1 without transitioning to the power-saving state while the motor 50 is rotating by inertia because the input of the position detection signals hp and hn changes. On the other hand, the motor drive circuit 10D_2 is the FG failure state due to the FG open-circuit failure and outputs the high-level signal fg2 from the terminal FG2. Thus, the composite signal generation circuit 21 outputs the composite signal Si having the duty ratio of 50% in accordance with the signal fg1. As a result, within the seventh period Ts7, the drive control circuit 20 detects a predetermined change in the composite signal Si (step S314: Yes) and, at a time tf3 when the predetermined change in the composite signal Si is detected, temporarily determines that the second motor drive circuit 10D_2 is in the normal state, sets the second normal flag, and acquires the second start speed from the composite signal Si. Furthermore, at a final time tf4 when the cycle of the composite signal Si is detected within the seventh period Ts7, the drive control circuit 20 acquires the second final speed from the cycle of the composite signal Si and calculates the second speed ratio (step S315).

Next, when the seventh period Ts7 elapses at the time t14, the drive control circuit 20 stops the output of the drive control signal Sca2 (step S317) and transitions to the FG failure-side determination mode (step S320 in FIG. 25B) as illustrated in FIG. 32.

In the FG failure-side determination mode, because the first normal flag is set and the second normal flag is set, but the first speed ratio is high due to the stabilized number of rotations due to driving and the second speed ratio is low due to the decreasing number of rotations due to inertia (step S321: Yes), the drive control circuit 20 determines that the motor drive circuit 10D_2 is in the FG failure state (step S322) and executes the first system single-sided failure drive processing (S400 in FIG. 25C).

In the first system single-sided failure drive processing, the drive control circuit 20 transitions to the single-sided failure startup waiting mode (step S401), generates the drive control signal Sca1 having a predetermined single-sided failure drive duty ratio with respect to the motor drive circuit 10D_1, and gives the drive control signal Sca1 to the motor drive circuit 10D_1 (step S402). Thus, the motor drive circuit 10D_1 drives the motor 50 based on the drive control signal Sca1. Thereafter, the drive control circuit 20 awaits the elapse of the third period Ts3 (step S403).

Next, at the time t15 when the third period Ts3 has elapsed, the motor drive circuit 10D_2 transitions to the power-saving state as illustrated in FIG. 32. At this time, the motor drive circuit 10D_1 is in the normal state, and outputs the signal fg1 having a duty ratio of 50% from the terminal FG1. On the other hand, because the motor drive circuit 10D_2 is in the power-saving state, the high-level signal fg2 is output from the terminal FG2. Thus, the composite signal generation circuit 21 outputs the composite signal Si having a duty ratio of 50% in accordance with the signal fg1. As a result, after the time t15, the composite signal Si becomes a signal having a duty ratio of 50% in accordance with the signal fg1 until the motor 50 is stopped (less than the minimum number of rotations).

Thereafter, the drive control circuit 20 transitions to the single-sided failure drive mode (step S404) and continuously outputs the drive control signal Sca1 having a predetermined single-sided failure drive duty ratio (step S405) to continue forward rotation of the motor 50 while monitoring the number of rotations by using only the motor drive circuit 10D_1 being in the normal state (step S405 to S407).

As described above, when any one of the motor drive circuits 10D of the two systems has an FG open-circuit failure, by sequentially driving the motor drive circuits 10D one by one in the single-sided trial mode, the drive control circuit 20 can determine the normal motor drive circuit 10D and the FG open-circuit failure motor drive circuit 10D based on the composite signal Si and can continue forward rotation of the motor 50 while monitoring the number of rotations only using the normal motor drive circuit 10D.

As described above, when the composite signal Si indicates a predetermined logical value (a low level or a high level), the motor drive control device 1D according to the third embodiment performs the first FG failure determination processing to cause at least one of the motor drive circuits 10D_1 or 10D_2 to transition to a high-level state where output of the signals fg1 or fg2 is impossible and to distinguish whether either the motor drive circuit 10D_1 or 10D_2 is in the FG failure state (e.g., the FG short-circuit failure) where the normal output of the signals fg1 or fg2 is impossible or the motor 50 is in the locked state where rotating is impossible based on the composite signal Si at the time of the high-level state.

According to this configuration, when at least one of the plurality of motor drive circuits 10D has the FG short-circuit failure, that motor drive circuit 10D is caused to transition to a high-level state where output of the FG signal is impossible, and thus the composite signal Si can be generated without being affected by the FG signal of the motor drive circuit 10D having the FG short-circuit failure. That is, a composite signal Si can be generated according to only the FG signal from the motor drive circuit 10D with no FG short-circuit failure. Thus, whether either the motor drive circuit 10D_1 or 10D_2 is the FG failure state (e.g., the FG short-circuit failure) where output of the signals fg1 or fg2 is impossible or the motor 50 is in the locked state where rotating is impossible can be determined appropriately.

As illustrated in FIG. 28, when the motor drive circuit 10D_1 is in the normal state and the motor drive circuit 10D_2 is in the FG failure state due to the FG short-circuit failure, the motor drive circuit 10D_2 is caused to transition to the high-level state where output of the FG signal is impossible after the time t3, and thus the composite signal Si becomes a signal corresponding to the FG signal from the motor drive circuit 10D with no FG short-circuit failure.

On the other hand, when the motor 50 is in the rotor lock, the motor drive circuits 10D_1 and 10D_2 are caused to transition to a high-level state where output of the FG signals after the time t3, and thus the composite signal Si is fixed to a high level as illustrated in FIG. 27.

In this way, when the composite signal Si is at a low level, at least one of the motor drive circuits 10D is caused to transition to the high-level state where output of the FG signals is impossible, and thus whether either the motor drive circuit 10D_1 or 10D_2 has an FG short-circuit failure or the motor 50 has a rotor lock can be determined appropriately.

In addition, the motor drive control device 1D according to the third embodiment performs, when either the motor drive circuit 10D_1 or 10D_2 is determined to be in the FG failure state, a third FG determination processing of sequentially driving the motor drive circuits 10D_1 and 10D_2 one by one and distinguishing which one of the motor drive circuits 10D_1 and 10D_2 is in the FG failure state based on the composite signal Si at the time of the sequentially driving.

For example, when the motor drive circuit 10D_1 is in the normal state and the motor drive circuit 10D_2 is in the FG failure state due to the FG short-circuit failure, the motor drive circuit 10D_1 is caused to be single-sided driven in the period from the time t10 to the time t12, the motor drive circuit 10D_2 is maintained in the high-level state (the power-saving state) where output of the FG signal is impossible, and thus the composite signal Si becomes a signal according to the signal fg1 from the motor drive circuit 10D_1 being in the normal state as illustrated in FIG. 30. Next, the motor drive circuit 10D_2 is caused to be single-sided driven in the period from the time t12 to the time t14 to cancel the power-saving state, but the composite signal Si is set to a low level because the motor drive circuit 10D_2 is in the FG failure state due to the FG short-circuit failure.

In this way, the composite signal Si when the motor drive circuits 10D_1 and 10D_2 are single-sided driven sequentially is monitored, and thus which one of the motor drive circuits 10D_1 and 10D_2 has the FG short-circuit failure can be determined easily.

Furthermore, in the third FG determination processing, the motor drive control device 1D distinguishes the motor drive circuit 10D being in the FG failure state due to the FG short-circuit failure and the motor drive circuit 10D being in the normal state and then drives the motor 50 by using only the motor drive circuit 10D being in the normal state.

According to this configuration, even when abnormality occurs in the fan 100D (the motor 50), the drive state of the motor 50 can be determined and the forward rotation of the fan 100D can be continued while the number of rotations is monitored.

Further, because each of the motor drive circuits 10D_1 and 10D_2 is configured to be able to stop operations of at least some of the circuits inside the motor drive circuits 10D_1 or 10D_2 and transition to the power-saving state to fix the output of the FG signal to a high level, a motor drive circuit 10D is caused to transition to the power-saving state, and thus the motor drive circuit 10D can be caused to easily transition to a high-level state where output of the FG signal is impossible as illustrated in FIG. 20. Additionally, because the drive control circuit 20 stops the output of the drive control signals Sca1 and Sca2 when the FG signal (signals fg1 and fg2) from each of the motor drive circuits 10D_1 and 10D_2 is not shifted for a predetermined period and the composite signal Si generated by the composite signal generation circuit 21 indicates a predetermined logical value, the drive control signals Sca1 and Sca2 are not input, the input of the position detection signals hp and hn do not change, and thus the control unit 122 of each of the motor drive circuits 10D_1 and 10D_2 can cut off the supply of the internal power supply voltage Vdd to the FG signal generation unit 124. In addition, by configuring the composite signal generation circuit 21, the motor drive control device 1D can cut the number of signal lines output from the motor drive circuits 10D_1 and 10D_2 to the drive control circuit 20 and can reduce signal processing performed by the drive control circuit 20.

Fourth Embodiment

Figure 33:
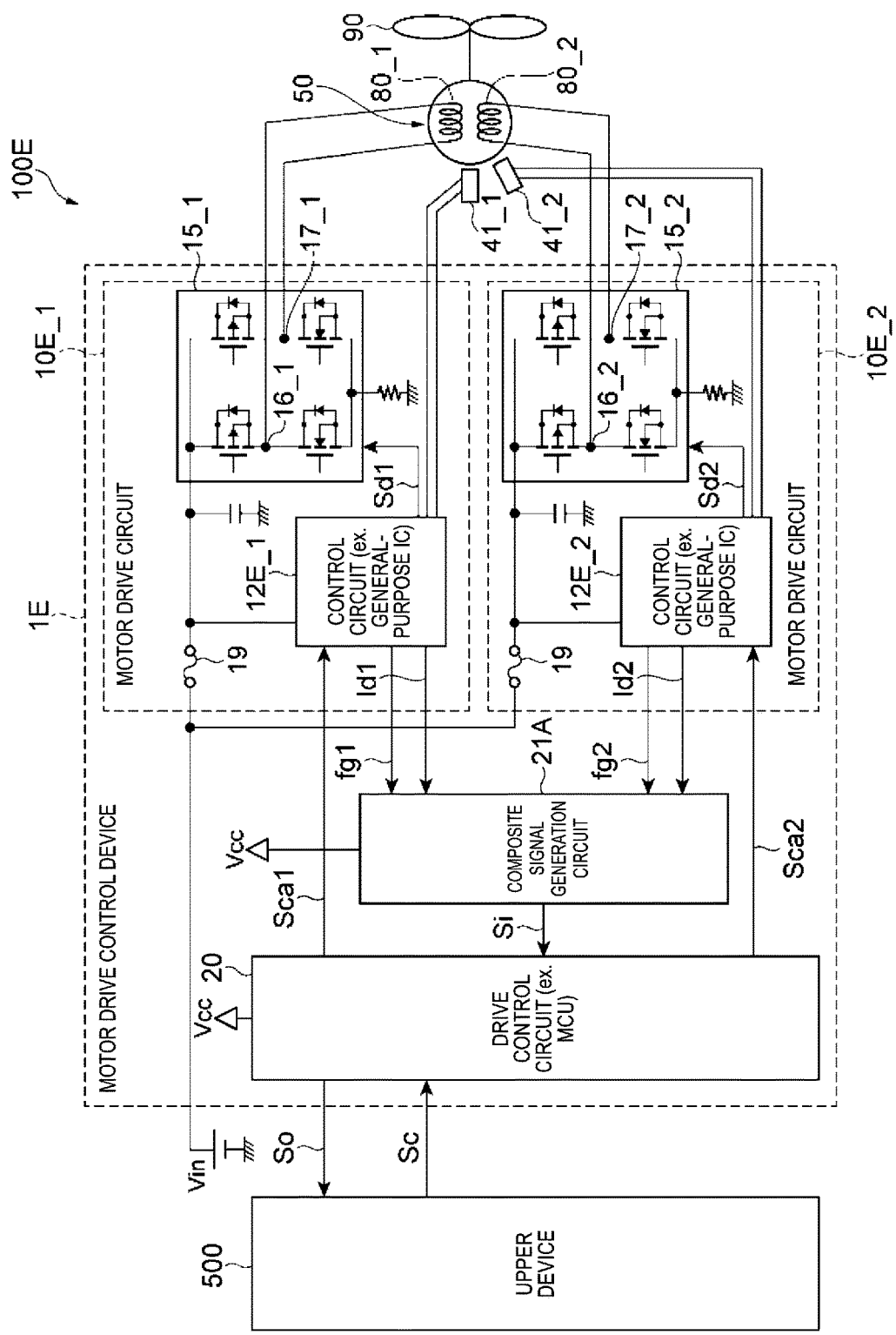
FIG. 33 is a block diagram illustrating a configuration of a fan according to a fourth embodiment.

FIG. 33 is a block diagram illustrating a configuration of a fan according to a fourth embodiment.

A motor drive control device 1E of a fan 100E according to the fourth embodiment is different from the motor drive control device 1D according to the third embodiment with respect to the point that FG signals as well as a lock detection signal indicating whether the motor 50 is in a locked state where rotating is impossible are used to generate the composite signal Si, and similar to the motor drive control device 1D according to the third embodiment with respect to other points.

Control circuits 12E_1 and 12E_2 of motor drive circuits 10E_1 and 10E_2 in the motor drive control device 1E generate and output lock detection signals ld1 and ld2 in addition to signals fg1 and fg2, respectively, as illustrated in FIG. 33.

Here, the lock detection signals ld1 and ld2 are signals indicating a determination result of whether the motor 50 is locked. The control circuits 12E_1 and 12E_2 of the motor drive circuits 10E_1 and 10E_2 determine whether the motor 50 is locked based on, for example, drive control signals Sca1 and Sca2 and position detection signals hp and hn and output the determination result as the lock detection signals ld1 and ld2.

The lock detection signals ld1 and ld2 are, for example, binary signals. For example, the motor 50 is indicated to be in an unlocked state when the lock detection signal ld1 pulled up to a power supply voltage Vcc is at a low level (the ground voltage GND), and the motor 50 is indicated to be in a locked state where rotating is impossible when the lock detection signal ld1 is at a high level (the power supply voltage Vcc).

For example, when a general-purpose IC is used as the control circuits 12E_1 and 12E_2, the signals output based on the lock detection function of the general-purpose IC can be used as the lock detection signals ld1 and ld2.

Figure 34:
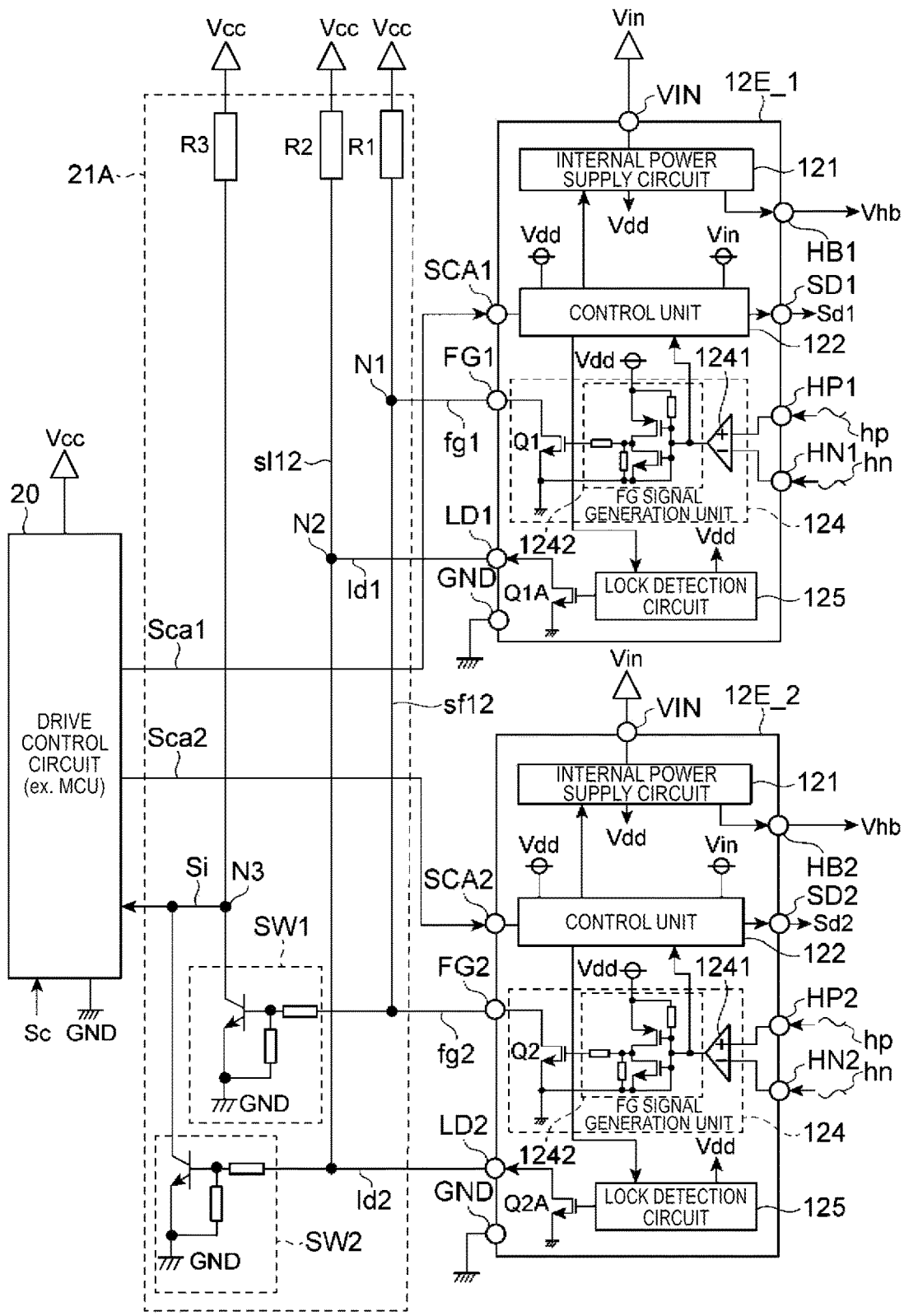
FIG. 34 is a block diagram illustrating internal configurations of control circuits 12E_1 and 12E_2 and a composite signal generation circuit 21A according to the fourth embodiment.

FIG. 34 is a block diagram illustrating an internal configuration of the control circuits 12E_1 and 12E_2 and a composite signal generation circuit 21A according to the fourth embodiment. Further, in FIG. 34, only the configuration associated with the generation of FG signals and lock detection signals of the internal configurations of the control circuits 12E_1 and 12E_2 is illustrated.

The control circuit 12E includes the function of generating the lock detection signals ld1 and ld2 based on position detection signals in addition to the function of the control circuit 12D according to the third embodiment. Specifically, the control circuit 12E_1 further includes a terminal LD1 for outputting the lock detection signal ld1, a lock detection circuit 125 for detecting a locked state where the motor 50 cannot rotate and outputting a detection signal, and an output transistor Q1A for outputting the lock detection signal ld1 based on the detection signal. Similarly, the control circuit 12E_2 further includes a terminal LD2 for outputting the lock detection signal ld2, a lock detection circuit 125 for detecting a locked state where the motor 50 cannot rotate and outputting a detection signal, and an output transistor Q2A for outputting the lock detection signal ld2 based on the detection signal.

The output transistor Q1A is connected between the terminal LD1 and the ground voltage GND as a first fixed potential, and the output transistor Q2A is connected between the terminal LD2 and the ground voltage GND. The output transistors Q1A and Q2A are, for example, FETs.

The composite signal generation circuit 21A receives inputs of the signals fg1 and fg2 and the lock detection signals ld1 and ld2 generated by the control circuits 12E_1 and 12E_2, respectively, and generates the composite signal Si by combining the input signals. For example, the composite signal generation circuit 21A generates the composite signal Si based on the logical AND of a signal sf12 based on the logical AND of the signal fg1 and the signal fg2 and a signal sl12 based on the logical AND of the lock detection signal ld1 and the lock detection signal ld2.

In the fourth embodiment, the composite signal generation circuit 21A is formed on the same circuit board with general-purpose ICs as the control circuits 12E_1 and 12E_2 and an MCU as the drive control circuit 20 mounted, for example, similarly to the composite signal generation circuit 21 according to the third embodiment.

The composite signal generation circuit 21A includes, for example, loads R1 to R3 and switch elements SW1 and SW2. The loads R1 to R3 are, for example, resistors. The load R1 is connected between a node (a connection point) N1 and the power supply voltage Vcc as a second fixed potential. To the node N1, the terminal FG1 of the control circuit 12E_1 and the terminal FG2 of the control circuit 12E_2 are commonly connected. The load R2 is connected between a node (a connection point) N2 and the power supply voltage Vcc. To the node N2, the terminal LD1 of the control circuit 12E_1 and the terminal LD2 of the control circuit 12E_2 are commonly connected. The load R3 includes one end connected to the power supply voltage Vcc.

The switch element SW1 is connected between the ground voltage GND and the other end of the load R3 and is controlled to on or off based on a voltage of the node N1. The switch element SW1 includes, for example, a transistor (a bipolar transistor). In the transistor as the switch element SW1, an emitter electrode is connected to the ground voltage GND, and a collector electrode is connected to the other end (node N3) of the load R3.

The switch element SW2 is connected between the ground voltage GND and the other end of the load R3 and is controlled to on or off based on a voltage of the node N2. The switch element SW2 includes, for example, a transistor (a bipolar transistor). In the transistor as the switch element SW2, an emitter electrode is connected to the ground voltage GND, and a collector electrode is connected to the other end (node N3) of the load R3.

Further, in the transistors constituting the switch elements SW1 and SW2, resistors may be connected between the emitter electrodes and the base electrodes, or resistors may be connected between the base electrodes and the nodes N1 and N2 as illustrated in FIG. 34.

In the composite signal generation circuit 21A, the node N3 is an output terminal, and a voltage of the node N3 is input to the drive control circuit 20 as a composite signal Si.

FIG. 35 is a table showing a relationship between states of the fan and aspects of the composite signal Si according to the fourth embodiment.

FIG. 35 shows the aspects of the composite signal Si at the time of a normal operation of the fan 100E, that is, when the drive control circuit 20 outputs drive control signals Sca1 and Sca2 according to a speed command signal Sc to the motor drive circuits 10E_1 and 10E_2 to drive the motor 50.

Further, it should be noted that the logic of the composite signal Si is inverted between the third and the fourth embodiments. For example, when the motor 50 and the motor drive circuits 10E_1 and 10E_2 are normal, the composite signal Si output from the composite signal generation circuit 21A (the node N3) becomes a binary signal having the same cycle as the signals fg1 and fg2 but a duty ratio of 75%.

As described above, because the composite signal Si is generated by using not only the FG signals but also the lock detection signals, the motor drive control device 1E according to the fourth embodiment can determine that the motor 50 is in the locked state and either motor drive circuit 10E among the motor drive circuits 10E_1 and 10E_2 is in the FG failure state by monitoring the composite signal Si at the time of a normal operation as illustrated in FIG. 35.

However, the motor drive control device 1E according to the fourth embodiment cannot determine which motor drive circuit 10E among the motor drive circuits 10E_1 and 10E_2 has an FG failure simply by monitoring the composite signal Si at the time of the normal operation (a drive mode) similar to the motor drive control device 1D according to the third embodiment.

Thus, the drive control circuit 20 of the motor drive control device 1E according to the fourth embodiment performs the third FG failure determination processing when either the motor drive circuit 10E_1 or 10E_2 is determined to be in the FG failure state (an FG short-circuit failure or an FG open-circuit failure) in the same manner as the drive control circuit 20 according to the third embodiment. In other words, the drive control circuit 20 causes the motor drive circuits 10E_1 and 10E_2 to transition to a state enabling an output of the FG signal one by one in order and determines which of the motor drive circuits 10E_1 and 10E_2 is in the FG failure state based on the composite signal Si at the time of the state.

Although the first FG failure determination processing can be simplified because the motor 50 being in the locked state and either motor drive circuit 10E among the motor drive circuits 10E_1 and 10E_2 being in the FG failure state due to the FG short-circuit failure can be determine, the flow of the determination processing by the drive control circuit 20 may be similar to the flow of the determination processing by the drive control circuit 20 according to the third embodiment (see FIGS. 22, 23, 24, and 25A to 25D).

According to the motor drive control device 1E of the fourth embodiment described above, because not only the two FG signals but also the two lock detection signals ld1 and ld2 are further combined to generate the composite signal Si, the waveform of the composite signal Si is determined, and thus the drive state of the fan 100E (the motor 50 and the motor drive circuits 10E_1 and 10E_2) can be determined more specifically.

Specifically, the composite signal Si is generated based on the logical AND of the logical AND of the signal fg1 and the signal fg2 and the logical AND of the lock detection signal ld1 and the lock detection signal ld2, and thus a case of either the motor drive circuit 10E_1 or 10E_2 having an FG open-circuit failure, a case of either the motor drive circuit 10E_1 or 10E_2 having an FG short-circuit failure, and a case of the motor 50 having a rotor lock can be determined correctly.

In addition, by configuring the composite signal generation circuit 21A, the motor drive control device 1E can cut the number of signal lines output from the motor drive circuits 10E_1 and 10E_2 to the drive control circuit 20 and can reduce signal processing performed by the drive control circuit 20.

Expansion of Embodiment

The invention conceived by the present inventors has been specifically described above based on the embodiments. However, the present invention is not limited to the embodiments, and of course, various modifications can be made without departing from the gist of the present invention.

For example, in the above-described embodiments, the composite signal generation circuits 21 and 21A may be able to combine the FG signals output from at least each of the motor drive circuits 10D and 10E to generate the composite signal Si, and are not limited to the circuit configurations illustrated in FIGS. 20 and 34. In addition, the logical value of the composite signal Si may be changed as appropriate in accordance with the circuit configuration or the like of the input interface circuit of the MCU as the drive control circuit 20 where the composite signal Si is input.

Furthermore, in the flow of the determination processing illustrated in FIG. 22, the drive control circuit 20 may skip the startup waiting mode and transition to the drive mode when an input of the speed command signal Sc is detected during the stop mode.

In addition, although the above embodiments have exemplified the case of the motor drive control devices 1D and 1E being applied to the fan system including a single-phase brushless motor provided with the coils 80_1 and 80_2 of the two systems, the embodiment is not limited to the above embodiments. For example, the motor drive control devices 1D and 1E may be applied to a fan system including two single-phase brushless motors including a coil of one system.

Figure 36:
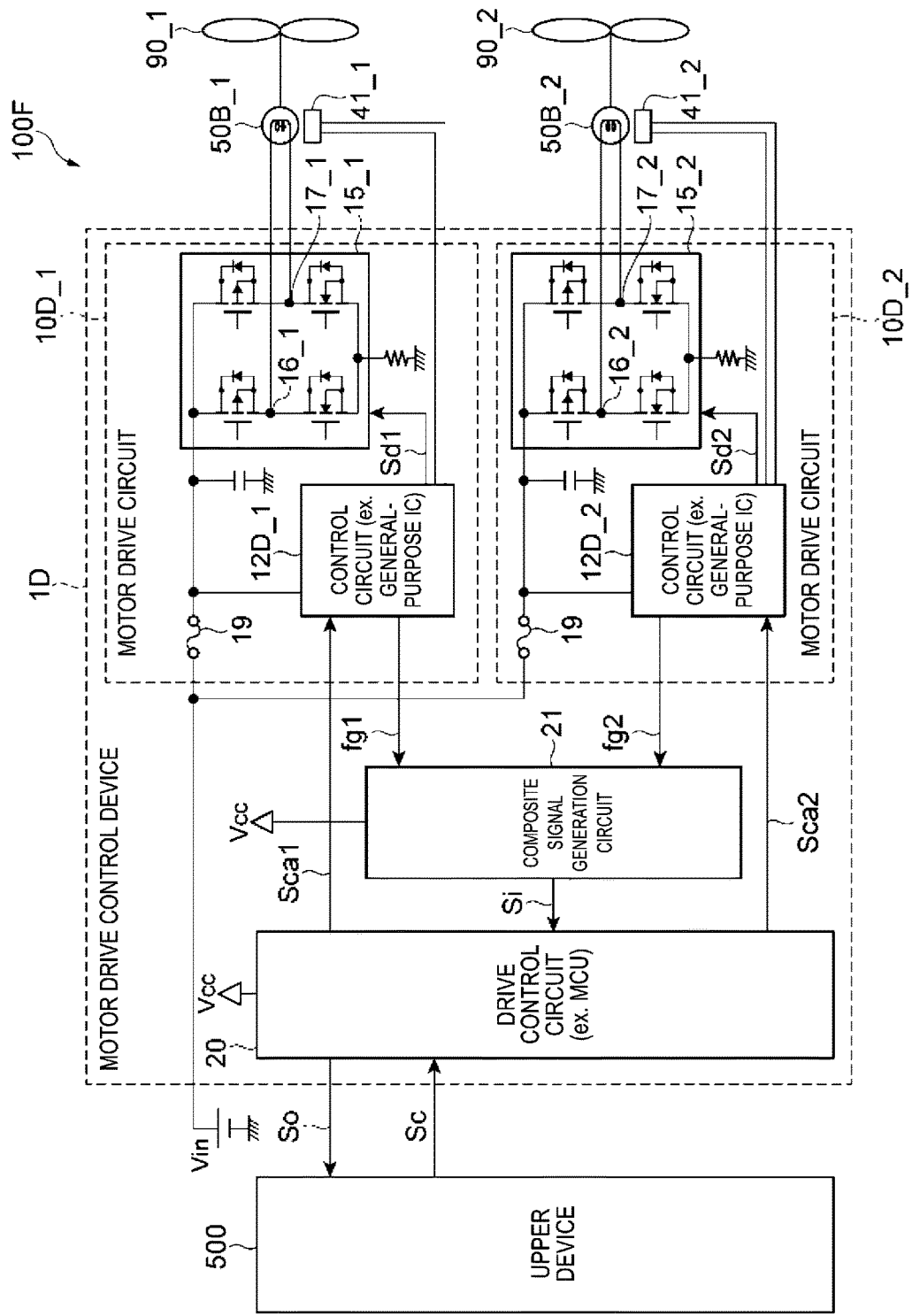
FIG. 36 is a block diagram illustrating a configuration of fans according to another embodiment of the present invention.

For example, the motor drive control device 1D may be applied to a fan 100F including a system configuration with two impellers 90_1 and 90_2 individually rotated by motors 50B_1 and 50B_2 each having a coil of one system, respectively, as illustrated in FIG. 36. In this case, the drive control circuit 20 generates drive control signals Sca1 and Sca2 to make phases of the signals fg1 and fg2 output from the motor drive circuits 10D_1 and 10D_2 (the control circuits 12D_1 and 12D_2), respectively, different from each other (e.g., a phase difference of 90 degrees). The motor drive circuit 10D_1 controls energization of the coil 80B_1 of one motor 50B_1 based on the drive control signal Sca1, and the motor drive circuit 10D_2 controls energization of the coil 80B_2 of the other motor 50B_2 based on the drive control signal Sca2.

According to this configuration, the drive state of the fan 100F (the motors 50B_1 and 50B_2) can be determined, and forward rotation of the fan 100F can be continued while the numbers of rotations of the motors 50B_1 and 50B_2 are monitored, similarly to the fan 100D according to the third embodiment.

In addition, although the motors 50, 50B_1 and 50B_2 are exemplified as being single-phase brushless motors in the above embodiments, the types and the number of phases of the motors 50, 50B_1, and 50B_2 are not limited to the above embodiments. The motors may be, for example, three-phase brushless motors.

In addition, each of the flowcharts according to the third and fourth embodiment is an example for explaining operations, and the embodiment is not limited to these flowcharts. That is, the steps illustrated in each drawing of the flowcharts are specific examples, and the embodiments are not limited to these flowcharts. For example, the order of some processing operations may be partially changed, another processing may be inserted between individual processing operations, or some processing operations may be performed in parallel.

REFERENCE SIGNS LIST 1, 1A, 1D, 1E Motor drive control device
10_1, 10_2, 10A_1, 10A_2, 10D_1, 10D_2, 10E_1, 10E_2 Motor drive circuit
12_1, 12_2, 12A_1, 12A_2, 12D_1, 12D_2, 12E_1, 12E_2 Control circuit
SW1, SW2 Switch element
15_1, 15_2 Inverter circuit
16_1, 16_2, 17_1, 17_2 Output terminal
19 Fuse
20 Drive control circuit
21, 21A Composite signal generation circuit
41_1, 41_2 Position detector
50, 50B_1, 50B_2 Motor
80_1, 80_2, 80B_1, 80B_2 Coil
90, 90_1, 90_2 Impeller
100, 100A, 100B, 100C, 100D, 100E, 100F Fan
120_1, 120_2, 120A_1, 120A_2 Internal circuit
121 Internal power supply circuit
122 Control unit
124 FG signal generation unit
125 Lock detection circuit
500 Upper device
1241 Comparator
1242 Pre-drive circuit
fg1, fg2 FG signal
FG1, FG2 FG Signal output terminal
GND Ground voltage (example of first fixed potential)
hp, hn Hall signal (position detection signal)
HP1, HN1, HP2, HN2 Terminal
HB1, HB2 External output power supply terminal
ld1, ld2 Lock detection signal
LD1, LD2 LD signal output terminal
N1, N2, N3 Connection point (node)
Q1, Q1A, Q2, Q2A Output transistor
R1, R2, R3 Load
Sc Speed command signal
Sca1, Sca2 Drive control signal
SCA1, SCA2 Terminal
Sd1, Sd2 Drive signal
SD1, SD2 Terminal
sf12, sl12 Signal
SF12 Signal (output from node N1)
SL12 Signal (output from node N2)
Si Composite signal
So State signal
Vin Power supply voltage
VIN Power supply terminal
Vdc Power supply voltage
Vcc Power supply voltage (example of second fixed potential)
Vdd Internal power supply voltage
Vhb External output power supply voltage

The invention claimed is:

1. A motor drive control device comprising:
a plurality of motor drive circuits configured to perform, based on a drive control signal configured to control the number of rotations of a motor, control of energization of the motor and output FG signals having a cycle corresponding to an actual number of rotations of the motor;
a composite signal generation circuit configured to receive an input of the FG signals output from the plurality of motor drive circuits and generate a composite signal by combining the received FG signals; and
a drive control circuit configured to generate, based on a speed command signal indicating a target number of rotations of the motor, the drive control signal and output the drive control signal to each of the plurality of motor drive circuits,
wherein the FG signals output from the plurality of motor drive circuits have a phase difference from each other.

2. The motor drive control device according to claim 1, wherein the plurality of motor drive circuits include
a first motor drive circuit configured to perform, based on the drive control signal, control of energization of the motor and output a first FG signal having a frequency corresponding to the actual number of rotations of the motor, and
a second motor drive circuit configured to perform, based on the drive control signal, control of energization of the motor and output a second FG signal having the frequency corresponding to the actual number of rotations of the motor and being out of phase with the first FG signal, and
the composite signal generation circuit combines the first FG signal and the second FG signal to generate the composite signal.

3. The motor drive control device according to claim 2, wherein the first FG signal and the second FG signal are rectangular-wave shaped signals having a predetermined duty ratio, and the composite signal generation circuit generates, based on a logical AND of the first FG signal and the second FG signal, the composite signal.

4. The motor drive control device according to claim 3, wherein the first motor drive circuit includes a first output terminal configured to output the first FG signal and a first output transistor connected between the first output terminal and a first fixed potential, the second motor drive circuit includes a second output terminal configured to output the second FG signal and a second output transistor connected between the second output terminal and the first fixed potential, and the composite signal generation circuit includes a load connected between a connection point where the first output terminal and the second output terminal are commonly connected and a second fixed potential different from the first fixed potential.

5. The motor drive control device according to claim 3, wherein the drive control circuit receives an input of the composite signal and determines, when the composite signal is a signal having a duty ratio according to a phase difference between the first FG signal and the second FG signal, that the motor drives normally.

6. The motor drive control device according to claim 5, wherein the drive control circuit receives the input of the composite signal and determines, when the composite signal has the predetermined duty ratio, that either the first motor drive circuit or the second motor drive circuit has an open-circuit failure.

7. The motor drive control device according to claim 5, wherein the drive control circuit receives the input of the composite signal and determines, when the composite signal has a predetermined logical value, that at least one of the first motor drive circuit or the second motor drive circuit has a short-circuit failure or that the motor is in a locked state.

8. The motor drive control device according to claim 2, wherein the first motor drive circuit outputs a first lock detection signal being a binary signal and indicating whether the motor is in a locked state, the second motor drive circuit outputs a second lock detection signal being a binary signal and indicating whether the motor is in the locked state, and the composite signal generation circuit combines the first FG signal, the second FG signal, the first lock detection signal, and the second lock detection signal to generate the composite signal.

9. The motor drive control device according to claim 8, wherein the first FG signal and the second FG signal are rectangular-wave shaped signals having a predetermined duty ratio, and the composite signal generation circuit generates, based on a logical AND of a signal based on a logical AND of the first FG signal and the second FG signal and a signal based on a logical AND of the first lock detection signal and the second lock detection signal, the composite signal.

10. The motor drive control device according to claim 9, wherein the first motor drive circuit includes a first output terminal configured to output the first FG signal, a second output terminal configured to output the first lock detection signal, a first output transistor connected between the first output terminal and a first fixed potential, and a second output transistor connected between the second output terminal and the first fixed potential, the second motor drive circuit includes a third output terminal configured to output the second FG signal, a fourth output terminal configured to output the second lock detection signal, a third output transistor connected between the third output terminal and the first fixed potential, and a fourth output transistor connected between the fourth output terminal and the first fixed potential, and the composite signal generation circuit includes a first load connected between a first connection point where the first output terminal and the third output terminal are commonly connected and a second fixed potential different from the first fixed potential, a second load connected between a second connection point where the second output terminal and the fourth output terminal are commonly connected and the second fixed potential, a third load including one end connected to the second fixed potential, a first switch element connected between the first fixed potential and another end of the third load and controlled, based on a voltage at the first connection point, to on or off, and a second switch element connected between the first fixed potential and the other end of the third load and controlled, based on a voltage at the second connection point, to on or off.

11. The motor drive control device according to claim 9, wherein the drive control circuit determines, when the composite signal has a duty ratio according to a phase difference between the first FG signal and the second FG signal, that the motor is being driven normally.

12. The motor drive control device according to claim 11, wherein the drive control circuit determines, when the composite signal has the predetermined duty ratio, that either the first motor drive circuit or the second motor drive circuit has an open-circuit failure.

13. The motor drive control device according to claim 12, wherein the drive control circuit determines, when the composite signal is at a first logical level, that either the first motor drive circuit or the second motor drive circuit has a short-circuit failure.

14. The motor drive control device according to claim 13, wherein the drive control circuit determines, when the composite signal is at a second logical level different from the first logical level, that the motor is in a locked state.

15. A fan comprising:
the motor drive control device according to claim 2; and
the motor including a coil of a first system and a coil of a second system,
wherein the first motor drive circuit controls energization of the coil of the first system, and
the second motor drive circuit controls energization of the coil of the second system.

16. A fan comprising:
the motor drive control device according to claim 2; and
two of the motors each including at least one coil,
wherein the first motor drive circuit controls energization of the at least one coil of one of the two of the motors, and
the second motor drive circuit controls energization of the at least one coil of another one of the two of the motors.

17. The motor drive control device according to claim 1, wherein the drive control circuit performs, when the composite signal indicates a predetermined logical value, first determination processing of causing at least one of the plurality of motor drive circuits to transition to a high-level state where an output of an FG signal of the FG signals is impossible and distinguishing, based on the composite signal at a time of the high-level state, whether any one of the plurality of motor drive circuits is in an FG failure state where a normal output of the FG signal is impossible or the motor is in a locked state where rotation of the motor is impossible.

18. The motor drive control device according to claim 17, wherein each of the plurality of motor drive circuits is configured to stop operations of at least some of circuits inside the each of the plurality of motor drive circuits and transition to a power-saving state to fix the output of the FG signal to a high level, and the drive control circuit causes, when the composite signal indicates the predetermined logical value, at least one of the plurality of motor drive circuits to transition to the power-saving state and performs, based on the composite signal at a time of the power-saving state, the first determination processing.

19. The motor drive control device according to claim 17, wherein each of the plurality of motor drive circuits includes an internal power supply circuit configured to generate and output an internal power supply voltage, an FG signal generation unit configured to be operable with power supply from the internal power supply voltage and to generate and output, based on a position detection signal according to a rotation position of a rotor of the motor, the FG signal, and a control unit configured to control supply and cutoff of the internal power supply voltage to the FG signal generation unit and to generate, based on the drive control signal, a drive signal configured to energize the motor, the drive control circuit stops, when the composite signal indicates the predetermined logical value, an output of the drive control signal, and the control unit cuts off, when the drive control signal is not input and the FG signal is not shifted for a predetermined period, the supply of the internal power supply voltage to the FG signal generation unit.

20. The motor drive control device according to claim 19, wherein, in the first determination processing, the drive control circuit determines, when detecting a predetermined change in the composite signal, that any one of the plurality of motor drive circuits is in the FG failure state and determines, when the composite signal is fixed to the predetermined logical value, that the motor is in the locked state.

21. The motor drive control device according to claim 20, wherein the drive control circuit performs, when determining that any one of the plurality of motor drive circuits is in the FG failure state, second determination processing of sequentially driving the plurality of motor drive circuits one by one and distinguishing, based on the composite signal at a time of the sequentially driving, which one of the plurality of motor drive circuits is in the FG failure state.

22. The motor drive control device according to claim 21, wherein the drive control circuit stops the output of the drive control signal to a motor drive circuit of the plurality of motor drive circuits determined to be in the FG failure state by the second determination processing and outputs the drive control signal to a motor drive circuit of the plurality of motor drive circuits determined to be in a normal state by the second determination processing.

23. The motor drive control device according to claim 17, wherein the FG signals are rectangular-wave shaped signals having a predetermined duty ratio in a cycle corresponding to the number of rotations of the motor, and the composite signal generation circuit generates, based on a logical AND of the FG signals output from the plurality of motor drive circuits, the composite signal.

24. The motor drive control device according to claim 17, wherein the plurality of motor drive circuits output lock detection signals being binary signals indicating whether the motor is locked, the FG signals are rectangular-wave shaped signals having a predetermined duty ratio in a cycle corresponding to the number of rotations of the motor, and the composite signal generation circuit generates, based on a logical AND of a signal based on a logical AND of the FG signals output from the plurality of motor drive circuits and a signal based on a logical AND of the lock detection signals output from the plurality of motor drive circuits, the composite signal.

25. A fan, comprising:
the motor drive control device according to claim 17;
the motor; and
an impeller configured to be rotatable by a rotation force of the motor.

26. A motor drive control method performed by a motor drive control device including a plurality of motor drive circuits configured to perform, based on a drive control signal configured to control the number of rotations of a motor, control of energization of the motor and output FG signals having a cycle corresponding to an actual number of rotations of the motor, a composite signal generation circuit configured to receive an input of the FG signals output from the plurality of motor drive circuits and generate a composite signal by combining the received FG signals, and a drive control circuit configured to generate, based on a speed command signal indicating a target number of rotations of the motor, the drive control signal, output the drive control signal to each of the plurality of motor drive circuits, and determine, based on the composite signal, states of the motor and the plurality of motor drive circuits, the motor drive control method comprising:

the FG signals output from the plurality of motor drive circuits having a phase difference from each other, a first step of causing, by the drive control circuit, when the composite signal indicates a predetermined logical value, at least one of the plurality of motor drive circuits to transition to a high-level state where an output of an FG signal of the FG signals is impossible, and a second step of performing, by the drive control circuit, based on the composite signal in the first step, first determination processing of distinguishing whether any one of the plurality of motor drive circuits is in an FG failure state where a normal output of the FG signal is impossible or the motor is in a locked state where rotation of the motor is impossible.

\* \* \* \* \*